(12) United States Patent
Lee et al.

(10) Patent No.: US 10,038,154 B2
(45) Date of Patent: Jul. 31, 2018

(54) FLEXIBLE DISPLAY DEVICE WITH CHAMFERED POLARIZATION LAYER

(71) Applicant: LG Display Co., Ltd., Seoul (KR)

(72) Inventors: JunSeok Lee, Incheon (KR); Yunho Ki, Gumi-si (KR); Dongwook Choi, Incheon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/587,278

(22) Filed: May 4, 2017

(65) Prior Publication Data

US 2017/0237027 A1    Aug. 17, 2017

Related U.S. Application Data

(63) Continuation of application No. 15/017,542, filed on Feb. 5, 2016, now Pat. No. 9,673,423, which is a continuation of application No. 14/586,387, filed on Dec. 30, 2014, now Pat. No. 9,287,329.

(51) Int. Cl.
| | |
|---|---|
| *H01L 51/52* | (2006.01) |
| *H01L 51/00* | (2006.01) |
| *H01L 27/32* | (2006.01) |
| *G06F 3/041* | (2006.01) |
| *G09G 3/3225* | (2016.01) |

(52) U.S. Cl.
CPC ........ *H01L 51/0097* (2013.01); *H01L 27/323* (2013.01); *H01L 27/3244* (2013.01); *H01L 27/3276* (2013.01); *H01L 51/5243* (2013.01); *H01L 51/5246* (2013.01); *H01L 51/5253* (2013.01); *H01L 51/5262* (2013.01); *H01L 51/5281* (2013.01); *G06F 3/041* (2013.01); *G09G 3/3225* (2013.01); *G09G 2320/0233* (2013.01); *H01L 2251/5338* (2013.01); *Y02E 10/549* (2013.01); *Y02P 70/521* (2015.11)

(58) Field of Classification Search
CPC .............. H01L 27/323; H01L 27/3244; H01L 27/3276; H01L 51/0097; H01L 51/5243; H01L 51/5246; H01L 51/5253; H01L 51/5262; H01L 51/5281; H01L 2251/5338
See application file for complete search history.

(56) References Cited

U.S. PATENT DOCUMENTS

| | | | |
|---|---|---|---|
| 6,191,840 B1 | 2/2001 | Bon | |
| 8,654,304 B2 | 2/2014 | Lee et al. | |
| 9,323,291 B2 * | 4/2016 | Oh | ........................ G06F 1/1637 |
| 9,474,125 B2 * | 10/2016 | Kim | ........................ H05B 33/20 |
| 2008/0094561 A1 | 4/2008 | Fan et al. | |

(Continued)

FOREIGN PATENT DOCUMENTS

| | | |
|---|---|---|
| EP | 2733912 | 5/2014 |
| EP | 3235001 | 10/2017 |

OTHER PUBLICATIONS

Office Action for U.S. Appl. No. 15/017,542, dated Sep. 21, 2016, 10 Pages.

(Continued)

*Primary Examiner* — Allan R Wilson
(74) *Attorney, Agent, or Firm* — Fenwick & West LLP

(57) ABSTRACT

There is provided a flexible display having a plurality of innovations configured to allow bending of a portion or portions to reduce apparent border size and/or utilize the side surface of an assembled flexible display.

11 Claims, 32 Drawing Sheets

(56) References Cited

U.S. PATENT DOCUMENTS

| | | | |
|---|---|---|---|
| 2009/0167171 A1 | 7/2009 | Jung et al. | |
| 2009/0185339 A1* | 7/2009 | Kwon | G02F 1/1333 |
| | | | 361/679.21 |
| 2011/0194063 A1 | 8/2011 | Lee et al. | |
| 2012/0070607 A1 | 3/2012 | Yu et al. | |
| 2012/0146886 A1 | 6/2012 | Minami et al. | |
| 2012/0154710 A1 | 6/2012 | Hwang et al. | |
| 2013/0169515 A1 | 7/2013 | Prushinskiy et al. | |
| 2014/0139771 A1 | 5/2014 | Choi | |
| 2014/0217382 A1 | 8/2014 | Kwon et al. | |
| 2014/0218856 A1 | 8/2014 | Raff et al. | |
| 2014/0301044 A1 | 10/2014 | Oh et al. | |
| 2015/0021570 A1 | 1/2015 | Kim et al. | |
| 2015/0060778 A1 | 3/2015 | Kim et al. | |
| 2016/0037607 A1* | 2/2016 | Kim | H05B 33/10 |
| | | | 313/512 |
| 2016/0085125 A1 | 3/2016 | Park et al. | |
| 2016/0091636 A1* | 3/2016 | Ahn | G02B 1/14 |
| | | | 359/513 |
| 2016/0179229 A1* | 6/2016 | Ahn | G06F 3/041 |
| | | | 345/173 |

OTHER PUBLICATIONS

Communication pursuant to Rule 164(11) EPC for European Patent Application No. EP 15875519.9, Dec. 20, 2017, 17 Pages.
Extended European Search Report for European Patent Application No. EP 15875519.9, dated Apr. 26, 2018, 17 Pages.

* cited by examiner

FLEXIBLE DISPLAY DEVICE WITH CHAMFERED POLARIZATION LAYER

CROSS-REFERENCE TO RELATED APPLICATION

This application is a continuation application of U.S. patent application Ser. No. 15/017,542 filed on Feb. 5, 2016, which is a continuation application of U.S. patent application Ser. No. 14/586,387 filed on Dec. 30, 2014, which are incorporated by reference herein in their entirety.

BACKGROUND

Technical Field

This relates generally to electronic devices, and more particularly, to electronic devices with a display.

Description of the Related Art

Electronic devices often include displays. For example, cellular telephones and portable computers include displays for presenting information to a user. Components for the electronic device, including but not limited to a display, may be mounted in a plastic or a metal housing.

An assembled display may include a display panel and a number of components for providing a variety of functionalities. For instance, one or more display driving circuits for controlling the display panel may be included in a display assembly. Examples of the driving circuits include gate drivers, emission (source) drivers, power (VDD) routing, electrostatic discharge (ESD) circuits, multiplex (mux) circuits, data signal lines, cathode contacts, and other functional elements. There may be a number of peripheral circuits included in the display assembly for providing various kinds of extra functions, such as touch sense or fingerprint identification functionalities. Some of the components may be disposed on the display panel itself, often in the periphery areas next to the display area, which is referred in the present disclosure as the non-display area and/or the inactive area.

Size and weight are of the critical importance in designing modern electronic devices. Also, a high ratio of the active area size compared to that of inactive area, which is sometimes referred to as the screen to bezel ratio, is one of the most desired feature. However, placing some of the aforementioned components in a display assembly may require large inactive area, which may add up to a significant portion of the display panel. Large inactive area tends to make the display panel bulky, making it difficult to incorporate it into the housing of electronic devices. Large inactive area may also necessitate a large masking (e.g., bezel, borders, covering material) to cover a significant portion of the display panel, leading to unappealing device aesthetics.

Some of the components can be placed on a separate flexible printed circuit (FPC) and positioned on the rear side of the display panel. Even with such a configuration, however, the interfaces for connecting the FPC and the wires between the active area and the connection interface still limit how much reduction in the size of the inactive area can be realized by placing components on a separate FPC.

BRIEF SUMMARY

Accordingly, it is desirable to bend the base substrate where the display area and the inactive area are formed thereon. This would allow even some of the inactive area to be positioned behind the active area of the display panel, thereby reducing or eliminating the inactive area that needs to be hidden under the masking or the device housing. Not only does the bending of the base substrate will minimize the inactive area size need to be hidden from view, but it will also open possibility to various new display device designs.

However, there are various new challenges that need to be solved in providing such flexible displays. The components formed directly on the base substrate along with the display pixels tend to have tremendously small dimensions with unforgiving margin of errors. Further, these components need to be formed on extremely thin sheet to provide flexibility, making those components extremely fragile to various mechanical and environmental stresses instigated during the manufacture and/or in the use of the displays. If care is not taken, the mechanical stresses from bending of the flexible display can negatively affect the reliability or even result in complete component failure. Even a micro-scale defect in the component thereof can have significant effects on the performance and/or reliability of the display pixels amounting to scrap the entire display panel without an option to repair. As such, various factors and special parameters must be taken in consideration in designing a flexible display.

In this regards, a flexible display apparatus is provided with a flexible base layer. The flexible base layer is defined with a first area, a second area and a first bend allowance section, which is positioned between the first area and the second area of the flexible base layer. The bend allowance section between the first area and the second area is curved in a certain bend angle so that the plane of the second area with the driving circuit is bent away from the plane of the first area. An active area, which includes an array of organic-light emitting diode (OLED) elements is provided in at least one of the first area and the second area of the flexible base layer. An array of pixel circuits is also provided in the active area to control emission of the OLED elements. A driving circuit is provided in an inactive area, which is at the periphery of the active area. The driving circuit in the inactive area is configured to transmit various signals to the array of pixel circuits in the active area. The inactive area may be provided in at least one of the first area and the second area of the flexible base layer. In the active area, a polarization layer with a configuration (e.g., a shape, a size, a position and an orientation) such that the polarization layer is unaffected by trimming of the flexible base layer. The trimming of the base layer may be achieved by at least one of scribing, chamfering, cutting and grinding the flexible base layer into a predetermined shape.

In one embodiment, the polarization layer is configured not to cross over a processing line related to the trimming of the flexible base layer. When laser chamfering is used to trim the base layer, the polarization layer is configured not to cross over the chamfer line.

In one embodiment, the polarization layer has a trimmed corner. The trimmed corner of the polarization layer may be trimmed in substantially the same angle as the processing line related to the trimming of the flexible base layer. In other words, the trimmed corner of the polarization layer may be chamfered in the same direction as the chamfered corner of the base layer. In another, the base layer includes a notch, and the trimmed corner of the polarization layer corresponds to the shape of the processing line at the notch of the flexible base layer. That is, the polarization layer's corner toward the notch is trimmed in the same shape as the notch of the base layer. In yet another embodiment, the polarization layer has a rounded corner.

In some embodiments, the first area of the flexible base layer is provided in a rounded shape, which can be placed within a rounded housing. The second area or the third area of the flexible base layer may be protruded out from the first area of the flexible base layer. The second area or the third area may be in a rectangular shape or any other shape sufficient to hold some components of the flexible display, such as a display driver integrated circuit, gate-in-panel circuit, wire traces, etc. Accordingly, the flexible base layer may have the round shaped first area with a rectangular second area or a third area extended out from the shape of the first area. The bend allowance section between the first area and the second/third area(s) allow the second/third area(s) to be placed under the plane of the first area. This would allow the flexible base layer to be fit in to the round shaped housing, and provide a device with a rounded display. In some embodiments, a notch may be provided in the bend allowance section between the first area and the second area to reduce the size of bend allowance section, which would be the edge of the flexible display after the bending of the flexible base layer. In some embodiments, a notch may be provided in the bend allowance section between the first area and the third area to reduce the size of bend allowance section. The notch provided in the bend allowance section would also facilitate easier bending of the flexible base layer.

In another aspect, a flexible display is provided with a flexible base layer that is chamfered in a predetermined shape. An array of organic light-emitting diode (OLED) elements is provided on the flexible base layer. The flexible display further includes an upper layer provided on the array of OLED element, which is chamfered separately from the flexible base layer. The chamfered upper layer may be at least one of a polarization layer, a barrier film layer, a touch sensor layer, an adhesive layer and an optical sheet layer. The chamfered upper layer has a shape and a size corresponding to those of the chamfered flexible base layer, so that the chamfered upper layer on the array of OLED element provides clearance of a chamfer line of the chamfered flexible base layer. This minimizes damage in one or more insulation layers interposed between the chamfered upper layer and the chamfered flexible base layer.

Additional embodiments and features are set forth in part in the description that follows, and in part will become apparent to those skilled in the art upon examination of the specification or may be learned by the practice of the embodiments discussed herein. A further understanding of the nature and advantages of certain embodiments may be realized by reference to the remaining portions of the specification and the drawings, which forms a part of this disclosure.

DETAILED DESCRIPTION

Flexible Display

Figure 1:
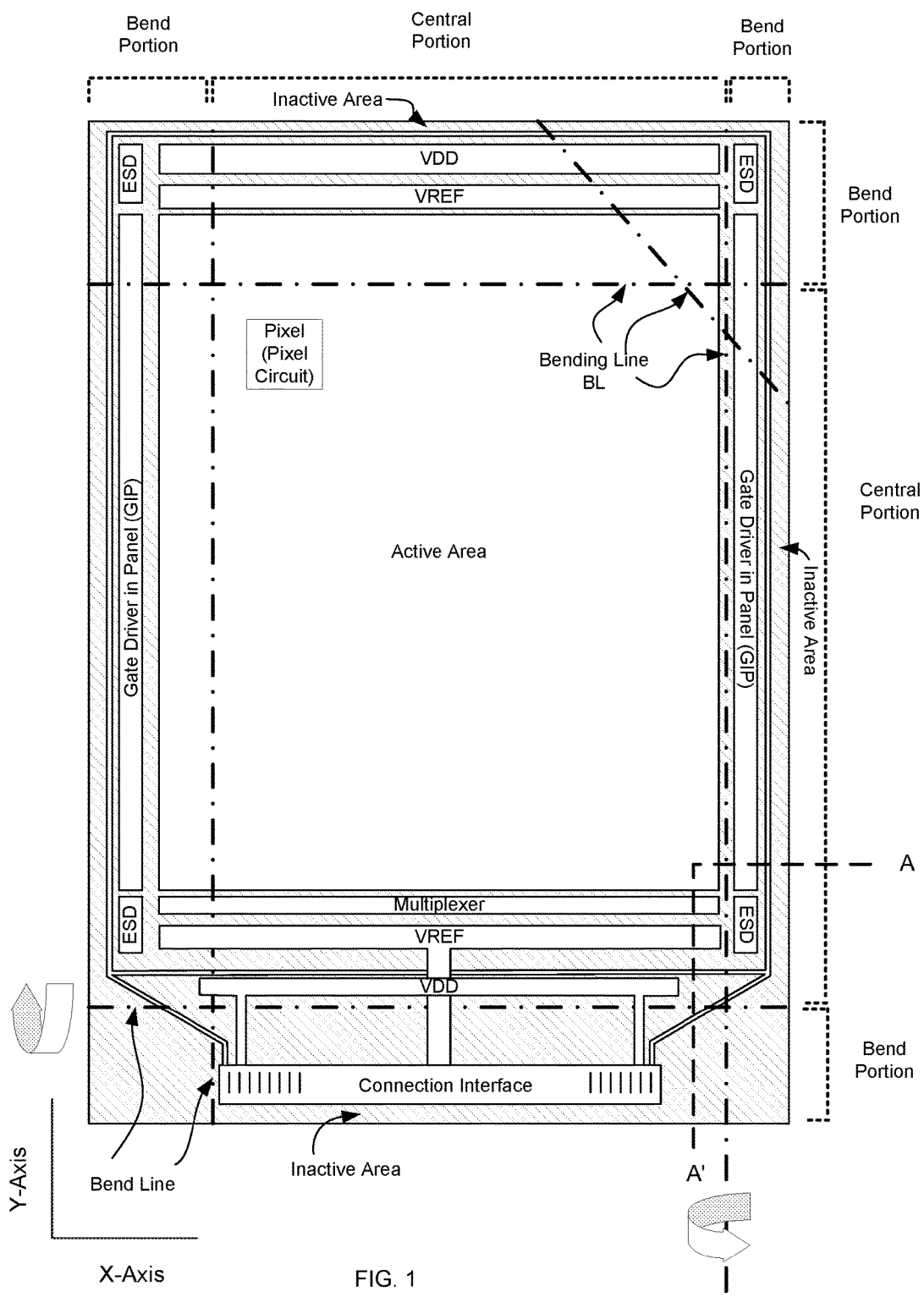
FIG. 1 illustrates schematic view of an exemplary flexible display apparatus according to embodiments of the present disclosure.

FIG. 1 illustrates exemplary flexible display 100 which may be incorporated in electronic devices. Referring to FIG. 1, the flexible display 100 includes at least one active area (i.e., display area), in which an array of display pixels are formed therein. One or more inactive areas may be provided at the periphery of the active area. That is, the inactive area may be adjacent to one or more sides of the active area. In FIG. 1, the inactive area surrounds a rectangular shape active area. However, it should be appreciated that the shapes of the active area and the arrangement of the inactive area adjacent to the active area are not particularly limited as the exemplary flexible display 100 illustrated in FIG. 1. The active area and the inactive area may be in any shape suitable to the design of the electronic device employing the flexible display 100. Non-limiting examples of the active area shapes in the flexible display 100 include a pentagonal shape, a hexagonal shape, a circular shape, an oval shape, and more.

Each pixel in the active area may be associated with a pixel circuit, which includes at least one switching thin-film transistor (TFT) and at least one driving TFT on the backplane of the flexible display 100. Each pixel circuit may be electrically connected to a gate line and a data line to communicate with one or more driving circuits, such as a gate driver and a data driver positioned in the inactive area of the flexible display 100.

For example, one or more driving circuits may be implemented with TFTs fabricated in the inactive area as depicted in FIG. 1. Such a driving circuit may be referred to as a gate-in-panel (GIP). Also, some of the components, such as data drive-IC, may be mounted on a separate printed circuit and coupled to a connection interface (Pads/Bumps, Pins) disposed in the inactive area using a printed circuit such as flexible printed circuit board (PCB), chip-on-film (COF), tape-carrier-package (TCP) or any other suitable technologies. As will be described in further detail below, the inactive area with the connection interface can be bent away from the plane of the adjacent portion of the flexible display so that the printed circuit (e.g., COF, PCB and the like) is positioned at the rear side of the flexible display 100.

The flexible display 100 may include various additional components for generating a variety of signals or otherwise operating the pixels in the active area. Non limiting examples of the components for operating the pixels include an inverter circuit, a multiplexer, an electro static discharge (ESD) circuit and the like. The flexible display 100 may also include components associated with functionalities other than for operating the pixels of the flexible display 100. For instance, the flexible display 100 may include components for providing a touch sensing functionality, a user authentication functionality (e.g., finger print scan), a multi-level pressure sensing functionality, a tactile feedback functionality and/or various other functionalities for the electronic device employing the flexible display 100. Some of the aforementioned components can be placed in the inactive area of the flexible display 100 and/or on a separate printed circuit that is connected to the connection interface of the flexible display 100.

Flat/Bend Portions

Multiple parts of the flexible display 100 can be bent along the bend line BL. The bend line BL in the flexible display 100 may extend horizontally (e.g., X-axis shown in FIG. 1), vertically (e.g., Y-axis shown in FIG. 1) or even diagonally. Accordingly, the flexible display 100 can be bent in any combination of horizontal, vertical and/or diagonal directions based on the desired design of the flexible display 100.

As mentioned, one or more edges of the flexible display 100 can be bent away from the plane of the central portion along the bend line BL. Although the bend line BL is depicted as being located near the edges of the flexible display 100, it should be noted that the bend lines BL can extend across the central portion or extend diagonally at one or more corners of the flexible display 100. Such configurations would allow the flexible display 100 to provide a foldable display or a double-sided display having display pixels on both outer sides of a folded display.

With the ability to bend one or more portions of the flexible display 100, part of the flexible display 100 may be defined as a substantially flat portion and a bend portion. A part of the flexible display 100 may remain substantially flat and referred to as a substantially flat portion of the flexible display 100. A part of the flexible display 100 may be bent in a certain bend angle from the plane of an adjacent portion, and such portion is referred to as a bend portion of the flexible display 100. The bend portion includes a bend allowance section, which can be actively curved in a certain bend radius.

Figure 2:
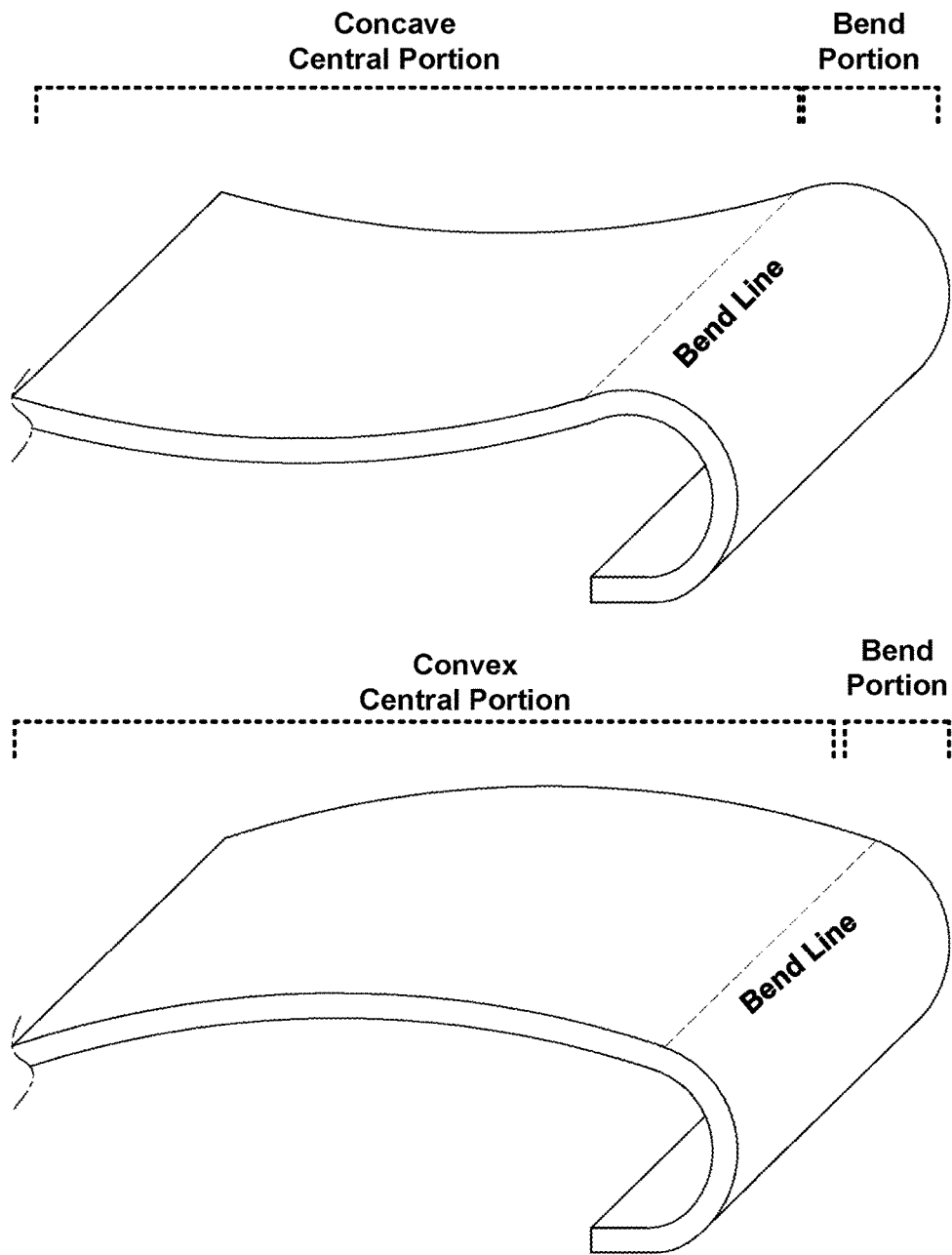
FIG. 2 illustrates exemplary arrangement of a substantially flat portion and bend portion of a flexible display apparatus according to embodiments of the present disclosure.

It should be understood that the term "substantially flat" includes a portion that may not be perfectly flat. For example, the concave central portion and the convex central portion depicted in FIG. 2 may be described as a substantially flat portion in some embodiments discussed in the present disclosure. In FIG. 2, one or more bend portions exist next to the convex or concave central portion, and bent inwardly or outwardly along the bend line in a bend angle about a bend axis. The bend radius of the bend portion is smaller than the bend radius of the central portion. In other words, the term "substantially flat portion" refers to a portion with a lesser curvature than that of an adjacent bend allowance section of the flexible display 100.

Depending on the location of the bend line BL in the flexible display 100, a portion on one side of the bend line may be positioned toward the center of the flexible display 100, whereas the portion on the opposite side of the bend line BL is positioned toward an edge portion of the flexible display 100. The portion toward the center may be referred to as the central portion and the portion toward the edge may be referred to as the edge portion of the flexible display 100.

Although this may not always be the case, a central portion of the flexible display 100 can be the substantially flat portion and the edge portion can be the bend portion of the flexible display 100. It should be noted that a substantially flat portion can also be provided in the edge portion of the flexible display 100. Further, in some configuration of the flexible display 100, a bend allowance section may be positioned between two substantially flat portions.

As mentioned above, bending the inactive area allows to minimize or to eliminate the inactive area to be seen from the front side of the assembled flexible display 100. Part of the inactive area that remains visible from the front side can be covered with a bezel. The bezel may be formed, for example, from a stand-alone bezel structure that is mounted to the cover layer 114, a housing or other suitable components of the flexible display 100. The inactive area remaining visible from the front side may also be hidden under an opaque masking layer, such as black ink (e.g., a polymer filled with carbon black) or a layer of opaque metal. Such an opaque masking layer may be provided on a portion of various layers included in the flexible display 100, such as a touch sensor layer, a polarization layer, a cover layer, and other suitable layers.

Active Areas

In some embodiments, the bend portion of the flexible display 100 may include an active area capable of displaying image from the bend portion, which is referred herein after as the secondary active area. That is, the bend line BL can be positioned in the active area so that at least some display pixels of the active area is included in the bend portion of the flexible display 100.

Figure 3A:
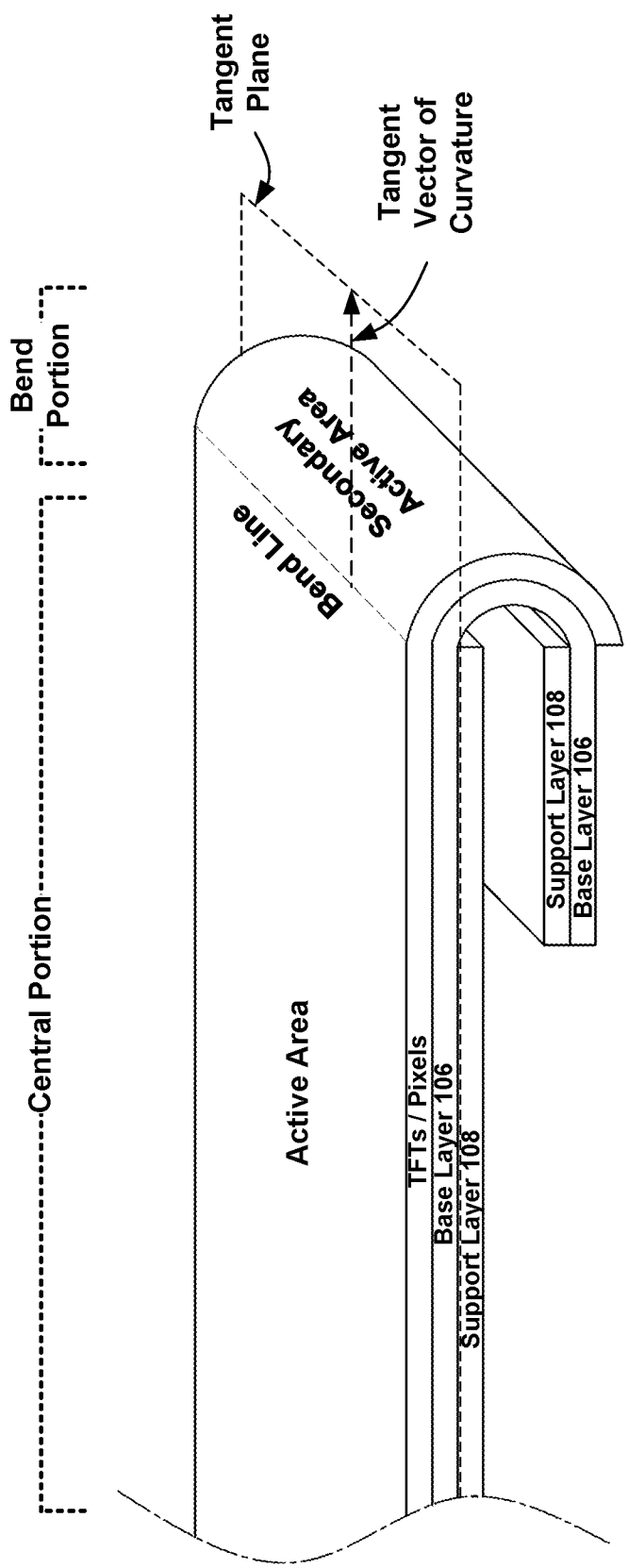
FIGS. 3A and 3B illustrate exemplary arrangement of active areas of a flexible display apparatus according to embodiments of the present disclosure.
Figure 3B:
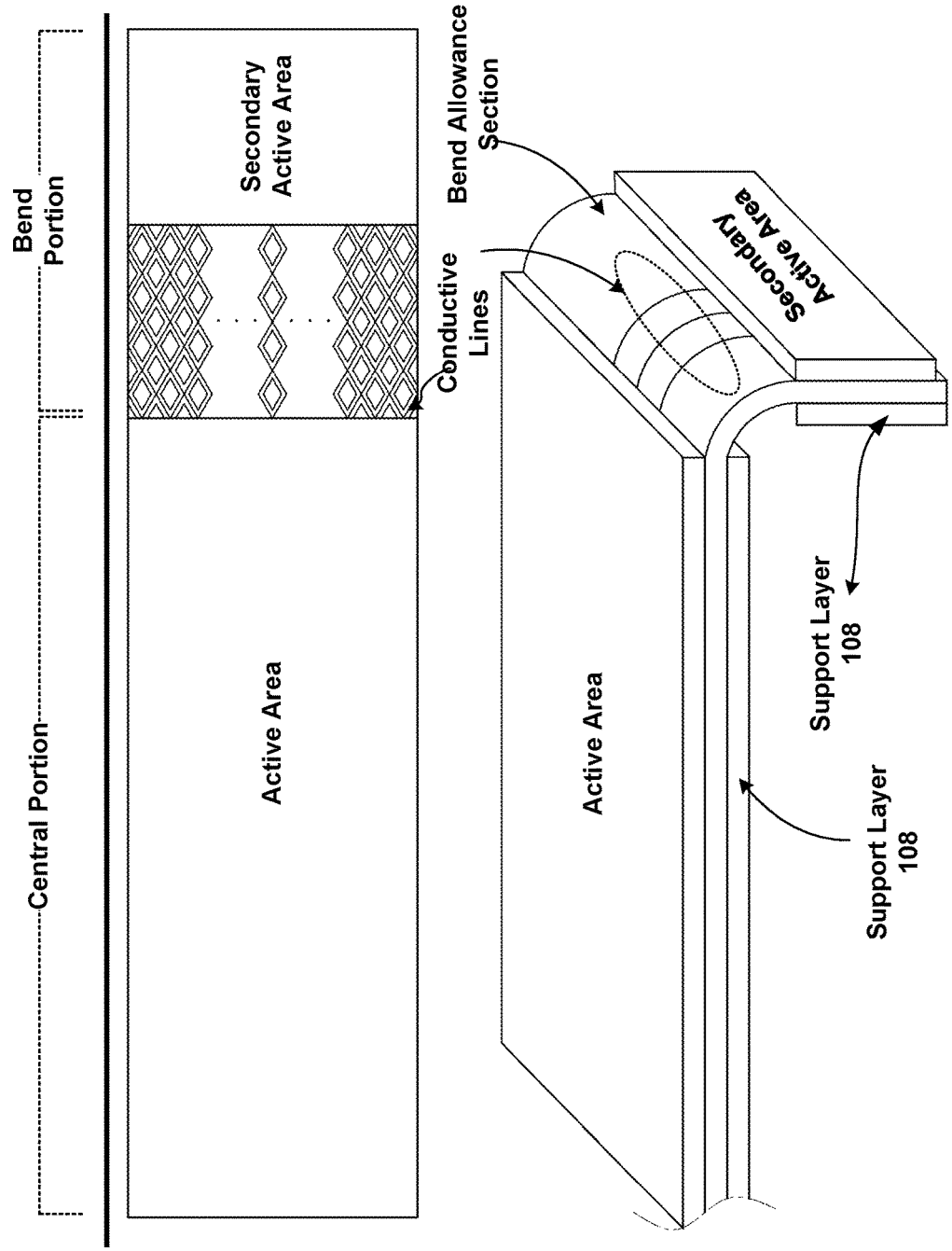

FIGS. 3A and 3B each illustrates an exemplary configuration of active areas in an embodiment of flexible display 100 of the present disclosure. In the configuration depicted in FIG. 3A, the matrix of pixels in the secondary active area of the bend portion may be continuously extended from the matrix of the pixels in the active area of the central portion. Alternatively, in the configuration depicted in FIG. 3B, the secondary active area within the bend portion and the active area within the central portion of the flexible display 100 may be separated apart from each other by the bend allowance section of the flexible display 100. Some components in the central portion and the bend portion can be electrically connected via one or more conductive line 120 laid across the bend allowance section of the flexible display 100.

The pixels in the secondary active area and the pixels in the central active area may be addressed by the driving circuits (e.g., gate driver, data driver, etc.) as if they are in a single matrix. In this case, the pixels of the central active area and the pixels of the secondary active area may be operated by the same set of driving circuits. By way of example, the $N^{th}$ row pixels of the central active area and the $N^{th}$ row pixels of the secondary active area may be configured to receive the gate signal from the same gate driver. As shown in FIG. 3B, the part of the gate line crossing over the bend allowance section (i.e., bend allowance region) or a bridge for connecting the gate lines of the two active areas may have a strain-reducing trace design, which will be described in further detail below.

Depending on the functionality of the secondary active area, the pixels of the secondary active area can be driven discretely from the pixels in the central active area. That is, the pixels of the secondary active area may be recognized by the display driving circuits as being an independent matrix of pixels separate from the matrix of pixels of the central active area. In such cases, the pixels of the secondary active area may receive signals from at least one discrete driving circuit other than a driving circuit for providing signals to the pixels of the central active area.

Regardless of the configuration, the secondary active area in the bend portion may serve as a secondary display area in the flexible display 100. Also, the size of the secondary active area is not particularly limited. The size of the secondary active area may depend on its functionality within the electronic device. For instance, the secondary active area may be used to provide images and/or texts such a graphical user interface, buttons, text messages, and the like. In some cases, the secondary active area may be used to provide light of various colors for various purposes (e.g., status indication light), and thus, the size of the secondary active area need not be as large as the active area in the central portion of the flexible display 100.

Stack-Up Structure

Figure 4:
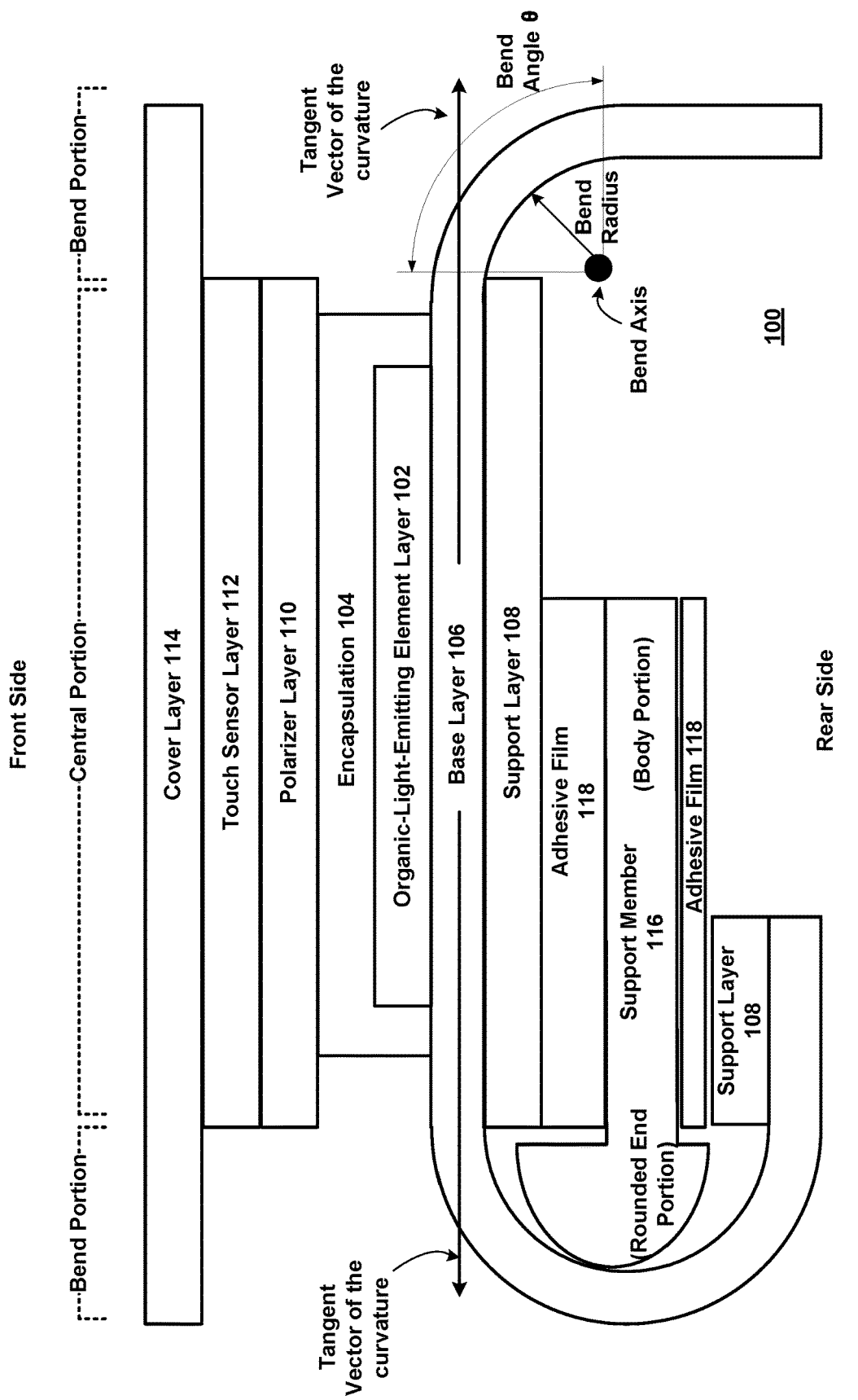
FIG. 4 illustrates simplified stack-up structure of components in an exemplary flexible display apparatus according to embodiment of the present disclosure.

FIG. 4 is a simplified cross-sectional view showing an exemplary stack up structure of a flexible display 100 in an embodiment of the present disclosure. For convenience of explanation, the central portion of the flexible display 100 is illustrated as being substantially flat, and the bend portions are provided at the edges of the flexible display 100 in FIG. 4.

As shown, one or more bend portions may be bent away from the plane of the substantially flat portion in a certain bend angle θ and with a bend radius R about the bending axis. The size of each bend portion that is bent away from the central portion needs not be the same. That is, the length of the base layer 106 from the bend line BL to the outer edge of the base layer 106 at each bend portion can be different from other bend portions. Also, the bend angle θ around the bend axis and the bend radius R from the bend axis can vary between the bend portions.

In the example shown in FIG. 4, the right side bend portion has the bend angle θ of 90°, and the bend portion includes a substantially flat section. A bend portion can be bent at a larger bend angle θ, such that at least some part of the bend portion comes underneath the plane of the central portion of the flexible display 100 as the bend portion on the left side of the flexible display 100. Also, a bend portion can be bent at a bend angle θ that is less than 90°.

In some embodiments, the radius of curvatures (i.e., bend radius) for the bend portions in the flexible display 100 may be between about 0.1 mm to about 10 mm, more preferably between about 0.1 mm to about 5 mm, more preferably between about 0.1 mm to about 1 mm, more preferably between about 0.1 mm to about 0.5 mm. In some embodiments, the bend radius at a bend portion of the flexible display 100 may be less than 0.5 mm.

One or more support layers 108 may be provided at the underside of the base layer 106 to increase rigidity and/or ruggedness at the selective portion of the flexible display 100. For instance, the support layer 108 can be provided on the inner surface of the base layer 106 at the substantially flat portions of the flexible display 100. The support layer 106 may not be provided in the bend allowance section where more flexibility is needed. The support layer 106 may also be provided on the base layer 106 of the bend portion that is positioned under the central portion of the flexible display 100. Increased rigidity at selective parts of the flexible display 100 may help in ensuring accurate configuration and placement of various components during manufacturing and using the flexible display 100. The support layer 108 can also serve to suppress generation of cracks in the base layer 106, if the base layer 106 has a higher modulus than the support layer 108.

The base layer 106 and the support layer 108 may each be made of a thin plastic film formed from polyimide, polyethylene naphthalate (PEN), polyethylene terephthalate (PET), other suitable polymers, a combination of these polymers, etc. Other suitable materials that may be used to form the base layer 106 and the support layer 108 include, a thin glass, a metal foil covered with a dielectric material, a multi-layered polymer stack and a polymer composite film comprising a polymer material combined with nanoparticles or micro-particles dispersed therein, etc. Support layers 108 provided in various parts of the flexible display 100 need not be made of the same material. For example, a thin-glass layer may be used as a support layer 108 for the central portion of the flexible display 100 while a thin plastic film layer is used as a support layer 108 for edge portions.

In addition to the constituent material, the thickness of the base layer 106 and the support layer 108 is another factors to consider in designing the flexible display 100. On the one hand, bending of the base layer 106 at a small bend radius can be difficult if the base layer 106 has excessively high thickness. Also, excessive thickness of the base layer 106 can increase mechanical stress to the components disposed thereon during bending the base layer 106. On the other hand, however, the base layer 106 can be too fragile to serve as a substrate for various components of the flexible display if it is too thin.

To meet such requirements, the base layer 106 may have a thickness in a range of about from 5 μm to about 50 μm, more preferably in a range of about 5 μm to about 30 μm, and more preferably in a range of about 5 μm to about 16 μm. The support layer 108 may have a thickness from about 100 μm to about 125 μm, from about 50 μm to about 150 μm, from about 75 μm to 200 μm, less than 150 μm, or more than 100 μm.

In one suitable exemplary configuration, a layer of polyimide with a thickness of about 10 μm to about 16 μm serves as the base layer 106 while a polyethylene terephthalate (PET) layer with a thickness of about 50 μm to about 125 μm serves as the support layer 108. In another suitable exemplary configuration, a layer of polyimide with a thickness of about 10 μm to about 16 μm serves as the base layer 106 while a thin-glass layer with a thickness of about 50 μm to about 200 μm is used as the support layer 108. In yet another suitable exemplary configuration, a thin glass layer is used as the base layer 106 with a layer of polyimide serving as the support layer 108 to suppress breaking of the base layer 106.

During manufacturing, some part of the flexible display 100 may be exposed to external light. Some materials used in fabricating the components on the base layer 106 or the components themselves may undergo undesirable state changes (e.g., threshold voltage shift in the TFTs) due to the light exposure during the manufacturing of the flexible display 100. Some parts of the flexible display 100 may be more heavily exposed to the external light than others, and this can lead to a display non-uniformity (e.g., mura, shadow defects, etc.). To minimize such problems, the base layer 106 and/or the support layer 108 may include one or more materials capable of reducing the amount of external light passing through in some embodiments of the flexible display 100.

The light blocking material, for instance chloride modified carbon black, may be mixed in the constituent material of the base layer 106 (e.g., polyimide or other polymers). In this way, the base layer 106 may formed of polyimide with a shade to provide a light blocking functionality. Such a shaded base layer 106 can also improve the visibility of the image content displayed on the flexible display 100 by reducing the reflection of the external light coming in from the front side of the flexible display 100.

Instead of the base layer 106, the support layer 108 may include a light blocking material to reduce the amount of light coming in from the rear side (i.e., the support layer 108 attached side) of the flexible display 100. The constituent material of the support layer 108 may be mixed with one or more light blocking materials in the similar fashion as described above with the base layer 106. Further, both the base layer 106 and the support layer 108 can include one or more light blocking materials. Here, the light blocking materials used in the base layer 106 and the support layer 108 need not be the same.

While making the base layer 106 and the support layer 108 to block the unwanted external light may improve display uniformity and reduce reflection as described above, recognizing alignment marks for accurate positioning of the components or for carrying out manufacturing process may become difficult. For example, accurate positioning of the components on the base layer 106 or the alignment during bending of the flexible display 100 can be difficult as the positioning of the layers may need to be determined by comparing the outer edges of the overlapping portions of the layer(s). Further, checking for unwanted debris or other foreign materials in the flexible display 100 can be problematic if the base layer 106 and/or the support layer 108 blocks the excessive range(s) of light spectrum (i.e., wavelengths in the visible, the ultraviolet and the infrared spectrum).

Accordingly, in some embodiments, the light blocking material, which may be included in the base layer 106 and/or the support layer 108 is configured to pass the light of certain polarization and/or the light within specific wavelength ranges usable in one or more manufacturing and/or testing processes of the flexible display 100. By way of example, the support layer 108 may pass the light to be used in quality check and/or alignment processes (e.g., UV, IR spectrum light) during the manufacturing the flexible display 100, but filter the light in the visible light wavelength range. The limited range of wavelengths can help reduce the display non-uniformity problem, which may be caused by the shadows generated by the printed circuit attached to base layer 106, especially if the base layer 106 includes the light blocking material as described above.

It should be noted that the base layer 106 and the support layer 108 can work together in blocking and passing specific types of light. For instance, the support layer 108 can change the polarization of light, such that the light will not be passable through the base layer 106. This way, certain type of light can be passed through the support layer 108 for various purposes during manufacturing of the flexible display 100, but unable to penetrate through the base layer 106 to cause undesired effects to the components disposed on the opposite side of the base layer 106.

Backplane of the flexible display 100 is implemented on the base layer 106. In some embodiments, the backplane of the flexible display 100 can be implemented with TFTs using low-temperature poly-silicon (LTPS) semiconductor layer as its active layer. In one suitable configuration, the pixel circuit and the driving circuits (e.g., GIP) on the base layer 106 are implemented with NMOS LTPS TFTs. In other suitable configuration, the backplane of the flexible display 100 can be implemented with a combination of NMOS LTPS TFTs and PMOS LTPS TFTs. For instance, the driving circuit (e.g., GIP) on the base layer 106 may include one or more CMOS circuits to reduce the number of lines for controlling the scan signals on the gate line.

Further, in some embodiments, the flexible display 100 may employ multiple kinds of TFTs to implement the driving circuits in the inactive area and/or the pixel circuits in the active area. That is, a combination of an oxide semiconductor TFT and an LTPS TFT may be used to implement the backplane of the flexible display 100. In the backplane, the type of TFTs may be selected according to the operating conditions and/or requirements of the TFTs within the corresponding circuit.

Low-temperature-poly-silicon (LTPS) TFTs generally exhibit excellent carrier mobility even at a small profile, making them suitable for implementing condensed driving circuits. The excellent carrier mobility of the LTPS TFT makes it an ideal for components requiring a fast speed operation. Despite the aforementioned advantages, initial threshold voltages may vary among the LTPS TFTs due to the grain boundary of the poly-crystalized silicon semiconductor layer.

A TFT employing an oxide material based semiconductor layer, such as an indium-gallium-zinc-oxide (IGZO) semiconductor layer (referred hereinafter as "the oxide TFT"), is different from the LTPS TFT in many respects. Despite a lower mobility than the LTPS TFT, the oxide TFT is generally more advantageous than the LTPS TFT in terms of power efficiency. Low leakage current of the oxide TFT during its off state allows to remain in active state longer. This can be of a great advantage for driving the pixels at a reduced frame rate when a high frame rate driving of the pixels is not needed.

By way of example, the flexible display 100 may be provided with a feature in which the pixels of the entire active area or selective portion of the active area are driven at a reduced frame rate under a specific condition. In this setting, the pixels can be refreshed at a reduced refresh rate depending on the content displayed from the flexible display 100. Also, part of the active area displaying a still image data (e.g., user interface, text) may be refreshed at a lower rate than other part of the active area displaying rapidly changing image data (e.g., movie). The pixels driven at a reduced refresh rate may have an increased blank period, in which the data signal is not provided to the pixels. This would minimize the power wasted from providing the pixels with the same image data. In such embodiments, some of the TFTs implementing the pixel circuits and/or the driving circuits of the flexible display 100 can be formed of the oxide TFT to minimize the leakage current during the blank period. By reducing the current leakage from the pixel circuits and/or the driving circuits, the pixels can achieve more stable level of luminance even when the display is refreshed at a reduced rate.

Another feature of the oxide TFT is that it does not suffer from the transistor-to-transistor initial threshold voltage variation issue as much as the LTPS TFTs. Such a property can be of a great advantage when increasing the size of the flexible display 100. Threshold shifts under bias stress is also different between LTPS TFT and oxide TFT.

Considering the aforementioned characteristics of LTPS TFT and oxide TFT, some embodiments of the flexible display 100 disclosed herein can employ a combination of the LTPS TFT and the oxide TFT in a single backplane. In particular, some embodiments of the flexible display 100 can employ LTPS TFTs to implement the driving circuits (e.g., GIP) in the inactive area and employ oxide TFTs to implement the pixel circuits in the active area. Due to the excellent carrier mobility of the LTPS TFTs, driving circuits implemented with LTPS TFTs may operate at a faster speed than the driving circuits implemented with the oxide TFTs. In addition, more condensed driving circuits can be provided with the LTPS TFT, which reduces the size of the inactive area in the flexible display 100. With the excellent voltage holding ratio of the oxide TFTs used in the pixel circuits, leakage from the pixels can be reduced. This also enables to refresh pixels in a selective portion of the active area or to drive pixels at a reduced frame rate under a predetermined condition (e.g., when displaying still images) while minimizing display defects caused by the leakage current.

In some embodiments, the driving circuits in the inactive area of the flexible display 100 may be implemented with a combination of N-Type LTPS TFTs and P-Type LTPS TFTs while the pixel circuits are implemented with oxide TFTs. For instance, N-Type LTPS TFTs and P-Type LTPS TFTs can be used to implement a CMOS gate driver (e.g., CMOS GIP, Data Driver) whereas oxide TFTs are employed in at least some part of the pixel circuits. Unlike the GIP formed entirely of either the P-type or N-type LTPS TFTs, the gate out signal from the CMOS gate driver can be controlled by DC signals or logic high/low signals. This allows for more stable control of the gate line during the blank period such that the suppression of current leakage from the pixel circuit or unintended activation of the pixels connected the gate line can be achieved.

It should be noted that a CMOS gate driver or an inverter circuit on the backplane can be implemented by using a combination of LTPS TFTs and oxide TFTs. For instance, a P-type LTPS TFT and an N-Type oxide TFT can be used to implement a CMOS circuit. Also, the pixel circuits in the active area can also be implemented by using both the LTPS TFTs and the oxide TFTs. When employing both kinds of TFTs in the pixel circuit and/or the driving circuit, the LTPS TFT can be strategically placed within the circuit to remove bias remaining in a node between oxide TFTs during their off state and minimize the bias stress (e.g., PBTS, NBTS). In addition, the TFTs in a circuit, which are connected to a storage capacitor, can be formed of the oxide TFT to minimize leakage therefrom.

A layer of organic light-emitting diode (OLED) elements is disposed on the base layer 106. The OLED element layer 102 includes a plurality of OLED elements, which is controlled by the pixel circuits and the driving circuits implemented on the base layer 106 as well as any other driving circuits provided on a separate printed circuit, which is connected to the connection interfaces on the base layer 106. The OLED element layer includes an organic light-emitting material layer, which may emit light of certain spectral color (e.g., red, green, blue). In some embodiments, the organic-light emitting material layer may have a stack configuration to emit white light, which is essentially a combination of multiple colored lights.

The encapsulation 104 is provided to protect the OLED element layer 102 from air and moisture. The encapsulation 104 may include multiple layers of materials for reducing permeation of air and moisture to protect OLED elements thereunder. In some embodiments, the encapsulation 104 may be provided in a form of a thin film.

The flexible display 100 may also include a polarization layer 110 for controlling the display characteristics (e.g., external light reflection, color accuracy, luminance, etc.) of the flexible display 100. Also, the cover layer 114 may be used to protect the flexible display 100.

Electrodes for sensing touch input from a user may be formed on an interior surface of a cover layer 114 and/or at least one surface of the polarization layer 110. If desired, an independent layer with the touch sensor electrodes and/or other components associated with sensing of touch input (referred hereinafter as touch-sensor layer 112) may be provided in the flexible display 100. The touch sensor electrodes (e.g., touch driving/sensing electrodes) may be formed from transparent conductive material such as indium tin oxide, carbon based materials like graphene or carbon nanotube, a conductive polymer, a hybrid material made of mixture of various conductive and non-conductive materials. Also, metal mesh (e.g., aluminum mesh, silver mesh, etc.) can also be used as the touch sensor electrodes.

The touch sensor layer 112 may include a layer formed of one or more deformable dielectric materials. One or more electrodes may be interfaced with or positioned near the touch sensor layer 112, and loaded with one or more signals to facilitate measuring electrical changes on one or more of the electrodes upon deformation of the touch sensor layer 112. The measurement may be analyzed to assess the amount of pressure at a plurality of discrete levels and/or ranges of levels on the flexible display 100.

In some embodiments, the touch sensor electrodes can be utilized in identifying the location of the user inputs as well as assessing the pressure of the user input. Identifying the location of touch input and measuring of the pressure of the touch input on the flexible display 100 may be achieved by measuring changes in capacitance from the touch sensor electrodes on one side of the touch sensor layer 112. The touch sensor electrodes and/or other electrode may be used to measure a signal indicative of the pressure on the flexible display 100 by the touch input. Such a signal may be obtained simultaneously with the touch signal from the touch sensor electrodes or obtained at a different timing.

The deformable material included in the touch sensor layer 112 may be an electro-active material, which the amplitude and/or the frequency of the deformation is controlled by an electrical signal and/or electrical field. The examples of such deformable materials include piezo ceramic, electro-active-polymer (EAP) and the like. Accordingly, the touch sensor electrodes and/or separately provided electrode can activate the deformable material to bend the flexible display 100 to desired directions. In addition, such electro-active materials can be activated to vibrate at desired frequencies, thereby providing tactile and/or texture feedback on the flexible display 100. It should be appreciated that the flexible display 100 may employ a plurality of electro-active material layers so that bending and vibration of the flexible display 100 can be provided simultaneously or at a different timing. Such a combination can be used in creating sound waves from the flexible display 100.

Components of the flexible display 100 may make it difficult to bend the flexible display 100 along the bend line BL. Some of the elements, such as the support layer 108, the touch sensor layer 112, the polarization layer 110 and the like, may add too much rigidity to the flexible display 100. Also, the thickness of such elements shifts the neutral plane of the flexible display 100 and thus some of the components may be subject to greater bend stresses than other components.

To facilitate easier bending and to enhance the reliability of the flexible display 100, the configuration of components in the bend portion of the flexible display 100 differs from the substantially flat portion of the flexible display 100. Some of the components existing in the substantially flat portion may not be disposed in the bend portions of the flexible display 100, or may be provided in a different thickness. The bend portion may be free of the support layer 108, the polarization layer 110, the touch sensor layer 114, a color filter layer and/or other components that may hinder bending of the flexible display 100. Such components may not be needed in the bend portion if the bend portion is to be hidden from the view or otherwise inaccessible to the users of the flexible display 100.

Even if the secondary active area is in the bend portion for providing information to users, the secondary active area may not require some of these components depending on the usage and/or the type of information provided by the secondary active area. For example, the polarization layer 110 and/or color filter layer may not be needed in the bend portion when the secondary active area is used for simply emitting colored light, displaying texts or simple graphical user interfaces in a contrast color combination (e.g., black colored texts or icons in white background). Also, the bend portion of the flexible display 100 may be free of the touch sensor layer 114 if such functionality is not needed in the bend portion. If desired, the bend portion may be provided with a touch sensor layer 112 and/or the layer of electroactive material even though the secondary active area for displaying information is not provided in the bend portion.

Since the bend allowance section is most heavily affected by the bend stress, various bend stress-reducing features are applied to the components on the base layer 106 of the bend allowance section. To this end, some of the elements in the central portion may be absent in at least some part of the bend portion. The separation between the components in the central portion and the bend portion may be created by selectively removing the elements at the bend allowance section of the flexible display 100 such that the bend allowance section is free of the respective elements.

As depicted in FIG. 4, the support layer 108 in the central portion and the support layer 108 in the bend portion can be separated from each other by the absence of the support layer 108 at the bend allowance section. Instead of using the support layer 108 attached to the base layer 106, a support member 116 with a rounded end portion can be positioned underside of the base layer 106 at the bend allowance section. Various other components, for example the polarization layer 110 and the touch sensor layer 114 and more, may also be absent from the bend allowance section of the flexible display 100. The removal of the elements may be done by cutting, wet etching, dry etching, scribing and breaking, or other suitable material removal methods. Rather than cutting or otherwise removing an element, separate pieces of the element may be formed at the selective portions (e.g., substantially flat portion and the bend portion) to keep the bend allowance section free of such element.

Figure 5:
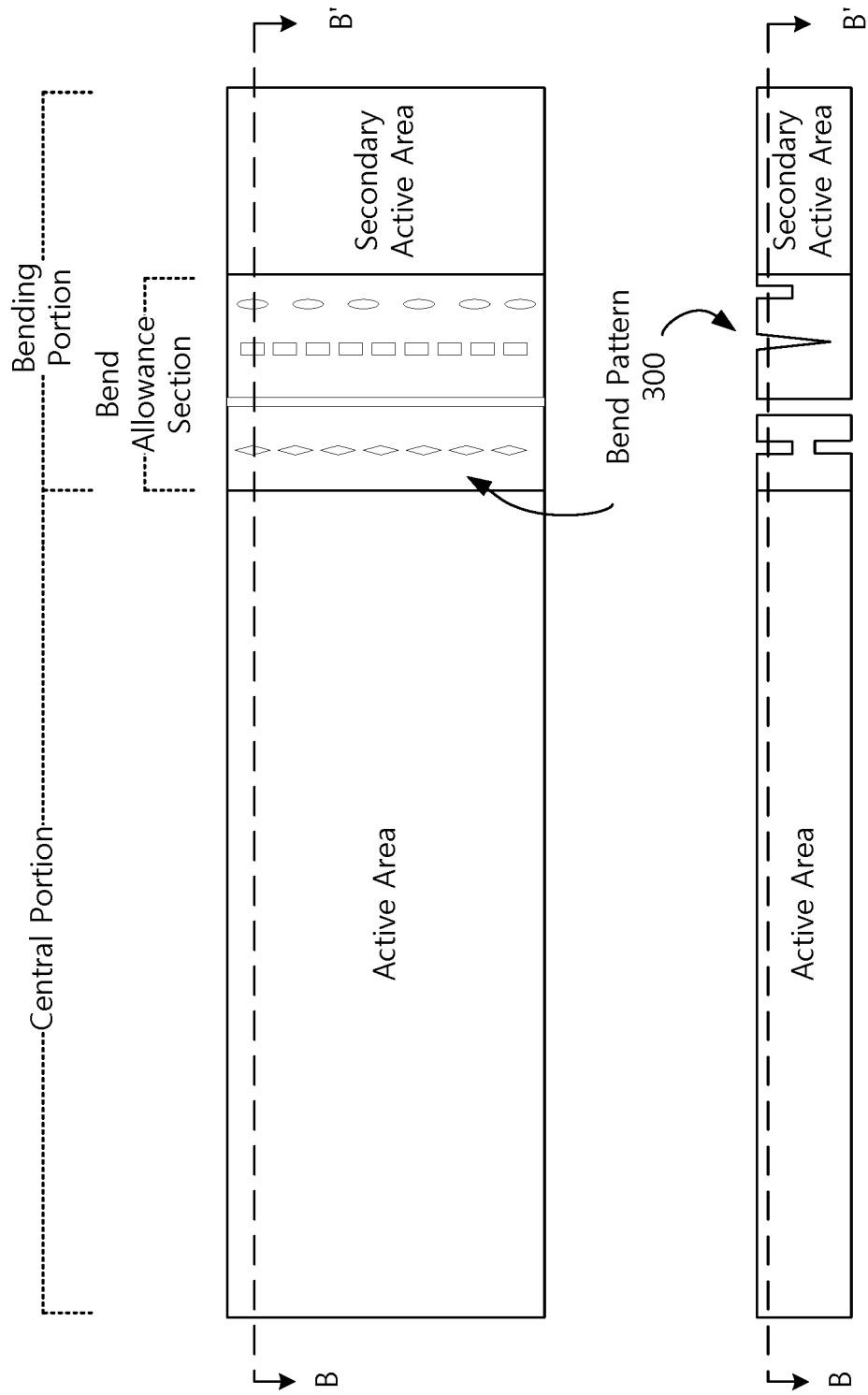
FIG. 5 illustrates various examples of bend patterns applicable to facilitate bending of a display apparatus.

Rather than being entirely removed from the bend portion, some elements may be provided with a bend pattern along the bend lines and/or the parts within the bend allowance section to reduce the bend stress. FIG. 5 illustrates a plane view and a cross-sectional view of exemplary bend patterns, which may be applied to some of the components. The bend patterns described above may be used in the support layer 108, the polarization layer 110, the touch sensor layer 112 and various other elements of the flexible display 100.

The flexible display 100 may utilize more than one types of bend patterns. It should be appreciated that a number of bend patterns and the types of the bend patterns utilized by the components is not limited. If desired, the depth of the patterns may not be deep enough to penetrate through the component entirely but penetrate only partially through the respective layer. As will be described in further detail below, a buffer layer positioned between the base layer 106 and the TFT as well as a passivation layer covering a conductive line may be also be provided with the bend pattern for reducing bend stress.

Support Member

As mentioned, the support layer 108 may not be present at the bend allowance section to facilitate easier bending of the base layer 106. Absent the support layer 108, however, the curvature at the bend allowance section may be easily altered by external force. To support the base layer 106 and maintain the curvature at the bend allowance section, the flexible display 100 may also include a support member 116, which may also be referred to as a "mandrel." The exemplary support member 116 depicted in FIG. 4 has an elongated body portion and a rounded end portion. The base layer 106 and the support member 116 are arranged so that that the rounded end portion of the support member 116 is positioned at the underside of the base layer 106 corresponding to the bend allowance section of the flexible display 100.

In embodiments where a bend portion is provided at an edge of the flexible display 100, the support member 116 can be provided at the edge of the flexible display 100. In this setting, a part of the base layer 106 may come around the rounded end portion of the support member 116 and be positioned at the underside the support member 116 as depicted in FIG. 4. Various circuits and components in the inactive area of the flexible display 100, such as drive ICs and connection interfaces for connecting chip-on-flex (COF) and printed circuit board (PCB), may be provided on the base layer 106 that is positioned at the rear side of the flexible display 100. In this way, even the components that are not flexible enough to be bent in a bend radius desired by the flexible display 100 can be placed under the active area of the flexible display 100.

The support member 116 can be formed of plastic material such as polycarbonate (PC), polyimide (PI), polyethylene naphthalate (PEN), polyethylene terephthalate (PET), other suitable polymers, a combination of these polymers, etc. The rigidity of the support member 116 formed of such plastic materials may be controlled by the thickness of the support member 116 and/or by providing additives for increasing the rigidity. The support member 116 can be formed in a desired color (e.g., black, white, etc.). Further, the support member 116 may also be formed of glass, ceramic, metal or other rigid materials or combinations of aforementioned materials.

Size and shape of the rounded end portion of the support member 116 can vary depending on the minimum curvature desired at the bend allowance section of the flexible display 100. In some embodiments, the thickness of the rounded end portion and the thickness of the elongated body portion may be substantially the same. In other embodiments, the elongated body portion, which has a planar shape, may be thinner than the rounded end portion of the support member 116. With a thinner profile at the elongated body portion, the support member 116 can support the bend allowance section while avoiding unnecessary increase in the thickness in the flexible display 100.

Since the support at the bend allowance section is provided by the rounded end portion of the support member 116, the elongated planar portion extending toward the substantially flat portion of the flexible display 100 needs not be extended into the active area. While the elongated body portion can be extended under the active area for various reasons, the length of the elongated body portion from the rounded end portion towards the opposite end is sufficient so long as it provides enough surface area for securing the support member 116 in a desired location of the flexible display 100.

To secure the support member 116 in the flexible display 100, an adhesive layer 118 may be provided on the surface of the support member 116. The adhesive layer 118 may include a pressure-sensitive adhesive, a foam-type adhesive, a liquid adhesive, a light-cured adhesive or any other suitable adhesive material. In some embodiments, the adhesive layer 118 can be formed of, or otherwise includes, a compressible material and serve as a cushion for the parts bonded by the adhesive layer 118. As an example, the constituent material of the adhesive layer 118 may be compressible. The adhesive layer 118 may be formed of multiple layers, which includes a cushion layer (e.g., polyolefin foam) interposed between an upper and a lower layers of an adhesive material.

The adhesive layer 118 can be placed on at least one of the upper surface and the lower surface of the elongated body portion of the support member 116. When the bend portion of the flexible display 100 wraps around the rounded end portion of the support layer 116, an adhesive layer 118 can be provided on both the lower surface (i.e., the surface facing the rear side) and the upper surface (i.e., the surface facing the front side) of the elongated body portion. If desired, an adhesive layer 118 may be provided between the surface of the rounded end portion of the support member 116 and the inner surface of the base layer 106.

During bending, a part of the flexible display 100 on one side of the support member 116 may be pulled toward the support member 116, and the base layer 106 may be damaged by the highest and the lowest edges of the rounded end portion. As such, the height of the adhesive layer 118 and the support layer 108 between the support member 116 and the base layer 106 may be at least equal to or greater than the vertical distance between the highest edge of the rounded end portion and the surface of the elongate body portion where the adhesive layer 118 is placed. In other words, the height of the space created by the thickness difference between the rounded end portion and the elongated body portion of the support member 116 may be equal to or less than the collective thickness of the support layer 108 and the adhesive layer 118.

Depending on the shape of the support member 116, a thickness of the adhesive layer 118 on the upper and the lower surfaces of the elongated body portion may be different. For instance, the elongated body portion, which is thinner than the rounded end portion, may not be at the center of the rounded end portion of the support member 116. In such cases, the space on one side of the support member 116 may be greater than the space on the opposite side.

In another example, the lowest edge of the rounded end portion may be in-line with the bottom surface of the elongated body portion such that the space is provided only on one side of the elongated body portion. In such cases, the adhesive layer 118 on one side of the elongated body portion of the support member 116 can be thicker than the one on the opposite side. It should be appreciated that the dimensions of the support member 116 in FIG. 4 may be exaggerated for the purposes of simpler explanation.

Exemplary Arrangement

Figure 6A:
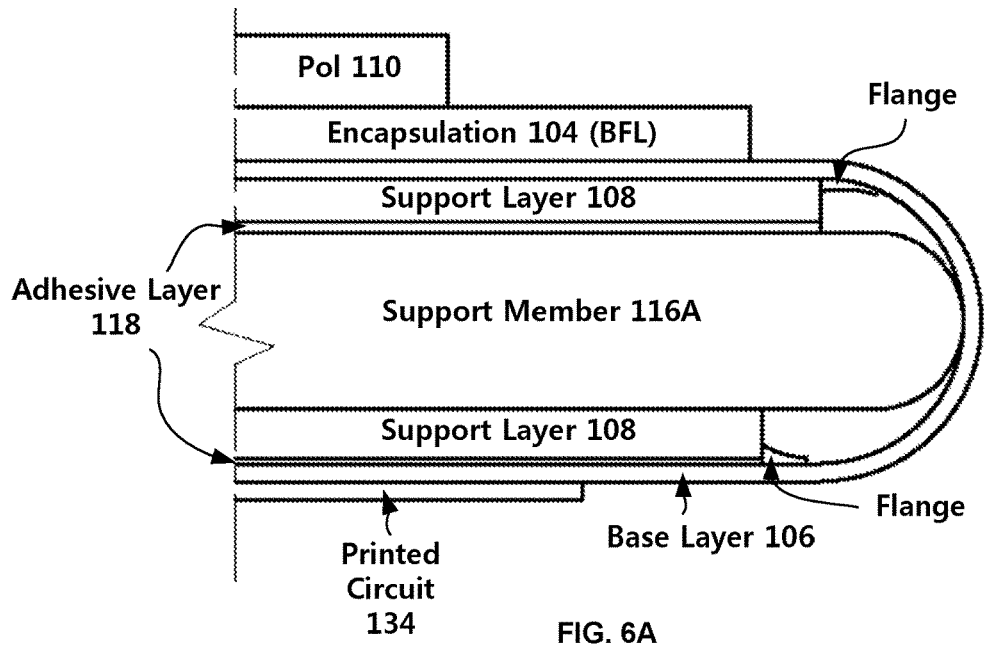
FIGS. 6A-6D are cross-sectional views of illustrative arrangement of components in a flexible display apparatus according to various embodiments of the present disclosure.

FIGS. 6A, 6B, 6C and 6D are simplified cross-sectional views showing exemplary arrangements of elements in various embodiments of the flexible display 100. In one suitable configuration, which is depicted in FIG. 6A, the thickness of the rounded end portion and the elongated body portion of the support member 116A may be substantially the same as illustrated in FIG. 6A. Such a support member 116A can be formed of the plastic materials mentioned above. The support member 116A may also be formed of a folded thin sheet metal (e.g., SUS). In this case, the folded edge of the sheet metal can serve as the rounded end portion of the support member 116A. Even when a sheet metal is used to form the support member, the rounded end portion can have greater thickness than the elongated body portion. For instance, pressure can be applied on the part of the folded metal sheet for the elongated body portion to make that portion thinner than the folded edge.

An adhesive layer 118A may be applied on the upper, the lower surface and the surface of the rounded end portion of the support member 116A. As the thickness of the support member 116A at the rounded end portion and the elongated body portion is about the same, the thickness of the adhesive layer 118A may have a substantially uniform thickness on the surface of the support member 116A. However, it should be noted that the adhesive layer 118A can be thinner and/or thicker at selective parts of the support member 116A.

Figure 6B:
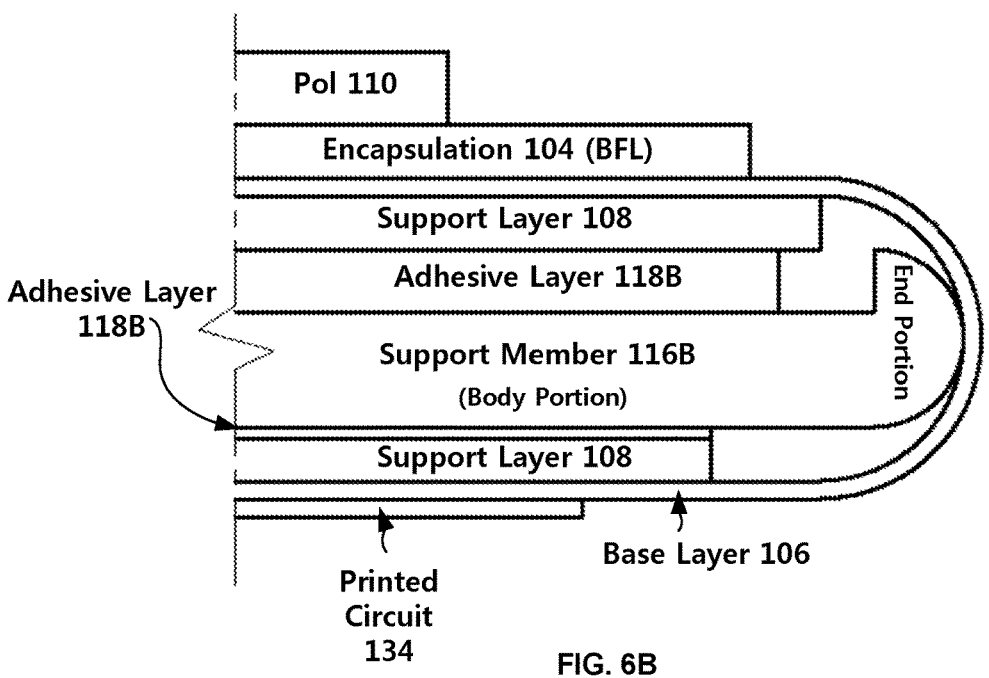

In another suitable configuration, which is depicted in FIG. 6B, the elongated body portion of the support member 116 is thinner than its rounded end portion. In this regard, the bottom surface of the elongated body portion is in-line with the lowest edge of the rounded end portion, providing a support member 116B with a flat bottom. In this exemplary configuration, the support members 116B may be formed of one or a combination of aforementioned plastic materials (e.g., polycarbonate). Also, the adhesive layer 118B provided on the upper surface of the elongated body portion is thicker than the adhesive layer 118B provided on the bottom surface of the elongated body portion of the support member 116B. The adhesive layer 118B on the upper surface of the elongated body portion may include a cushion layer described above while the adhesive layer 118B on the lower surface does not.

Figure 6C:
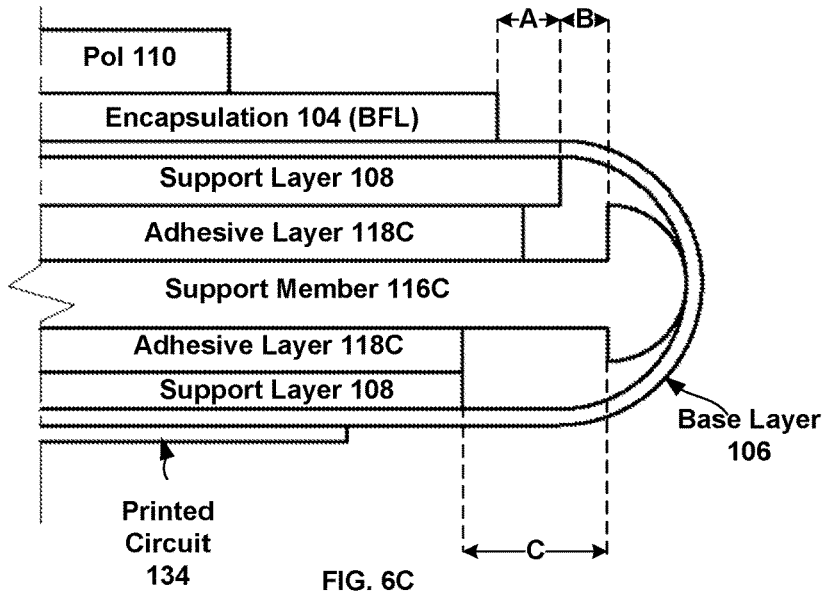

In yet another suitable configuration shown in FIG. 6C, neither the top nor the bottom surfaces of the elongated body portion of the support member 116C is in-line with the highest/lowest edges of the rounded portion. The support members 116C may be formed of one or a combination of aforementioned plastic materials (e.g., polycarbonate). In this example, the elongated body portion may be off-centered (i.e., closer to the lowest edge of the rounded portion), and the adhesive layer 118C on the upper surface of the elongated body portion is thicker than the adhesive layer 118C on the lower surface. The adhesive layer 118C on the upper surface of the elongated body portion may include a cushion layer described above while the adhesive layer 118C on the lower surface does not.

In the exemplary configurations depicted in FIGS. 6A-6C, the support layer 108 on the upper side of the support member 116 is extended out toward the bend allowance section further than the encapsulation 104. In other words, some of the support layer 108 near the edge of the flexible display 100 is not overlapped by the encapsulation 104. The extra margin (denoted "A" in FIG. 6C) of the support layer 108 provided under the encapsulation 104 can help maintain a steady rate of curvature in the bend allowance section.

When bending the base layer 106 around the rounded end portion of the support member 116, the support layer 108 can be positioned on the rounded end portion of the support member 116 due to alignment error. In such cases, the support layer 108 on the rounded end portion may push away the elements on the base layer 106 and shift the neutral plane or cause delamination of those elements in the bend portion of the flexible display 100. As such, the support layer 108 under the base layer 106 is arranged such that the edge of the support layer 108 is extended out toward the bend allowance section further than the edge of the encapsulation 104. In other words, the support member 116 may be placed under the support layer 108 with some margin (denoted "B" in FIG. 6C) between the edge of the support layer 108 and the tip of the support member 116.

Similar to the support layer 108 place above the support member 116, the support layer 108 under the support member 116 should not be placed on the rounded end portion of the support member 116. However, the edge of the support layer 108 under the support member 116 needs not be aligned with the edge of the support layer 108 above the support member 116. Considering that the base layer 106 will be wrapped around the rounded end portion of the support member 116, spacing between the separated support layers 108 on the bottom surface of the base layer 106 can be set with some alignment error margin. As such, the support layer 108 to be placed under the support member 116 may be arranged on the bottom surface of the base layer 106 such that the edge of the lower side support layer 108 is positioned further away from bend allowance section than the edge of the support layer 108 above the support member 116. In this setting, the distance (denoted "C" in FIG. 6C) between the edge of the lower side support layer 108 and the lower tip of the rounded end portion of the support member 116 can be greater than the distance between the edge of the upper side support layer 108 and the upper tip of the rounded end portion of the support member 116.

In some embodiments, the edge of the support layer 108 toward the bend allowance section can be provided with a flange, which extends even further out toward the bend allowance section as shown in FIG. 6A. The flange may be formed by cutting or otherwise patterning the support layer 108 to have a tapered edge. The flange can also be provided by stacking at least two support layers with their edges shifted from each other. While omitted in FIGS. 6B and 6C, the flange can be provided in those embodiments as well.

It should be appreciated that the configurations described above in reference to FIGS. 6A-6C are merely illustrative. Adhesive layers having the same thickness can be provided on the upper and the lower surfaces of the support member regardless of the position of the elongated body portion. Further, adhesive layers on both the upper surface and the lower surface of the support member can include a cushion layer.

Figure 6D:
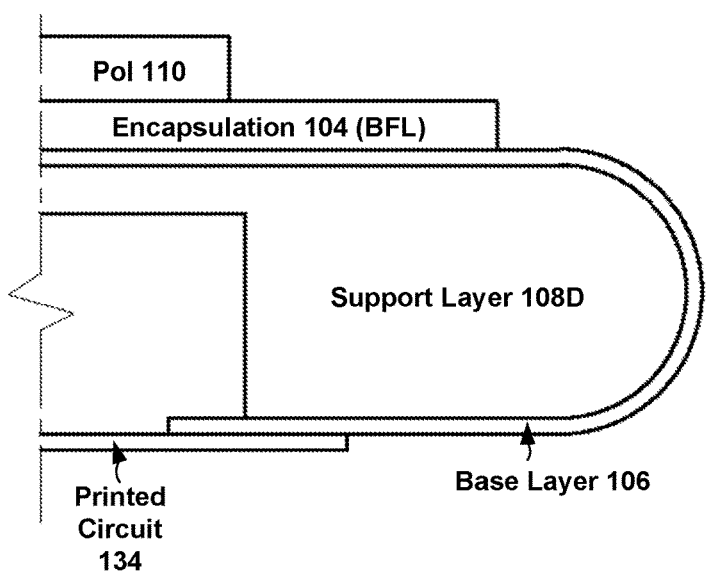

Instead of employing a discrete support member 118, in some embodiments of the flexible display 100, the support layer 108 may be provided with a thickened rounded end positioned under the base layer 106 in the bend allowance section. FIG. 6D is a schematic illustration showing an exemplary arrangement of the support layer 108 under the base layer 106 at the bend portion of the flexible display 100. In this example, the end portion of the support layer 108 is thicker than the portion of the support layer 108 under the display area of the flexible display 100. Also, the thicker portion of the support layer 108 has a rounded edge, which substantially conforms to the curvature of the base layer 106 in the bend allowance section. In this way, the rounded edge of the support layer 108 can serve as the discrete support member 116 employed in the embodiments depicted in FIGS. 6A-6C.

In this case, the support layer 108 can be formed of plastic material such as polycarbonate (PC), polyimide (PI), polyethylene naphthalate (PEN), polyethylene terephthalate (PET), other suitable polymers, a combination of these polymers, etc. The rigidity of the support layer 108 formed of such plastic materials may be controlled by the thickness of the support layer 108 and/or by providing additives for increasing the rigidity. As such, a portion of the support layer 108 corresponding to the substantially flat portion of the flexible display or to the display area can have a different thickness from the portion of the support layer 108 corresponding to the bend portion of the flexible display 100. It should be noted that the thickness of the support layer may be thicker in the bend portion of the flexible display 100 than the substantially flat portion of the flexible display 100 as the rounded edge portion of the support layer 108 is used in providing the curved surface for the flexible base layer 106 to be wrapped around. Similar to the support member 116 of the previously mentioned embodiments, the support layer 108 provided with the rounded edge portion can be formed in a desired color (e.g., black, white, etc.).

Unlike the embodiments where two separate support layers are provided at the opposite ends of the bend allowance section, a single piece of support layer 108D is used to support the base layer 106 in the bend portion of the flexible display 100. In addition to the cost savings and process simplification in manufacturing of the flexible display 100, the elimination of a separate support member 116 from the flexible display 100 provides may provide various benefits as to the design of the flexible display 100. First of all, it is very unlikely that the encapsulation 104 will be extended out toward the bend allowance section past the support layer 108D when using the end of the support layer 108D to support the base layer 106 in the bend allowance section. Accordingly, any problems which might result from the misalignment of the encapsulation 104 in relation to the edge of the support layer 108 on the separate support member 116 can be prevented.

Also, using a single piece of support layer 108D for supporting the base layer 106 in the bend portion eliminates the needs for providing alignment error margins between separate pieces of the elements in the bend allowance section. For instance, the extra margins for ensuring that the support layers are not placed over the rounded end portion of the support member 116 (e.g., margins B and C) are no longer needed. With the extra margin eliminated from the design of the bend portion, even a narrower bezel can be achieved in the flexible display 100.

The support layer 108D may be formed of any of the plastic materials described suitable for the support layer 108 and the support member 116. However, to provide the thicker rounded end portion in the support layer 108D as shown in FIG. 6D, it is preferred that the support layer 108D is formed of a material suitable for an injection molding process or other processes capable of forming the support layer 108 with an edge that is sufficiently rounded to accommodate the curvature of the base layer 106 in the bend allowance section.

Multi-Layered Conductive Lines

Several conductive lines are included in the flexible display 100 for electrical interconnections between various components therein. The circuits fabricated in the active area and inactive area may transmit various signals via one or more conductive lines to provide a number of functionalities in the flexible display 100. As briefly discussed, some conductive lines may be used to provide interconnections between the circuits and/or other components in the central portion and the bend portion of the flexible display 100.

As used herein, the term conductive lines broadly refers to a trace of conductive path for transmitting any type of electrical signals, power and/or voltages from one point to another point in the flexible display 100. As such, conductive lines may include source/drain electrodes of the TFTs as well as the gate lines/data lines used in transmitting signals from some of the display driving circuits (e.g., gate driver, data driver) in the inactive area to the pixel circuits in the active area. Likewise, some conductive lines, such as the touch sensor electrodes, pressure sensor electrodes and/or fingerprint sensor electrodes may provide signals for sensing touch input or recognizing fingerprints on the flexible display 100. Furthermore, conductive lines can provide interconnections between elements of the active area in the central portion and elements of the secondary active area in the bend portion of the flexible display 100. It should be appreciated that the functionalities of conductive lines described above are merely illustrative.

Conductive lines in a flexible display 100 should be carefully designed to meet various electrical and non-electrical requirements. For instance, a conductive line may have a specific minimum electrical resistance level, which may vary depending on the type of signals to be transmitted via the conductive line. Some conductive lines may be routed from the substantially flat portion to the bend portion of the flexible display 100. Such conductive lines should exhibit sufficient flexibility to maintain its mechanical and electrical robustness. To this end, some conductive lines of the flexible display 100 may have a multi-layered structure.

Figure 7A:
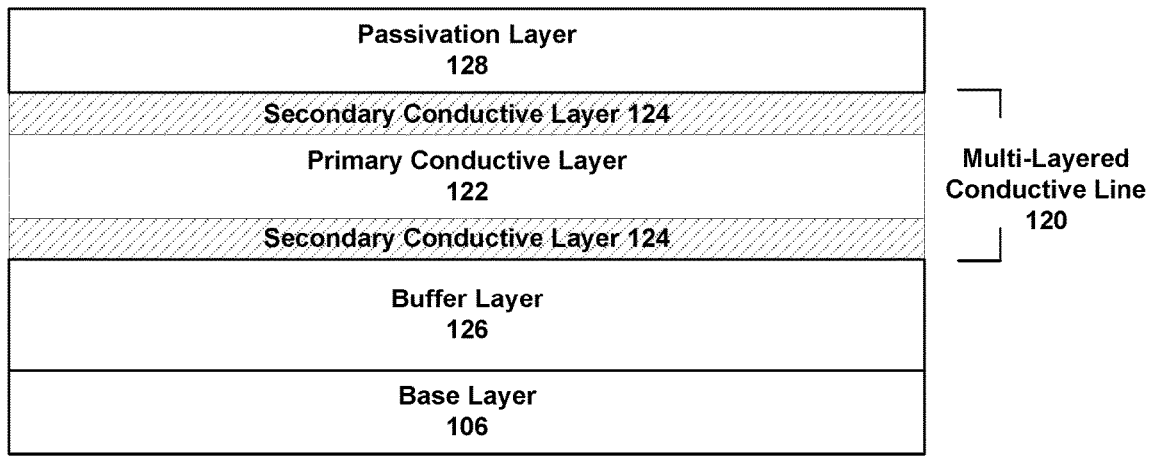
FIGS. 7A and 7B illustrate schematic view of an exemplary multi-layered conductive lines and insulation layers according to embodiments of the present disclosure.
Figure 7B:
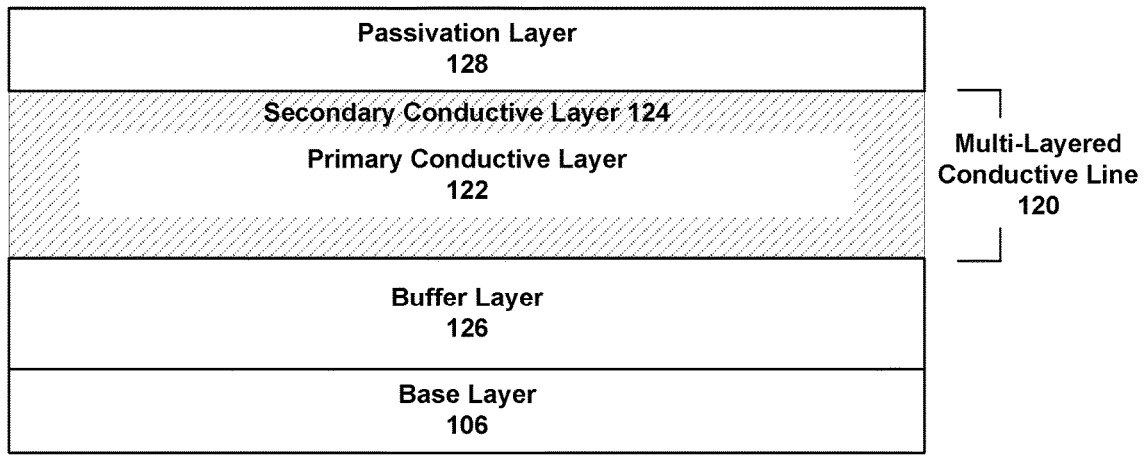

FIGS. 7A and 7B each illustrates exemplary stack structure of the multi-layered conductive line. Referring to FIG. 7A, the conductive line 120 has a multi-layered structure in which the primary conductive layer 122 is sandwiched between the secondary conductive layers 124. The primary conductive layer 122 may be formed of material with a lower electrical resistance than that of the secondary conductive layer 144. Non-limiting examples of the materials for the primary conductive layer 122 includes copper, aluminum, transparent conductive oxide, or other flexible conductors.

The secondary conductive layer 124 should be formed of conductive material that exhibits sufficiently low ohmic contact resistance when formed in a stack over the primary conductive layer 122. Low ohmic contact resistance between the conductive layers is not the only factor in the selection of materials for the conductive layers in the multi-layered conductive line 120. While meeting the stringent electrical and thermal requirements (e.g., resistance, heat generation, etc., the materials of the conductive line 120 should also satisfy the minimum mechanical stress requirement (e.g., Young's modulus). That is, both the primary conductive layer 122 and the secondary conductive layer 124 should be formed of materials exhibiting sufficient flexibility.

Accordingly, in some embodiments, at least some of the conductive lines 120 of the flexible display 100 may be formed with two or more of layers selected from aluminum (Al), titanium (Ti), molybdenum (Mo), Copper (Cu) layers. Examples of such combination include an aluminum layer sandwiched between titanium layers (Ti/Al/Ti), an aluminum layer sandwiched between upper and lower molybdenum layers (Mo/Al/Mo), a copper layer sandwiched between titanium layers (Ti/Cu/Ti) and a copper layer sandwiched between upper and lower molybdenum layers (Mo/Cu/Mo). Of course, other conductive materials can be used for the primary/secondary conductive layers.

Electronic device employing the flexible display 100, for instance a wearable electronic device or a water submergible electronic device, may expose the flexible display 100 in a humid environment. In some cases, moist can reach the conductive line 120. Dissimilar metals and alloys have different electrode potentials, and when two or more come into contact in an electrolyte, one metal acts as anode and the other as cathode. The electro-potential difference between the dissimilar metals accelerates corrosion on the anode member of the galvanic couple, which would be the primary conductive layer 122 in the multi-layered conductive line 120 (e.g., Al layer in the Ti/Al/Ti stack). The anode metal dissolves into the electrolyte, and deposit collects on the cathodic metal.

When using a multi-layered conductive line 120 described above, any surface that exposes both the primary conductive layer 122 and the secondary conductive layer 124 may become a galvanic corrosion initiation point. Accordingly, in some embodiments of the flexible display 100, at least some conductive lines 120 is provided with a structure in which the outer surface of the primary conductive layer 122 is surrounded by the secondary conductive layer 124 as shown in FIG. 7B. Such a configuration hinders the electrolyte from being in contact with both the primary conductive layer 122 and the secondary conductive layer 124, thereby minimizing loss of the primary conductive layer 122 by galvanic corrosion.

Such a multi-layered conductive lines 120 can be created by first depositing the material for the primary conductive layer 122 (e.g., Al) over the secondary conductive layer 124 (e.g., Ti). Here, the secondary conductive layer 124 underneath the primary conductive layer 122 may have greater width. Etch resist material is formed over the stack of these two layers and etched (e.g., dry etch, wet etch, etc.) to form the conductive line in a desired trace. After striping the etch resistance material, another layer of secondary conductive layer 124 (i.e., Ti) is deposited over the patterned structure (i.e., Ti/Al). The width of the secondary conductive layer 124 deposited over the primary conductive layer 122 may be greater than the width of the primary conductive layer 122 to cover the outer surface of the primary conductive layer 122. Another round of etching and striping of the etch resistance material is performed to form the stack of a multi-layered conductive line in a desired conductive line trace design. It should be understood that the multi-layered conductive line formation processes described above are merely an example. Accordingly, some processes may be added and/or skipped in making a multi-layered conductive line.

Bridged Conductive Lines

Manufacturing of the flexible display 100 can involve scribing a large flexible polymer sheet into a base layer 106 of a desired shape and size. Also, some parts of the base layer 106 become unnecessary as the manufacturing progresses, and such parts may be chamfered away. Some conductive lines on the base layer 106 laid across the scribing line and/or the chamfer line can be cut during the scribing and/or chamfering processes. For instance, one or more conductive lines used for testing or temporarily operating the driving circuits, pixels and/or various other components during manufacturing of the flexible display 100 may be laid across the scribe line or the chamfer line of the base layer 106. Such conductive lines may be referred to as the "test lines" in the present disclosure. Once the tests or other procedures involving the use of these test lines are completed, scribing and/or chamfering processes can be performed to remove the scribed/chamfered area along with the parts of the test lines placed thereon.

In some embodiments, a pad for receiving one or more signals may be provided on one end of the conductive lines. The other end of the conductive line may be connected to the data lines of the pixels and/or some of the driving circuits. Various signals can be supplied on the conductive line via the pads and transmitted to the destination via the conductive line to carry out the test procedures. These test pads may take a considerable space on the base layer 106, and thus they can be placed on the part of the base layer 106 to be scribed/chamfered away.

Figure 8A:
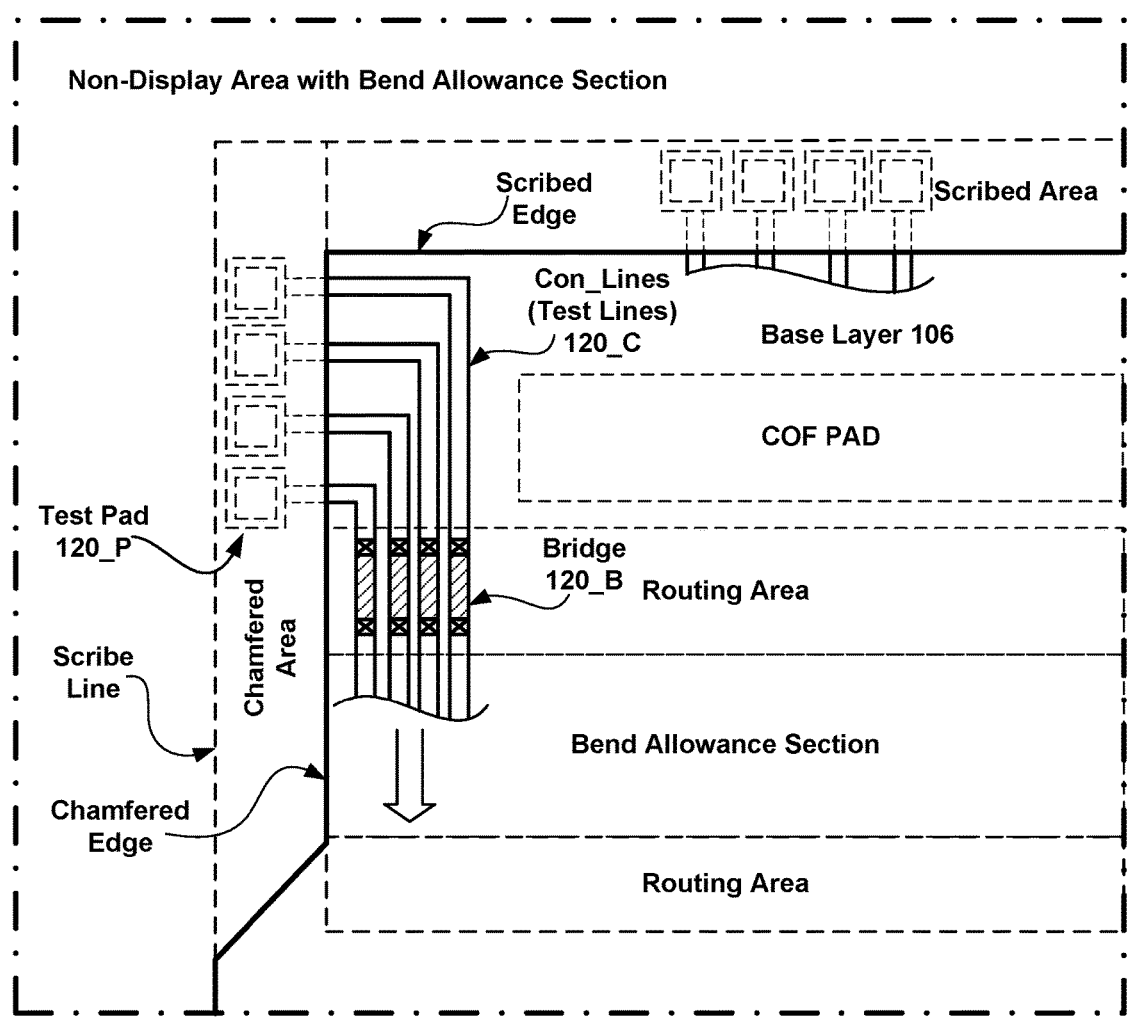
FIG. 8A illustrates exemplary arrangement of bridged conductive lines in a non-display area with a bend allowance section according to embodiments of the present disclosure.

FIG. 8A illustrates a non-display area of the flexible display 100, in which a bend allowance section is provided. As shown, the test lines 120_C and test pads 120_P can be placed in the non-display area where the bend allowance section is located. In particular, the test pads 120_P can be provided in the area that is to be notched away by the chamfering process.

The non-display area with the bend allowance section may not have sufficient room to accommodate testing pads 120_P, especially if connection interfaces for connecting external printed circuits (e.g., COF and/or PCB) are provided in that non-display area. In such cases, the test line 120_C may be routed across the bend allowance section. Further, the test line 120_C may be overlapped by other conductive lines provided in the routing area, and it can cause undesired parasitic capacitance issues.

Figure 8B:
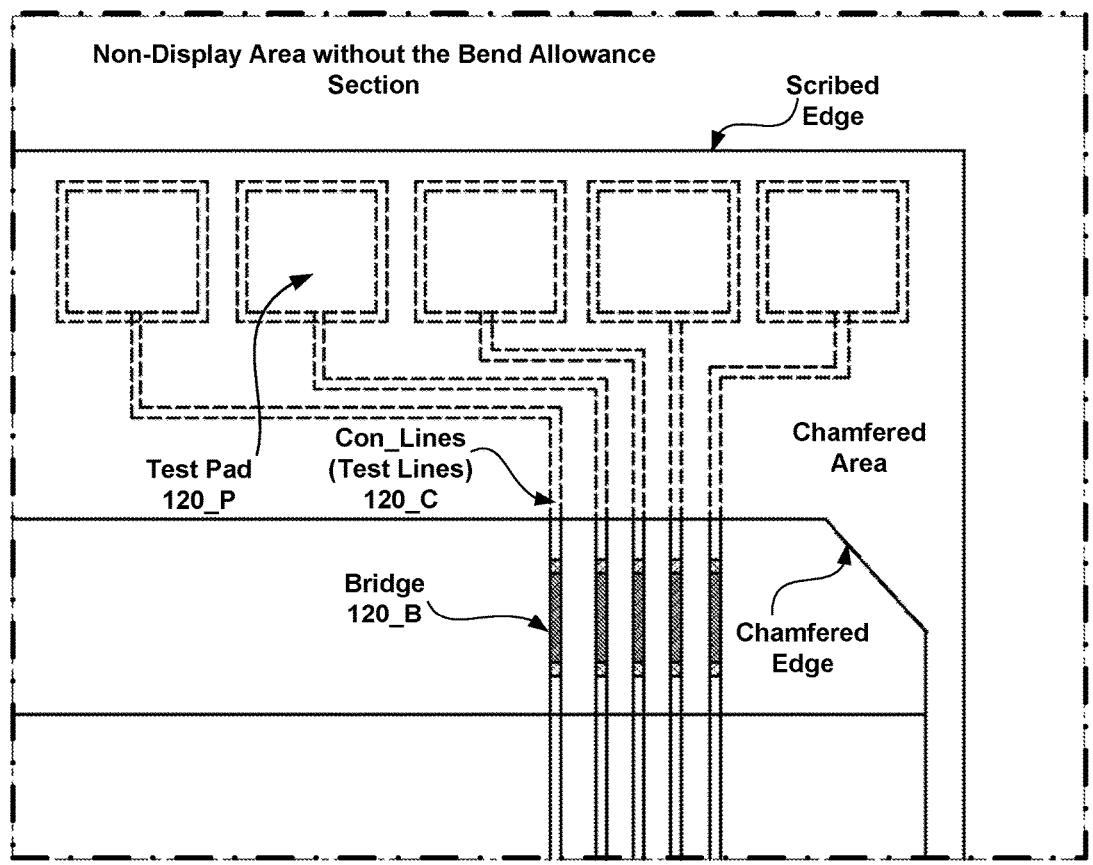
FIG. 8B illustrates exemplary arrangement of bridged conductive lines in a non-display area without a bend allowance section according to embodiments of the present disclosure.

Accordingly, in some other embodiments, the testing pads may be provided in the non-display area other than the ones provided with the connection interfaces for connecting printed circuit. As shown in FIG. 8B, the testing pads 120_P can simply be placed outside the chamfer line of the base layer 106 so that they are removed from the flexible display 100 after the chamfering process.

Regardless of where the testing pads 120_P were placed, the part of the test lines 120_C remaining on the base layer 106 will be extended until the scribed/chamfered edge of the base layer 106, and the exposed surface of the test lines 120_T at the scribed/chamfered edge of the base layer 106 can be highly susceptible to galvanic corrosion.

As mentioned above, corrosion at one point can grow along the conductive line and cause various defects within the flexible display 100. In order to suppress the growing of the corrosion, a bridge structure 120_B can be provided in the conductive line (e.g., the test lines 120_C), which is to be cut by the scribing or chamfering processes during manufacturing of the flexible display 100. More specifically, the conductive line 120_C can include at least two parts. The part of the conductive line extended to the scribed/chamfered edge of the base layer 106 is separated apart from the rest of the conductive line remaining on the base layer 106. These separated conductive line parts are connected by a conductive bridge 120_B, which is arranged to be in contact with each of the separated parts of the conductive line through contact holes in one or more the insulation layer(s).

Before a part of the conductive line on the base layer 106 is cut by the scribing/chamfering processes, signals can be transmitted between the separated conductive line parts via the conductive bridge 120_B. After the part of the conductive line is cut by the scribing/chamfering process, the corrosion which may start from the scribed edge or the chamfered edge is suppressed from growing along the conductive line due to the space between the separated conductive line parts. Although the bridge 120_B is in contact with the separated parts of the conductive line, the bridge 120_B is located in a different layer from the conductive line 120_C, and it hinders the growth of corrosion past the bridge 120_B.

Figure 9A:
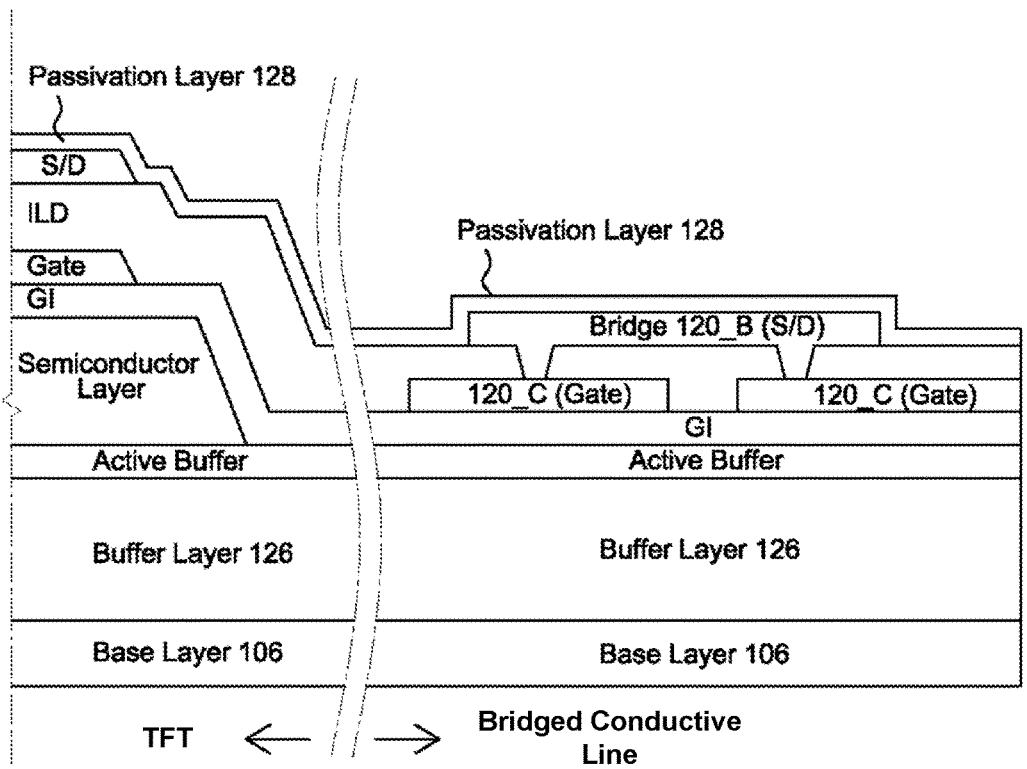
FIG. 9A illustrates a cross-sectional view of an exemplary configuration of bridged conductive lines according to embodiments of the present disclosure.

FIG. 9A illustrates a cross-sectional view of an exemplary embodiment of flexible display 100 provided with bridged conductive lines. In the embodiment shown in FIG. 9A, the separated conductive line parts are provided in the same metal layer as the gate electrode of at least some of the TFTs provided on the base layer 106. Also, the bridge can be provided in the same metal layer as the source/drain electrodes of the TFTs. The interlayer dielectric layer (ILD) between the source/drain electrodes and the gate electrode of the TFTs may also be provided between the bridge 120_B and the separated conductive line parts 120_C, and the bridge 120_C can be in contact with the conductive line parts 120_C via contact holes in the ILD.

The gate insulation (GI) layer provided between the gate electrode and the semiconductor layer of the TFTs may also be provided under the separated parts of the conductive line. Optionally, the buffer layer 126 and the active buffer layer under the semiconductor layer of the TFTs can be provided under the conductive line parts 120_C. The passivation layer 128 on the source/drain electrode of the TFTs can be provided over the bridge 120_B as well. As will be described in further detail below, these insulation layers provided on or below the bridge 120_B and the conductive line parts 120_C can be patterned to suppress crack propagation in the wire traces.

It should be noted that the semiconductor layer as well as some of the insulation layers provided in the TFT area may not be provided in the area where the bridged conductive line is placed. As such, although the separated conductive line parts 120_C and the gate electrode of the TFTs are provided in the same metal layer, they need not be in the same plane level as each other. In other words, the gate electrode of the TFTs and the conductive line parts 120_C can be formed by deposition of the same metal layer, but their plane level may be different by the structure of the layers under the metal layer. Likewise, the bridge 120_B for connecting the separated conductive line parts 120_C and the source/drain electrodes of the TFTs can be provided in the same metal layer, yet be in a different plane level from each other.

Figure 9B:
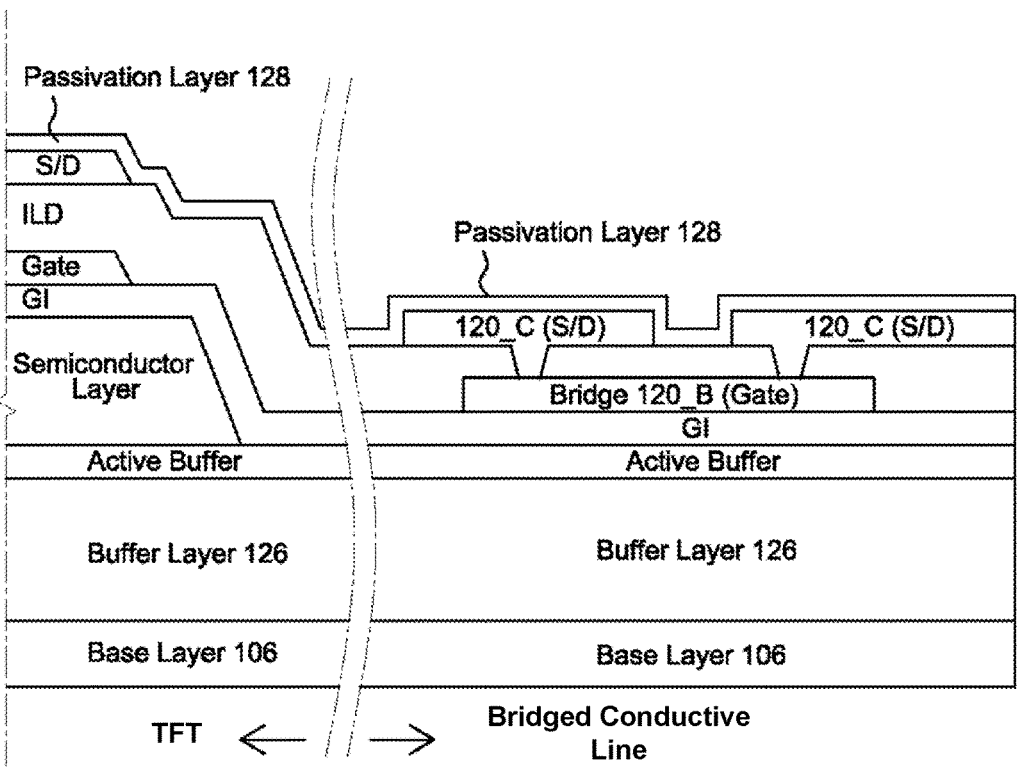
FIG. 9B illustrates a cross-sectional view of an exemplary configuration of bridged conductive lines according to embodiments of the present disclosure.

FIG. 9B is a cross-sectional view illustrating another exemplary embodiment of the flexible display 100 provided with bridged conductive lines. In the embodiment depicted in FIG. 9B, the bridge 120_B is provided under the separated conductive line parts 120_C. More specifically, the bridge 120_B is provided in the same metal layer as the gate electrode of the TFTs in the flexible display 100, and the conductive line parts 120_C are provided in the same metal layer as the source/drain electrodes of the TFT. In this case, each of the separated conductive line parts 120_C will be in contact with the bridge 120_B through the contact holes in the insulation layer between the conductive line parts 120_C and the bridge 120_B positioned thereunder.

In the embodiments depicted in FIGS. 9A and 9B, the metal layers, in which the conductive line parts 120_C and the bridge 120_B are formed in, are described in reference to the metal layers used for providing electrodes of co-planar type TFT. However, it should be noted that the flexible display 100 can include TFTs with staggered and/or inverted staggered structures (i.e., top gated or bottom gated staggered TFTs). Accordingly, metal layers for implementing the separated conductive line parts 102_C and the bridge 120_B may vary based on the stack structure of the TFTs in the flexible display 100. Also, various insulation layers other than the ILD, for instance gate insulation layer, passivation layer, planarization layer and the likes, may be provided in between the separated conductive line parts 120_C and the bridge 120_B based on the structure of the TFTs.

Furthermore, it should be appreciated that the layer for implementing the conductive line parts 120_C and the bridge 120_B are not limited to the layers used for the gate electrode or the source/drain electrodes of the TFTs in the flexible display 100. Any conductive layers in the flexible display 100 may be used to provide the conductive line parts 120_C and the bridge 120_B so long as there is at least one insulation layer between the conductive line parts 120_C and the bridge 120_B. For example, any one of the conductive line parts 120_C and the bridge 120_B may be implemented with an inter-metal layer, which may be used is some of the TFTs in the flexible display 100. Also, a touch sensor may be integrated in the flexible display 100, and the conductive layer for implementing the touch sensor can be used in providing any one of the conductive line parts 120_C and the bridge 120_B in the flexible display 100. In embodiments of the flexible display 100 using oxide TFTs, the metal oxide layer used for providing the active layer of the TFT can be patterned as the conductive line parts 120_C or the bridge 120_B. Post treatment can be performed on the metal oxide layer patterned as the conductive line parts 120_C or the bridge 120_B to obtain a desired conductivity.

Trace Design

A trace design of a conductive line is an important factor, which can affect the conductive line's electrical and mechanical properties. To meet the electrical and mechanical requirements, some portion of a conductive line may be configured differently from another portion of the conductive line. As such, a portion of a conductive line at or near the bend allowance section of the flexible display 100 may be provided with several features for bend stress management.

Bend stress management of the insulation layers near the conductive line is just as important as the managing the strain of the conductive line itself. Various insulation layers, such as the buffer layer 126, the passivation layer 128, a gate insulation layer (GI layer) and an interlayer dielectric layer (ILD layer) positioned below and/or above the conductive line 120 may include a layer of inorganic materials. Layers that are formed of inorganic material, for instance a silicon oxide layer and a silicon nitride layer, are generally more prone to cracks than the metal layers of the conductive line. Even when the conductive lines have a sufficient flexibility to cope with the bend stress without a crack, some of the cracks initiated from the insulation layer can propagate into the conductive lines and create spots of poor electrical contacts in the flexible display 100.

In addition to applying a trace design for reducing bend stress on a conductive line, some of the insulation layers above and/or below the layer of conductive line may be patterned according to the trace design of the conductive line to minimize the chance of cracks. Various insulation layer patterning methods, such as wet etching and/or dry etching processes, can be used to form a trace of insulation layer that corresponds to the trace of a conductive line. Lack of insulation layer, especially the inorganic material based insulation layer around the trace of a conductive line not only lowers the chance of crack generation, but it also cuts off the path for a crack propagation. For convenience of explanation, a trace of conductive line 120 and a trace of insulation layers covering at least some part of the conductive line 120 are collectively referred to as the "wire trace" in the following description.

As mentioned, a trace design for the conductive line and the insulation layer covering the conductive line plays an important role in increasing the robustness of the wire trace. Numerous parameters, ranging from a thickness and a width of a wire trace to a length and a fan-out angle of a wire trace segment with respect to the bending direction of the flexible display 100, are associated with the wire trace design. In addition to the aforementioned parameters, various other parameters regarding the conductive line 120 and the insulation layer trace are specifically tailored based on the placement and the orientation of the wire trace within embodiments of the flexible display 100.

Strain on a wire trace from the bend stress will be greater as the direction in which the wire trace extends is more aligned with the tangent vector of the curvature. In other words, a wire trace will withstand better against the bend stress if the length of a wire trace segment being parallel to the tangent vector of the curvature is reduced. No matter which direction the wire trace is extended to, there will always be a portion in the wire trace that is measurable in the bending direction. However, a length for each continuous measurable portion (i.e., a segment) being aligned parallel to the bending direction can be reduced by employing a strain-reducing trace design in the wire trace.

Figure 10:
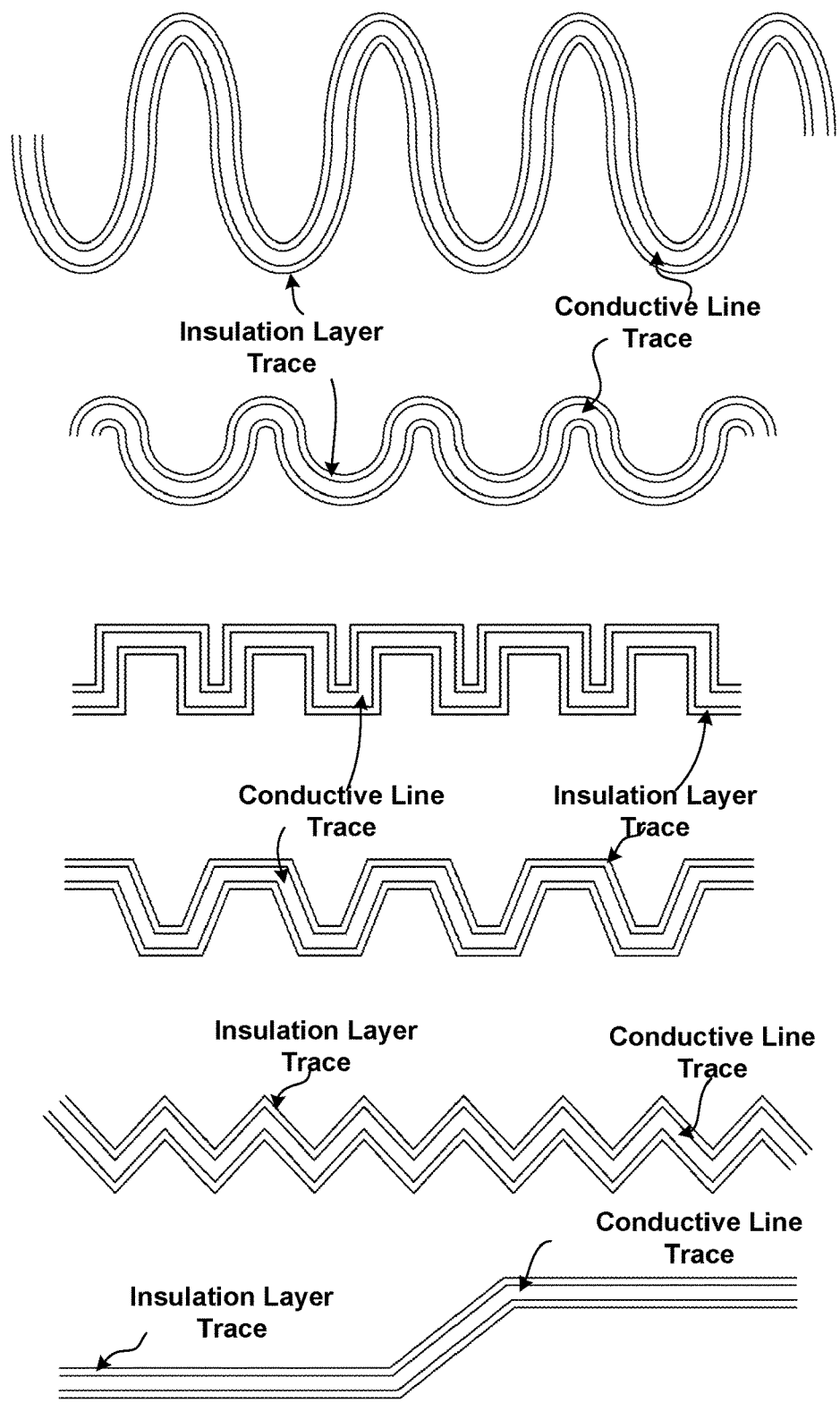
FIG. 10 illustrates schematic view of exemplary non-split strain-reducing trace designs usable for wire traces in a flexible display apparatus according to embodiments of the present disclosure.

FIG. 10 illustrates some of the exemplary strain-reducing trace designs. Any one or more of a sign-wave, a square-wave, a serpentine, a saw-toothed and a slanted line trace designs illustrated in FIG. 10 can be used for wire traces of the flexible display 100. Employing such a strain-reducing trace design increases the portion of the wire trace arranged in a slanted orientation with respect to the tangent vector of the curvature. This, in turn, limits the length of the wire trace segment extending in a straight line parallel to the bending direction.

Since the cracks in the wire trace by bending of the flexible display generally initiate from an inorganic insulation layer, it is imperative that the length of the insulation layer trace being aligned with the tangent vector of the curvature is also minimized. In the single line strain-reducing designs, the width and the shape of the conductive line trace as well as the width of the patterned inorganic insulation layers interfacing with the surface of the conductive line trace should be kept minimal.

The strain-reducing trace designs illustrated in FIG. 10 are merely exemplary, and other trace designs for reducing the length of a wire trace segment parallel to the bending direction may be used in various embodiments of the flexible display 100. Further, it should be noted that some wire traces may adopt different strain-reducing trace design from other wire traces in a flexible display 100 depending on their electrical and/or mechanical requirements. For instance, a strain-reducing trace design used for a data signal line may be different from a strain-reducing trace design used for a power line.

To further improve robustness, a wire trace may employ a trace design in which the wire trace repeatedly splits and converges back in a certain interval. In other words, a wire trace includes at least two sub-traces arranged to form a trace design resembling a chain with a series of connected links. The angles of split and merge define the shape of each link, which allows to limit the length of the wire trace segment measurable in straight line parallel to the bending direction.

Figure 11A:
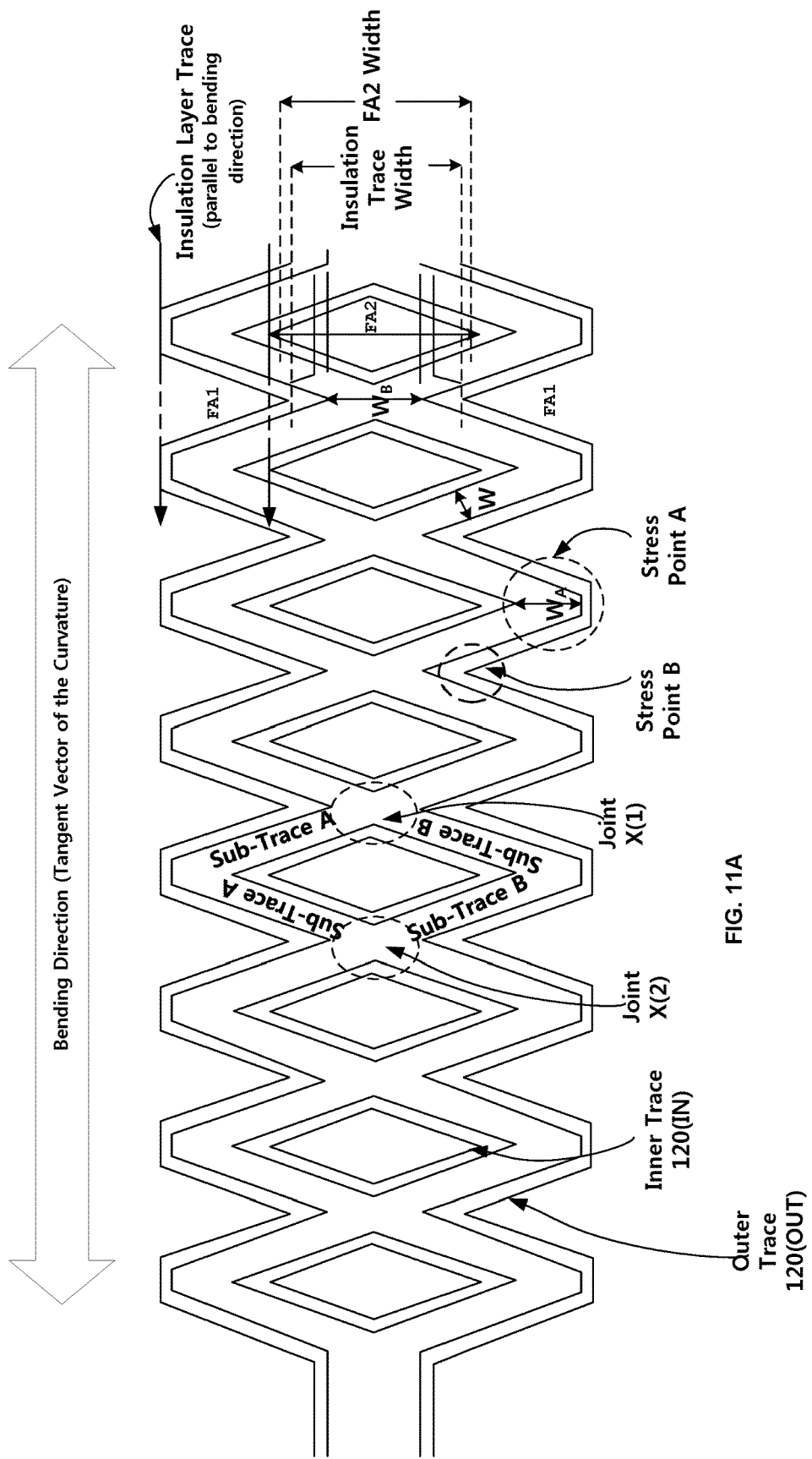
FIGS. 11A and 11B illustrate a schematic view of exemplary strain-reducing wire trace designs having a plurality of sub-traces that split and merge at a certain interval according to embodiments of the present disclosure.

Referring to FIG. 11A, the conductive line 120 includes sub-trace A and sub-trace B, which are split away from each other and merge back at each joint X. Between the first joint X(1) and the second joint X(2), a part of the sub-trace A is extended for a predetermined distance in a first direction angled away from the tangent vector of the curvature, and another part of the sub-trace A is extended in a second direction. The sub-trace B is arranged in a similar manner as the sub-trace A, but in a mirrored orientation in reference to the tangent vector of the curvature. The distances and directions in which the sub-traces are arranged between the two adjacent joints X define the shape and the size of the link in the chain as well as the open area surrounded by the sub-traces. In this example, the shape of the conductive line 120 between the joint X(1) and X(2) (i.e., link) has a diamond shape with an open area surrounded by the sub-trace A and the sub-trace B. With additional joints X, the conductive line 120 forms a chain of diamond shaped links, and thus the trace design may be referred to as the diamond trace design.

Compare to the non-split strain-reducing trace designs shown in FIG. 10, the strain-reducing trace design shown in FIG. 11A can provide significant advantages in terms of electrical property. For instance, the wire trace provided with the split/merge trace design can provide much lower electrical resistance than the wire traces employing the mountain trace design, the sign-wave trace designs or other single line strain-reducing trace designs of FIG. 10. In addition, sub-traces can serve as a backup electrical pathway in case one of the sub-traces is damaged or severed by cracks.

The insulation layers covering the surfaces of the conductive line 120 is also patterned in a trace design corresponding to the trace design of the conductive line 120. As such, the open area surrounded by the sub-trace A and the sub-trace B is free of the inorganic insulation layer(s), or has thinner inorganic insulation layer(s) than the areas under and/or above the trace of conductive line 120. As such, the length of the insulation layer trace measurable in straight line parallel to the bending direction can be limited to reduce the chance of crack initiation and propagation.

Various additional factors must be considered for the strain-reducing trace designs based on a plurality of sub-traces. The split/merge angles and the length of each sub-traces between two adjacent joints X should provide an offset for the inorganic insulation layer at the joints X and at the outer corners where the sub-trace changes its direction between two adjacent joints X. To put it in another way, the open area, which is surrounded by the split sub-traces between two joints X of the wire trace, should have a size and a shape to minimize the length in which an inorganic insulation layer trace of the wire trace extending parallel to the bending direction.

In the diamond trace design depicted in FIG. 11A, the buffer layer 126 and the passivation layer 128 covering the trace of the conductive line 120 are patterned with a predetermined margin from the outer trace (i.e., outer edge) of the conductive line 120. Other than the insulation layers with the predetermined margin remaining to cover the conductive line 120, the open area surrounded by the sub-traces A and B, which is denoted as FA2, is free of the insulation layers. As such, a trace of insulation layers is formed in accordance with the trace design of the conductive line 120. The length of the open area without the insulation layers measured in orthogonal direction from the bending direction is greater than the width of the inorganic insulation layer trace at the joint X measured in the same direction. In this setting, the open area FA2 surrounded by the sub-traces A and B as well as the area next to the joint X can be free of the inorganic insulation layers, or otherwise provided with a reduced number of inorganic insulation layers.

Referring to FIG. 11A, the insulation layer free area FA1 prohibits the insulation layer of the sub-trace A and the sub-trace B between the two joints X(1) and X(2) to be extended in a continuous straight line. Similarly, the insulation layer free area FA2 prohibits the insulation layer between the two joints X(1) and X(2) to be extended in a continuous straight line. Accordingly, the length of each segment of the insulation layer trace being aligned to the tangent vector of the curvature is minimized.

Further reduction in the length of the insulation layer trace aligned to the tangent vector of the curvature can be obtained by reducing the width of the conductive line 120 and the margin of the insulation layer beyond the edge of conductive line 120. It should be noted that the amount of reduction in the width of conductive line 120 is limited with the single line strain-reducing trace designs depicted in FIG. 10 because the reduction of conductive line width can make its electrical resistance too high for its particular use within the flexible display 100. With the split/merge trace design of FIG. 11A, however, the width of the conductive line 120 and the insulation layer trace can be reduced while providing sufficient electrical property.

Greater split/merge angle of the sub-traces with respect to the bending direction may allow to reduce the lengths of the conductive line 120 and the insulation layer trace extending along the tangent vector of the curvature to a greater extent. Accordingly, a lower chance of crack initiation may be afforded in the wire trace by selectively increasing the split/merge angle of sub-traces at high bend stress regions.

It should be noted that the split angle of the sub-traces can affect the distance between the two adjacent joints X in the diamond trace design. The distance between the joints X need not be uniform throughout the entire wire trace. The intervals at which the trace splits and merges can vary within a single trace of wire based on the level of bend stress exerted on the parts of the wire trace. The distance between the joints X may be progressively shortened down for the parts of the wire trace towards the area of the flexible display 100 subjected to higher bend stress (e.g., area having smaller bend radius, area having larger bend angle). Conversely, the distances between the joints X can progressively widen out towards the area subjected to lower bend stress.

Even with the strain-reducing trace design, the inevitable bend stress remains at certain points of the trace (i.e., stress point). The location of stress point is largely dependent on the shape of the trace as well as the bending direction. It follows that, for a given bending direction, the wire trace can be designed such that the remaining bend stress would concentrate at the desired parts of the wire trace. Knowing the location of the stress point in the wire trace, a crack resistance area can be provided to the stress point to make the wire trace last longer against the bend stress.

Referring back to FIG. 11A, when a wire trace having the diamond trace design is bent in the bending direction, the bend stress tends to focus at the angled corners (i.e., the vertexes of each diamond shaped link), which are denoted as the stress point A and stress point B. As such, cracks tend to initiate and grow between the inner and outer edges of the wire trace. For instance, at the stress points A, a crack may initiate from the inner trace line 120(IN) and grow toward the outer trace line 120(OUT). Similarly, a crack may initiate from the outer wire trace line 120(OUT) and grow toward the inner trace line 120(IN) at the stress points B.

Accordingly, the width of the conductive line 120 at the stress points A can be selectively increased to serve as the crack resistance area. As depicted in FIG. 11A, the widths ($W_A$, $W_B$) of the conductive line 120 at the stress points A and B, which are measured in the direction perpendicular to the bending direction, may be longer than the width (W) of the conductive line 120 at the parts between the stress points A and B. The extra width at the stress points can make the conductive line 120 hold out longer before a complete severance in the conductive line 120 occurs by the growth of a crack at the stress points.

It should be reminded that the length for the continuous portion of the insulation layer trace being aligned to the bending direction should be kept minimal. Increasing the width of the conductive line 120 at the stress points A and B may necessitate increase in the width of the insulation layer trace at the respective area, which results in lengthening the insulation layer trace being aligned parallel to the bending direction.

Accordingly, in some embodiments, the width of the conductive line 120 measured in the direction perpendicular to the tangent vector of the curvature at the stress points A ranges from about 2.5 um to about 8 um, more preferably, from about 3.5 um to about 6 um, more preferably from about 4.5 um to about 8.5 um, and more preferably at about 4.0 um. The width of the conductive line 120 at the stress points B should also be maintained in the similar manner as the width of the conductive line 120 at the stress points A. As such, the width of the conductive line 120 at the stress points B may range from about 2.5 um to about 8 um, more preferably, from about 3.5 um to about 6 um, more preferably from about 4.5 um to about 8.5 um, and more preferably at about 4.0 um. Since the sub-trace A and the sub-trace B merges at the stress point B, the width of the conductive line 120 at the stress points B may be longer than width at the stress points A.

In some embodiments, one of the inner trace line 120(IN) and the outer trace line 120(OUT) may not be as sharply angled as the other trace line at the stress points A to minimize the chance of crack initiating from both sides. In the embodiment depicted in FIG. 11A, the inner trace line 120(IN) is more sharply angled than the outer trace line 120(OUT) at the stress points A. However, in some other embodiments, the outer trace line 120(OUT) may be more sharply angled than the inner trace line 120(IN) at the stress points A. In both cases, the less sharply angled trace line can simply be more rounded rather than being a straight line as the outer trace line 120(OUT) depicted in FIG. 11A. Further, both the inner trace line 120(IN) and the outer trace line 120(OUT) at the stress points A can be rounded.

Figure 11B:
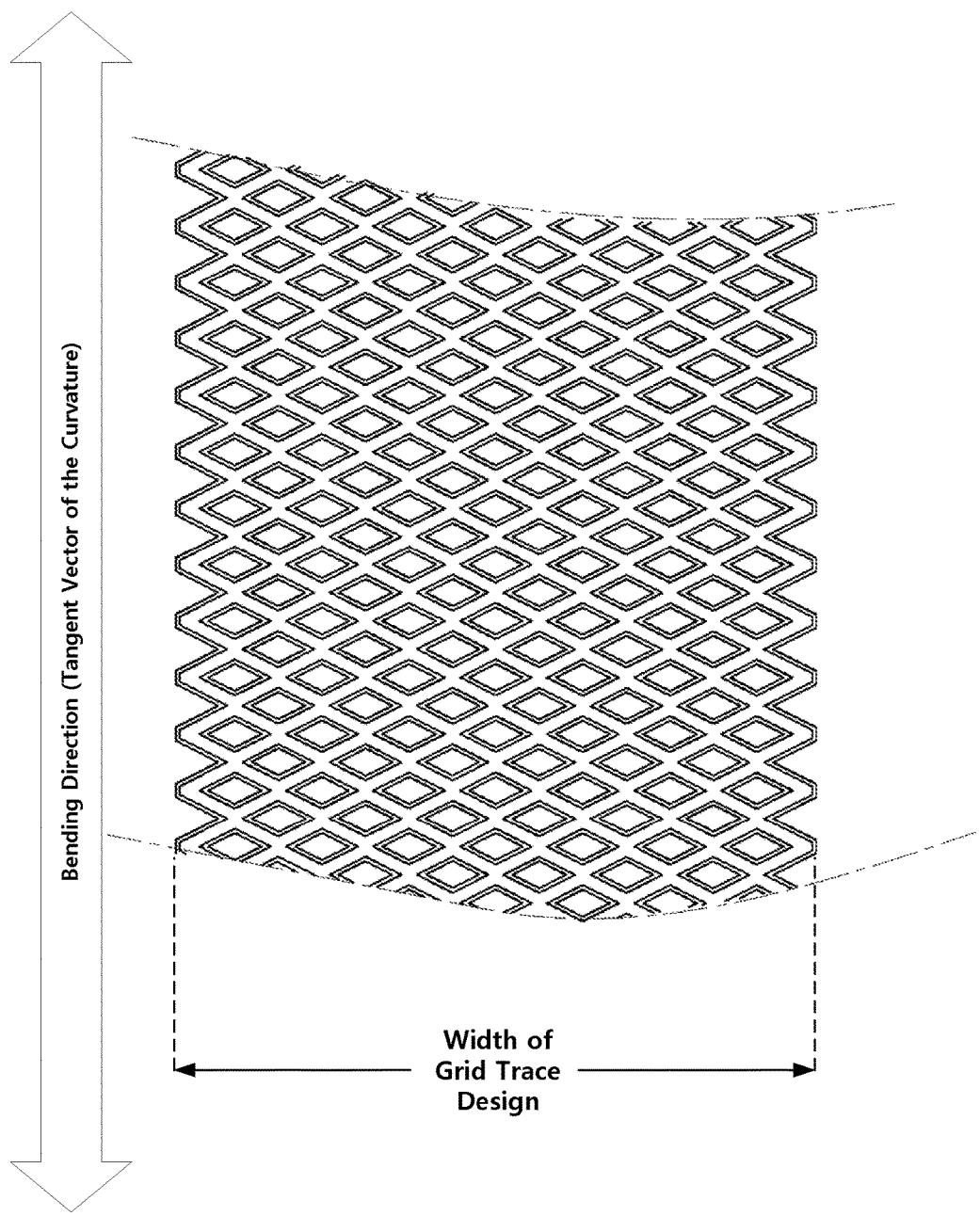

The wire trace may split into additional number of sub-traces, resulting series of links arranged in a grid-like configuration. As an example, a wire trace can be configured as a web of diamond trace shapes as illustrated in FIG. 11B. Such a trace design is particularly useful for a wire trace that transmit a common signal to multiple points or for a wire trace that require a very low electrical resistance. For example, a VSS line and a VDD line in the flexible display 100 may have the grid-like trace design, especially if such lines are arranged to cross over a bend allowance section. Neither the number of sub-traces nor the shapes of the sub-traces of the grid-like trace design are particularly limited as the exemplary design depicted in FIG. 11B.

In some embodiments, the grid width can be reduced or increased in between two ends within the flexible display 100. Also, the grid-like wire trace shown in FIG. 11B can converge back to form the diamond trace shown in FIG. 11A or to form a non-split strain-reducing trace design shown in FIG. 10. In some cases, the size of each diamond-shaped trace of a grid-like wire trace may be larger than the size of each diamond-shaped trace of a diamond-chain trace to reduce the resistance.

Wire Trace Arrangement

Due to the portions angled away from the bending direction, a wire trace with a strain-reducing trace design may necessitate a larger routing area within the flexible display 100. In embodiments where a non-display area at the edge of the flexible display 100 is bent, the increase in the routing area for accommodating the wire traces can actually increase the size of the inactive area to be hidden under a masking.

Accordingly, wire traces applied with a strain-reducing trace design may be arranged to facilitate tight spacing between adjacent wire traces. For instance, two adjacent wire traces with a strain-reducing trace design may each include a non-linear section, which would have a convex side and a concave side. The two adjacent wire traces can be arranged in the flexible display such that the convex side of the non-linear section in the first wire trace is positioned next to the concave side the non-linear section in the second wire trace. Since the spacing between the two adjacent wire traces is limited by the shape and the size of the wire traces, the non-linear section in the strain-reducing trace design of the first wire trace may be larger than the non-linear section in the strain-reducing trace design of the second wire trace. Of course, one of the first wire trace and the second wire trace may have a different strain-reducing trace design to better accommodate the non-linear section of the other wire trace.

In some instances, two or more wire traces arranged next to each other may each be applied with a strain-reducing trace design, and each of the wire traces may have a plurality of indented sections and distended. In such cases, the wire traces can be arranged such that the distended section of one of the wire traces to be positioned next to the indented sections of the adjacent wire trace.

Figure 12:
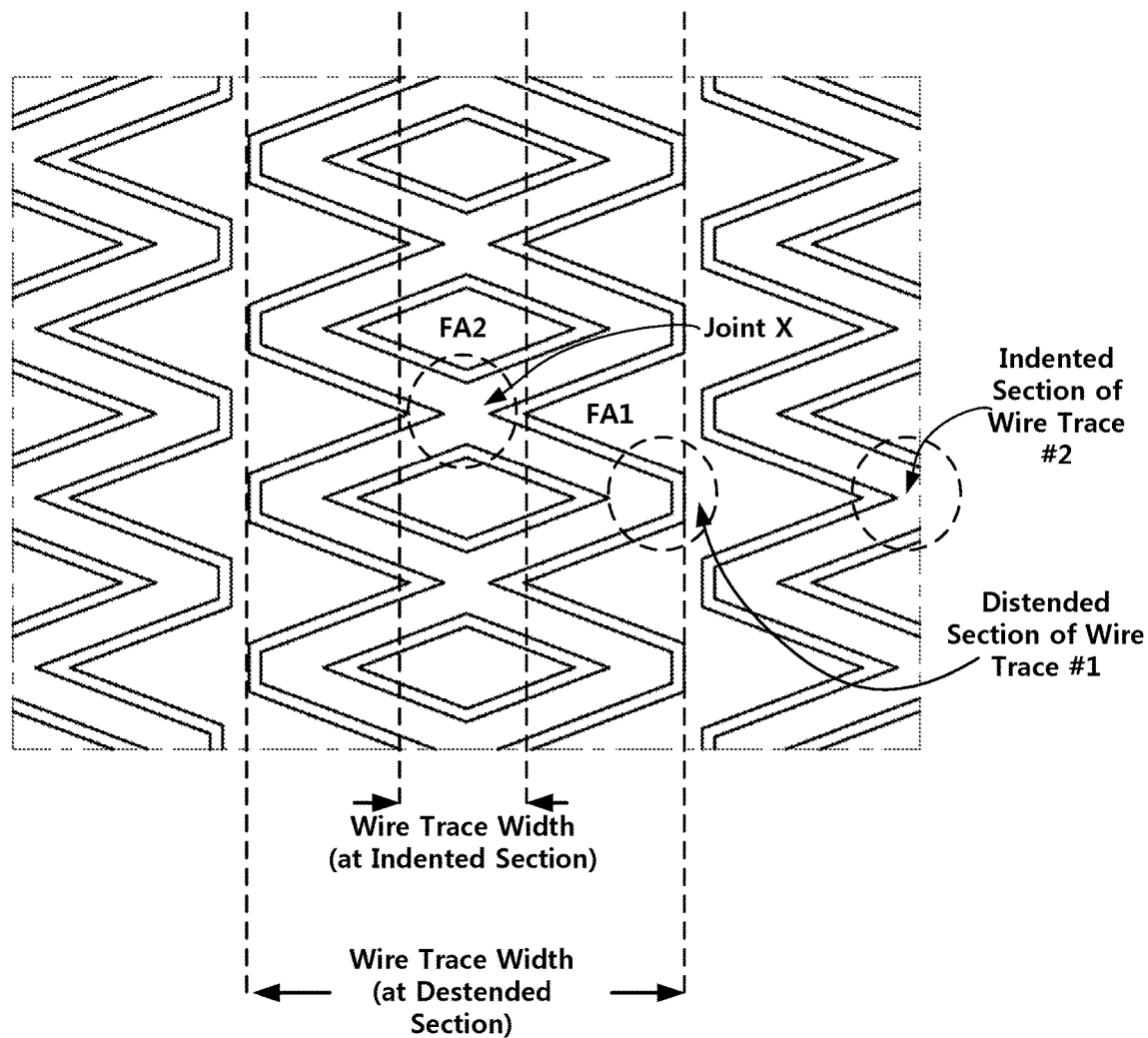
FIG. 12 illustrates an exemplary arrangement of the wire traces including indented sections and distended sections.

FIG. 12 illustrates an exemplary arrangement of multiple wire traces, each having the diamond trace design described above. The split of the sub-traces widens the layout of the wire trace to create the distended section, whereas merging of the sub-traces narrows the layout of the wire trace to create the indented section. Accordingly, in terms of its layout, the indented section of the wire trace is at the joint X, whereas the distended section of the wire trace is at the point where the split/merge angles of the sub-traces change between two adjacent joints X.

As shown in FIG. 12, position of the joints X in a first wire trace and the joints X in a second wire trace are arranged in a staggered configuration. In this arrangement, the vertexes of the diamond shaped link at the distended section in the first wire trace are positioned next to the joints X at the indented sections of the adjacent wire traces. Such a staggered arrangement of the wire traces may help in lowering the electrical noises on the wire traces due to close proximity between the wire traces, and thus the distance between the wire traces can be reduced. Even a tight spacing between the wire traces may be possible by arranging the distended section of a wire trace to be positioned closer toward the indented section of the adjacent wire trace. For instance, the vertexes at the wide parts of one wire race can be placed in the open area FA1, which is created by the split/merge angle and the length of the sub-trace in the adjacent wire trace. As such, the staggered arrangement allows to maintain certain minimal distance between the wire traces while reducing the amount of space taken up by the wire traces.

Patterned Insulation Layer

As mentioned, it should be noted that cracks primarily initiate from the inorganic insulation layers. Accordingly, propagation of cracks can be suppressed by selectively removing inorganic insulation layers from the areas prone to cracks. To achieve this, one or more inorganic insulation layers and/or stack of insulation layers including a layer of inorganic material can be selectively etched away at various parts of the flexible display 100.

For example, the insulation layer under the conductive line 120 can be etched away. The insulation layer under the conductive line 120 may be the buffer layer 126, which may include one or more layers of inorganic material layers. The buffer layer 126 may be formed of one or more layers of a $SiN_x$ layer and a $SiO_2$ layer. In one suitable configuration, the buffer layer 126 may be formed of alternating stacks of a $SiN_x$ layer and a $SiO_2$ layer. The buffer layer 126 is disposed on the base layer 126, but under the TFT.

To facilitate easier bending of the flexible display 100, a part of the buffer layer 126 may etched away in the bend portion of the flexible display 100. Accordingly, the buffer layer 126 formed on the substantially flat portion of the base layer 106 may be thicker than the buffer layer 126 over the bend portion of the base layer 106. When the buffer layer 126 is formed in a stack of multiple sub-layers, the buffer layer 126 in the substantially flat portion of the flexible display 100 may include one or more additional sub-layers than the buffer layer in the bend portion of the flexible display 100.

For example, the buffer layer 126 in the substantially flat portion may include multiple stacks of a $SiN_x$ layer and a $SiO_2$ layer, and the buffer layer 126 in the bend portion includes a single stack of a $SiN_x$ layer and a $SiO_2$ layer. It is also possible to have only a single layer of either a $SiN_x$ layer or a $SiO_2$ layer in some part of the bend portion. In one suitable configuration, each $SiN_x$ layer and $SiO_2$ layer in the buffer layer 126 may have a thickness of about 1000 Å. As such, the thickness of the buffer layer 126 in the bend portion of the flexible display may range from about 100 Å to about 2000 Å.

In the substantially flat portion of the flexible display 100, additional layer of inorganic layer may be provided immediately below the semiconductor layer of the TFT, which may be referred to as the active buffer. In some embodiments, an inorganic layer, which is most closely positioned under the active layer of the TFT, may be much thicker than the individual inorganic layers of the buffer layer 126.

The buffer layer 126 in the bend allowance section may be etched even further to expose the base layer 106 while leaving the buffer layer 126 intact under the conductive line 120. In other words, a recessed area and a protruded area are provided in the bend portion of the flexible display 100. The protruded area includes the buffer layer 126 provided on the base layer 106, whereas the recessed area has the base layer 106 exposed without the buffer layer 126 disposed thereon.

Figure 13A:
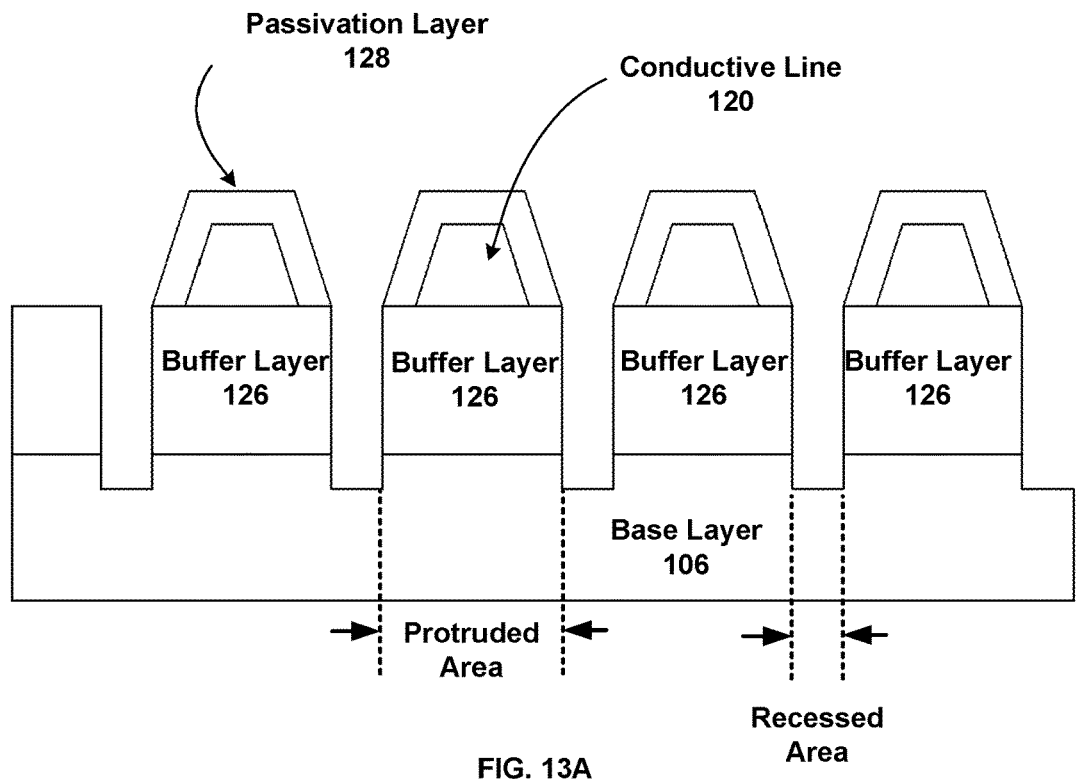
FIGS. 13A and 13B illustrate schematic cross-sectional views of exemplary trace designs usable for wire traces in a flexible display apparatus according to embodiments of the present disclosure.

In one exemplary configuration shown in FIG. 13A, the conductive line 120 is positioned on the protruded area, and the passivation layer 128 is positioned over the conductive line 120 on the protruded area. Although the passivation layer 128 may be temporarily deposited over the recessed area, the passivation layer 128 can be removed from the recessed area by a dry etch or a wet etch process. As such, the recessed area can be substantially free of the passivation layer 128. When etching the passivation layer 128 from the recessed area, part of the base layer 106 can be etched as well. Accordingly, the thickness of the base layer 106 at the recessed area can be lower than that of the base layer 106 elsewhere in the flexible display 100. When the buffer layer 126 is etched away as shown in FIG. 13A, propagation of crack from one part of the buffer 126 to another part of the buffer layer 126 can be hindered by the space in the recessed area. Similarly, propagation of cracks by the passivation layer 128 is also hindered by the space of the recessed area. Accordingly, damage to the conductive line 120 by propagation of cracks can be reduced.

Figure 13B:
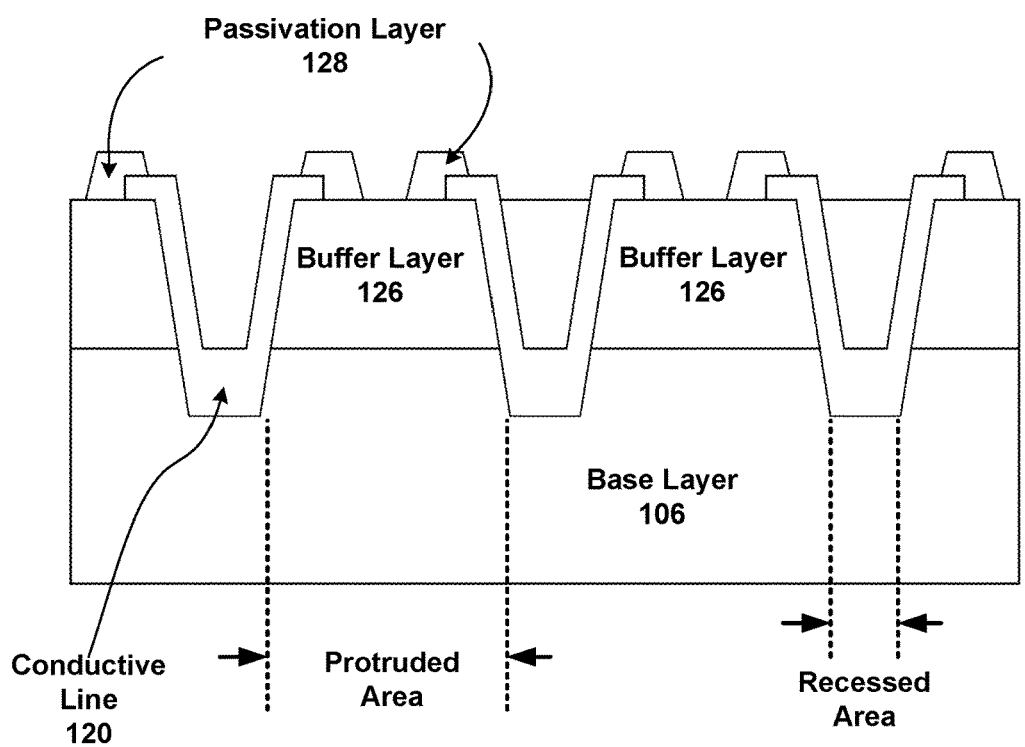

In another suitable configuration shown in FIG. 13B, the recessed area includes the base layer 106 that is etched to a certain depth, and the conductive line 120 is deposited on the base layer 106 of the recessed area. In this setting, the portion of the conductive line 120 is disposed within the base layer 106. Some part of the conductive line 120 is also deposited on a part of the buffer layer 126 that provides the protruded area. A passivation layer 128 can be deposited over the conductive line 120, and then etched away from the recessed area to expose the conductive line 120 in the recessed area.

Accordingly, the passivation layer 128 remains on the conductive line 120 positioned on the protruded area. In this configuration, the passivation layer 128 remaining on the buffer layer 126 can inhibit galvanic corrosion as it covers the cross-sectional side surface of the multi-layered conductive line 120. While cracks generated from the buffer layer 126 may penetrate to the conductive line 120 on the wall of hollow space in the buffer layer 126, but reaching the part of the conductive line 120 positioned within the base layer 106 will be difficult.

When the conductive line 120 has the multi-layered structure discussed above, the part of the conductive line 120 in the recessed area needs not be covered by the passivation layer 128. With the passivation layer 128 removed from the surface of the conductive line 120 in the recessed area, crack propagation from the passivation layer 128 can also be prevented. Further, galvanic corrosion generally starts from the edge of the conductive line 120 on the buffer layer, and thus the passivation layer 128 covering the edge of the conductive line 120 on the buffer 126 may not be needed if the distance between the conductive line 120 on the buffer layer 126 and the conductive line 120 in the base layer 106 is sufficiently spaced apart from each other. The configurations shown in FIGS. 13A and 13B may be used for the wire traces in the bend allowance section with the strain-reducing trace patterns of FIGS. 10, 11A and 11B. In addition to the bend allowance section, in some embodiments, the patterned insulation layer may also be provided in the routing area between the active area and the bend allowance section as well as the routing area between the COF bonding area and the bend allowance section.

Further, the patterned insulation layer described above can be provided in the active area. However, removal of inorganic insulation layers near the TFTs of the flexible display 100 may affect the electrical characteristic of components in the flexible display 100. For instance, undesired threshold voltage shift of TFTs may result when some part of the buffer layer 126 is removed. In order to maintain the stability of the TFTs, an additional shield metal layer can be formed under the semiconductor layer of the TFTs. The shield metal layer may be under the buffer layer 126 or interposed between the inorganic layers of the buffer layer 126. In some embodiments, the shield metal layer may be electrically connected to the source electrode or gate electrode of the TFTs.

In addition to the patterning of insulation layers in various parts of the flexible display 100, other structural elements can be removed or simplified in some areas of the flexible display 100 to facilitate bending. For example, the touch sensor layer 112, the polarization layer 110 and the likes may be absent in the bend area of the flexible display 100. Absence or simplification of these components and the layers would create a number of uneven surfaces where the wire trace may need to cross.

When a wire trace is laid over such an uneven surface, some parts of the wire trace may be placed on a different plane level from another parts of the wire trace. As the parts are on different plane levels, the amount and direction of bend stress and the strain resulting from the bend stress can differ even among the parts of the wire trace. To accommodate the difference, a strain-reducing trace design for the wire traces can include a modified trace design for the portion of the wire trace on the uneven surfaces.

Figure 14A:
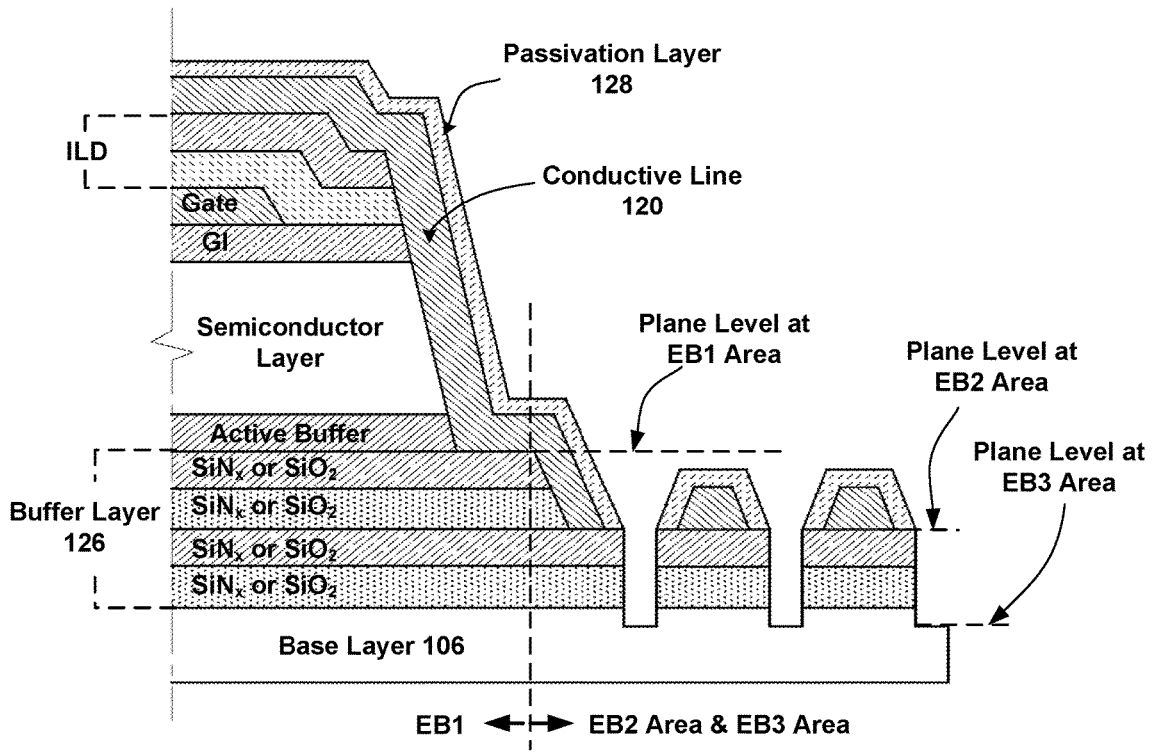
FIGS. 14A and 14B illustrate schematic views of an exemplary strain-reducing wire trace design with modified portions adopted for the wire trace to extend across the areas with different plane levels within the flexible display according to embodiments of the present disclosure.

FIG. 14A is an enlarged cross-sectional view showing an exemplary backplane configuration for a flexible display 100, in which several insulation layers are removed from the bend portion to facilitate more reliable bending.

Several organic and inorganic layers may be formed in between the base layer 106 and the OLED element layer 102. In this particular example, alternating stacks of $SiN_x$ and $SiO_2$ layers can be disposed on the base layer 106 to serve as the buffer layer 126. The semiconductor layer of a TFT may be sandwiched by an active-buffer layer and a gate insulation layer that are formed of $SiO_2$ layer. The gate of the TFT is disposed on an interlayer dielectric layer (ILD), and the source/drain of the TFT having the multi-layered structure as discussed above is sandwiched between the ILD and a passivation layer. Here, the ILD may be formed of a stack of $SiN_x$ and $SiO_2$, and the passivation layer is formed of $SiN_x$. Then, a planarization layer is disposed over the passivation layer so that the anode for the OLED can be disposed thereon.

As mentioned above, use of the strain-reducing trace design is not just limited to the part of the wire traces within the bend portion. Also, the strain-reducing trace design can be applied to the part of the wire traces in the routing areas outside the bend allowance section. Using the strain-reducing trace design for the wire trace in such routing area can afford increased protection to the wire trace against the bend stress.

In the routing area, however, several layers of organic and/or inorganic material layers between the base layer 106 and the OLED element layer 102 may be absent to facilitate bending of the flexible display 100. Such organic and/or inorganic layers, including but not limited to the ILD, the gate insulation layer, buffer layer, passivation layer, planarization layer, etc. may not be present in the bend portion of the flexible display 100. Some of these layers may have been removed from the area by several etching processes.

Figure 16A:
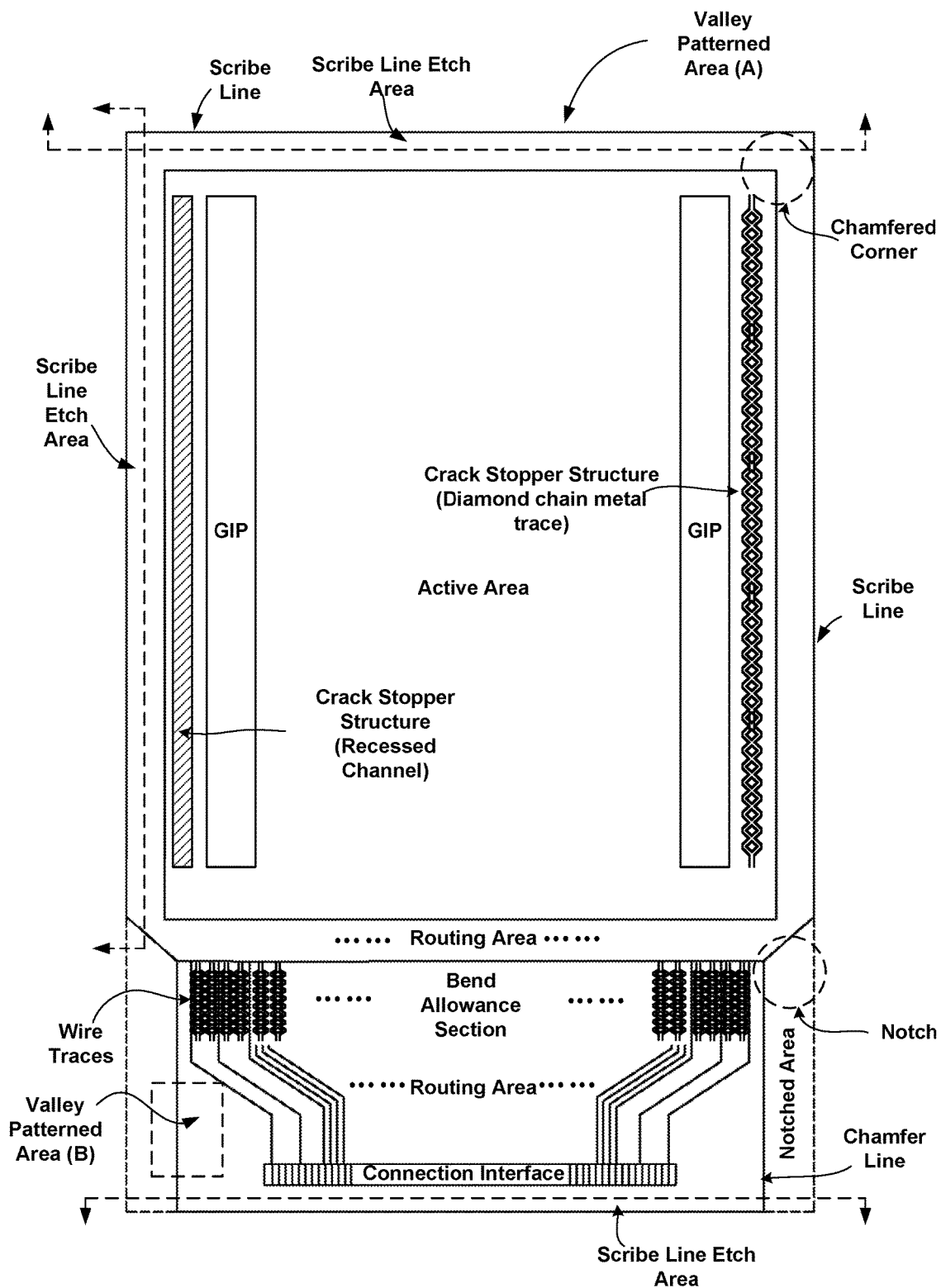
FIG. 16A illustrates a schematic view of an exemplary configuration for the crack stopper structures according to an embodiment of the present disclosure.

By way of example, several insulation layers on the buffer layer 126 may be etched by a first etch process EB1, which is followed by the second etch process EB2 that etches away the active buffer and a part of the buffer layer 126 (e.g., a stack of a $SiN_x$ layer and a $SiO_2$ layer). These etching processes create multiple stepped regions as shown in FIG. 16A, with one or more of vertically sloped surfaces and horizontally leveled surfaces, where the wire trace is disposed thereon. The wire trace laid over the vertically sloped surfaces and horizontally leveled surfaces would have several bent spots, such as EB1 area and EB2 area.

When bending the flexible display 100 in the bending direction, the wire trace may experience more strain at or near the stepped region. Numerous tests and experiments indicate that the chance of a crack is especially high in the wire trace crossing over the stepped region between the EB1 area and the EB2 area. Accordingly, in some embodiments, the strain-reducing trace design for the wire trace has a reinforced portion at or near the stepped region between a high-leveled surface and a low-leveled surface provided by insulation layers of the flexible display.

Figure 14B:
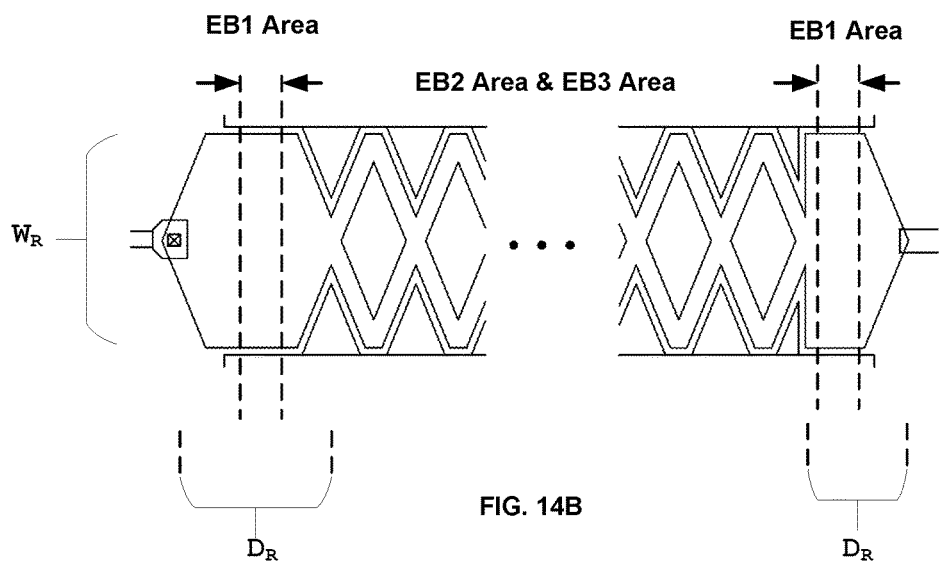

In the example shown in FIG. 14B, the wire trace has a simple straight line trace at its both ends. However, the part of the conductive line 120 that crosses over the bent areas EB1 and EB2 is reinforced with a modified trace design. At the modified portion, the conductive line 120 is provided with a wider width extra width $W_R$ to ensure the preservation of the conductive line 120 even if cracks initiate from the insulation layer near EB1 and EB2 areas. The distance $D_R$ in which the conductive line 120 is provided with the modified trace design depends on the thickness of the insulation layers etched by the etch processes as well as the distance between the first leveled surface (e.g., plane level at EB1) and a second leveled surface (e.g., plane level at EB2).

Past the modified portion (i.e., reinforced portion), the wire trace is illustrated as having the strain-reducing trace design (i.e., diamond trace design), which is previously described with FIG. 11A. It should be appreciated that the strain-reducing trace design of the wire trace applied with the modified portion is not limited to the strain-reducing trace design depicted in FIG. 14B. Various embodiments of the strain-reducing trace design can include a modified trace design for the portion of the wire trace corresponding to the stepped areas of two differently leveled surfaces.

While this may not always be the case, the routing areas adjacent to the bend allowance section may be the substantially flat portions of the flexible display 100. In such cases, the EB1 and EB2 areas would be positioned at or just outside start of the bend allowance section in the bend portion, and the wire trace may be provided with the reinforced portion in its trace design.

The increased width $W_R$ of the reinforced conductive line portion may serve its purpose well at or near the beginning and the end of the bend allowance section where the curvature is relatively small. The wider width $W_R$ of the wire trace and the length in which the modified trace portion is applied in the wire trace can increase the length of the wire trace that is aligned parallel to the bending direction. This would make the wire trace harder to hold out against the bend stress at the region with greater bend radius.

For this reason, the distance $D_R$ in which the reinforced portion is should be limited such that the reinforced conductive line portion does not extend too much toward the bend allowance section. Accordingly, the distance $D_R$ of the reinforced conductive line portion may be limited such that the trace design of the reinforced conductive line portion does not extend beyond the bend allowance section where it is bent more than a predetermined threshold bend angle. By way of an example, the reinforced conductive line portion may not extend beyond the point where it is 30° curved away from the tangent plane of the curvature. The threshold bend angle may be less than 20°, for example 10°, and more preferably less than 7°.

The wire trace, which is provided with the reinforced portion at the stepped areas, may extend across the bend allowance section and routed to pads for COF or other components of the flexible display 100. In such instances, additional stepped region (similar to EB1 and EB2) may exist at or near the opposite end of the bend allowance section. The conductive line at or near such bent spots may be reinforced in the similar manner as the modified portion of the wire trace at the opposite end as shown in FIG. 14B. If desired, the reinforced conductive line portion at or near the stepped regions at the opposite ends of the bend allowance section may have a different shape as depicted in FIG. 14B.

Figure 15A:
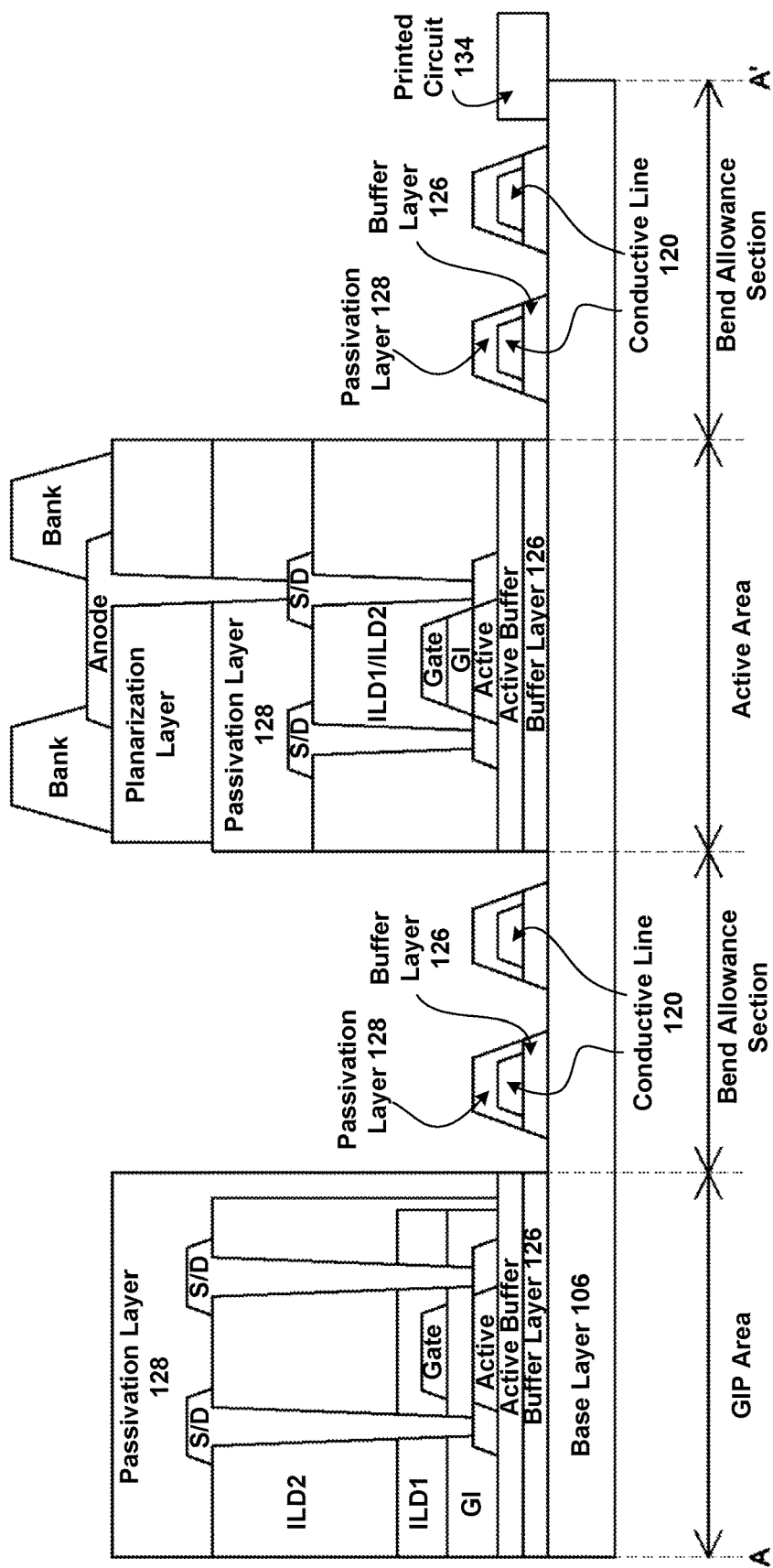
FIG. 15A is a schematic cross-sectional view of an embodiment of a flexible display cut along the line A-A' of FIG. 1.
Figure 15B:
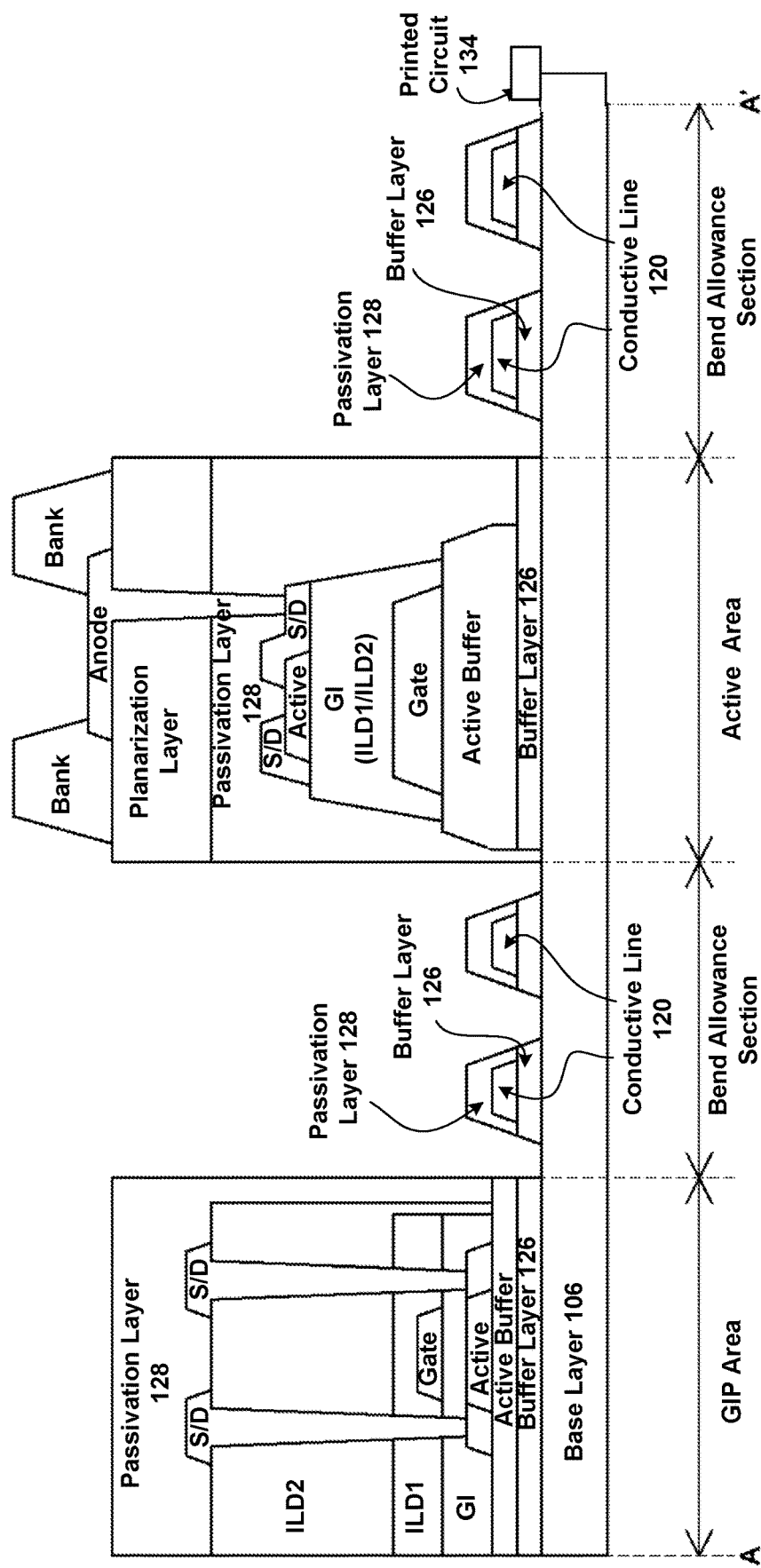
FIG. 15B is a schematic cross-sectional view of an embodiment of a flexible display cut along the line A-A' of FIG. 1.

FIGS. 15A and 15B, each shows a cross-sectional view of a flexible display along the line A-A' marked in FIG. 1, according to an embodiment of the present disclosure. The configurations shown in FIGS. 15A and 15B may be representing the examples in which the gate-in-panel (GIP) circuit and the external printed circuit are provided on a different side from each other. For instance, the GIP may be at the left and/or the right side of the central active area, and the external printed circuit may be at the top side and/or the bottom side of the central active area.

As mentioned above, the bend line of the flexible display 100 can be provided, not just top and bottom edges, but also at the side edges of the flexible display 100. Accordingly, the inactive areas with the GIP circuit can be the bend portions of the flexible display 100. In this case, the part of the base layer 106 where the GIP is disposed on is curved away from the plane of the part of the base layer 106 where the active area is provided therein. In other words, there is a bend allowance section provided between the GIP area and the active area. The bend allowance section between the GIP area and the active area may be configured in a similar way as the bend allowance section between the active area and the inactive area where the external printed circuit is attached thereto.

For instance, at least some of the conductive lines extending from the GIP circuit to the active area may have the strain-reducing trace design described in the present disclosure. (i.e., the strain-reducing trace designs depicted in FIGS. 10, 11A-11B, 14A-14B and 20) In particular, a conductive line in the bend allowance section connecting a scan out terminal of a shift register's stage to the corresponding gate line in the active area may be applied with any one of the strain-reducing trace designs discussed in the present disclosure and other relevant features associated with the applied strain-reducing trace design.

Also, similar to the patterned insulation layers discussed above, the insulation layers provided below and/or above the conductive line, especially the ones that are formed of inorganic materials, may be patterned according to the trace of the conductive line. For instance, the buffer layer 126 and the passivation layer 128 provided under and over the conductive line between the GIP area and the active area can be patterned as depicted in FIGS. 13A-13B and 14A-14B.

It should be remembered that the backplane of the flexible display 100 may employ different types of thin-film transistors for different circuits implemented on the base layer 106. That is, some thin-film transistors can have a different stack structure from other thin-film transistors. Also, some can be configured as N-type transistors while some are configured as P-type transistors. Further, some thin-film transistors may employ different kinds of semiconductor materials from some of the other thin-film transistors on the same backplane.

Accordingly, the semiconductor layer of the TFTs in the GIP area may be formed of the low-temperature-poly-silicon (LTPS), while the semiconductor layer of the TFTs in the active area may be formed of the oxide semiconductor such as indium-gallium-zinc-oxide (IGZO). For simplicity, only one of the TFTs from each of the active area and the GIP area are shown in FIGS. 15A and 15B. However, it should be noted that additional TFTs will be included in each of the pixel circuits and the GIP circuit for controlling the emission of the connected OLED element. In some embodiments, the entire TFTs implementing the GIP circuit may be formed of the LTPS TFTs while the entire TFTs implementing the array of pixel circuits in the active area are formed of the oxide TFTs. In some other embodiments, only some of the TFTs in a pixel circuit and/or only some of the TFTs in a GIP circuit may have the semiconductor layer that is different from other TFTs of the flexible display 100. As such, the TFTs shown in the active area and the GIP area in FIGS. 15A and 15B may have the same kind of semiconductor layer (e.g., LTPS), but there may be another TFT in the active area, which has a different kind of semiconductor layer (e.g., oxide) from the other TFTs. Likewise, the TFT shown in the active area and the GIP area in FIGS. 15A and 15B may have the same kind of semiconductor layer, but there may be another TFT in the GIP area, which has a different kind of semiconductor layer from the other TFTs.

When at least one of the GIP area and the active area includes an oxide semiconductor based TFT and the other area includes an LTPS TFT, the layer of oxide semiconductor can be patterned between the active area and the GIP area as lines laid between the GIP area and the active area. Post treatments, such as plasma treatment for increasing the carrier concentration or other implantation and/or thermal annealing processes, can be performed on the patterned lines of the oxide semiconductor to turn them into conductive lines. In other words, when the backplane of the flexible display is implemented with multiple kinds of semiconductor materials including the oxide semiconductor, the metal oxide semiconductor layer can be patterned and selectively turned into conductive lines in the flexible display 100. By way of an example, the conductive lines in the bend allowance section may be formed from the metal oxide semiconductor layer that is turned into the conducting lines.

As for the stack structure of the TFTs in the GIP area and the active area, TFTs implementing the GIP and the TFTs implementing the pixel circuit may both have the co-planar structure as shown in FIG. 15A. In another suitable embodiment of the flexible display 100, however, the TFTs implementing the GIP may have the co-planar structure, whereas the TFTs implementing pixel circuit have the bottom gate structure as depicted in FIG. 15B. It is also possible that the TFTs implementing the GIP have the bottom gate structure and the TFTs implementing the pixel circuit have the co-planar structure.

While the active areas in FIGS. 15A and 15B are shown as the one in the central portion of the flexible display, it should be noted that the GIP may be provided in the inactive area adjacent to a secondary active area, which is to be disposed in the area bent from the plane of another active area (e.g., the central active area). For example, the bend angle of the bend allowance section between the first active area and the secondary active area may be 90 degrees, and the bend angle of the bend allowance section between the second active area and the GIP area may be 90 degrees. In this case, the part of the base layer 106 where the GIP is disposed in would be positioned under the plane of the first active area.

In FIGS. 15A and 15B, the organic light-emitting layer, cathode, and etc. of the OLED element as well as layers of other components above the OLED element are omitted from the drawing for convenience. It should be appreciated that the GIP area can be formed in a pair, for instance one on the left side and the other one on the right side of the active area as shown in FIG. 1. The GIP area can also be formed in just one side of an active area included in the flexible display 100. For instance, there may be a GIP circuit provided on one side of a central active area for the central active area, and there may be another GIP area on one side of a secondary active area for the secondary active area.

In some embodiments, a bend allowance section may be provided between the GIP area and the area positioned even further out toward the scribe line of the base layer 106, which may be referred in the present disclosure as the GIP input signal line area. Various signal lines, including but not limited to, the data signal lines from the display D-IC and the VDD/VSS lines from the power supply unit and/or other components of the flexible display 100 disposed on some other part of the base layer 106 or on a separate printed circuit attached to the base layer 106, may be routed in the GIP input signal line area. Additional number of signal lines may need to be placed in the GIP input signal line area as the number of pixels managed by the GIP circuit increases.

Accordingly, a bend allowance section can be provided between the GIP input signal line area and the GIP area so that the GIP input signal line area can be bent away from the plane of the base layer 106 with the GIP area. Similar to the conductive lines in the bend allowance section between the GIP area and the active area discussed above in reference to FIGS. 15A and 15B, conductive lines extending across the bend allowance section between the GIP input signal line area and the GIP area can connect the GIP input signal lines to the corresponding part of the GIP. This configuration may be particularly useful if providing a bend allowance section between the GIP area and the active area is not feasible or desired.

Areas near the processing line (e.g., scribing line, chamfer line) of the flexible display 100 may be another spots vulnerable to cracks. For instance, cracks can initiate from the insulation layers during cutting the base layer 106 or otherwise trimming a portion of the base layer 106 into a desired shape. Chamfering of the base layer 106 can be performed after other elements have been disposed on the base layer 106. For instance, the encapsulation 104 and the polarization layer 110 can be placed on the base layer 106 corresponding to the active area. Various other components can be provided on the OLED element layer 102 prior to scribing and/or chamfering a part of the base layer 106. Also, an external printed circuit 134 can be attached to the base layer before chamfering of the base layer. If desired, additional external circuit can be attached to the printed circuit 134 that is already attached to the base layer 106. Moreover, the micro-coating layer 132 may be disposed in the bend allowance section(s) of the flexible display 100. Some of the components provided under the base layer 106, for instance the support layer 108, may also be arranged in their respective position of the base layer 106 before performing the chamfering process.

To reduce the possible damage to the components of the flexible display 100 by the processes related to trimming of the base layer 106, in some embodiments of the flexible display 100, one or more selective components disposed above the base layer 106 may be configured not to extend across the processing line of the base layer 106.

For instance, laser can be used to chamfer the base layer 106, the encapsulation (BFL) 104, the polarizer layer 110, and other layers in the flexible display 100 into a desired size and shape. Laser may be, for example, a continuous Wave (CW) or pulsed laser that produces light at wavelengths from about 150 nm to about 20 microns (e.g., light at ultraviolet, visible, or infrared wavelengths), and, more preferably a laser that produces infrared light at a wavelength in the range of 1 to 20 microns, 1 to 12 microns, or 9 to 12 microns. In the infrared spectrum, high-power laser sources are widely available and most polymers are at least somewhat opaque and able to readily absorb incoming laser light. An example of a laser type that may be used for laser is a carbon dioxide ($CO_2$) laser that produces light at one or more wavelengths in the range of about 9.2 to 11.4 microns). Other types of lasers may be used and other wavelengths of laser light may be generated. For example, laser may be a diode laser, a solid state laser, a gas laser other than a $CO_2$ laser, or any other suitable type of laser.

In a typical scenario, laser may produce about 10 to 100 W of output power or other suitable amounts such as less than 50 W of power, more than 20 W of power, etc. Beam may be focused to a spot on workpiece that has a spot size (e.g., a $1/e^2$ diameter) of about 100 to 500 microns in diameter. Under laser illumination conditions such as these, components of the flexible display 100 such as polarizer layer 110, the base layer 106, encapsulation (BFL) 104 and other layers in the flexible display 100 will be cut (e.g., by thermal disassociation of the bonds in the polymer material or other decomposition mechanisms such as ablation).

Some components of the flexible display 100 may be arranged on the base layer 106 so that it is extended across the chamfer line. In such cases, the intensity of the laser used during the chamfering process can be increased to provide throughput needed to cut through the layers below the chamfer line. If desired, the laser can be scanned along the chamfer line for additional iterations to cut through the layers under the chamfer line.

In some cases, however, increasing the intensity of the laser output may not be feasible because the heightened power can cause undesired damage to some components of the flexible display 100. That is, chamfering with the laser of increased intensity may deliver the amount of energy (e.g., heat energy), which may be too much for some of the layers under the chamfer line, resulting in various defects in the flexible display. By way of an example, increased intensity of the laser may generate cracks in some insulation layers formed of inorganic materials, such as the buffer layer 126, the passivation later 128 and the ILD, creating a passage which oxygen and moisture can permeate through to damage the TFTs and OLED elements of the flexible display 100. As a means for damage control in the chamfering process, the number of scanning along the chamfer line with the laser can be increased while limiting the intensity of the laser. One of the obvious drawback of increasing the scanning iterations is the extra time necessary for completing the chamfering process.

Figure 16B:
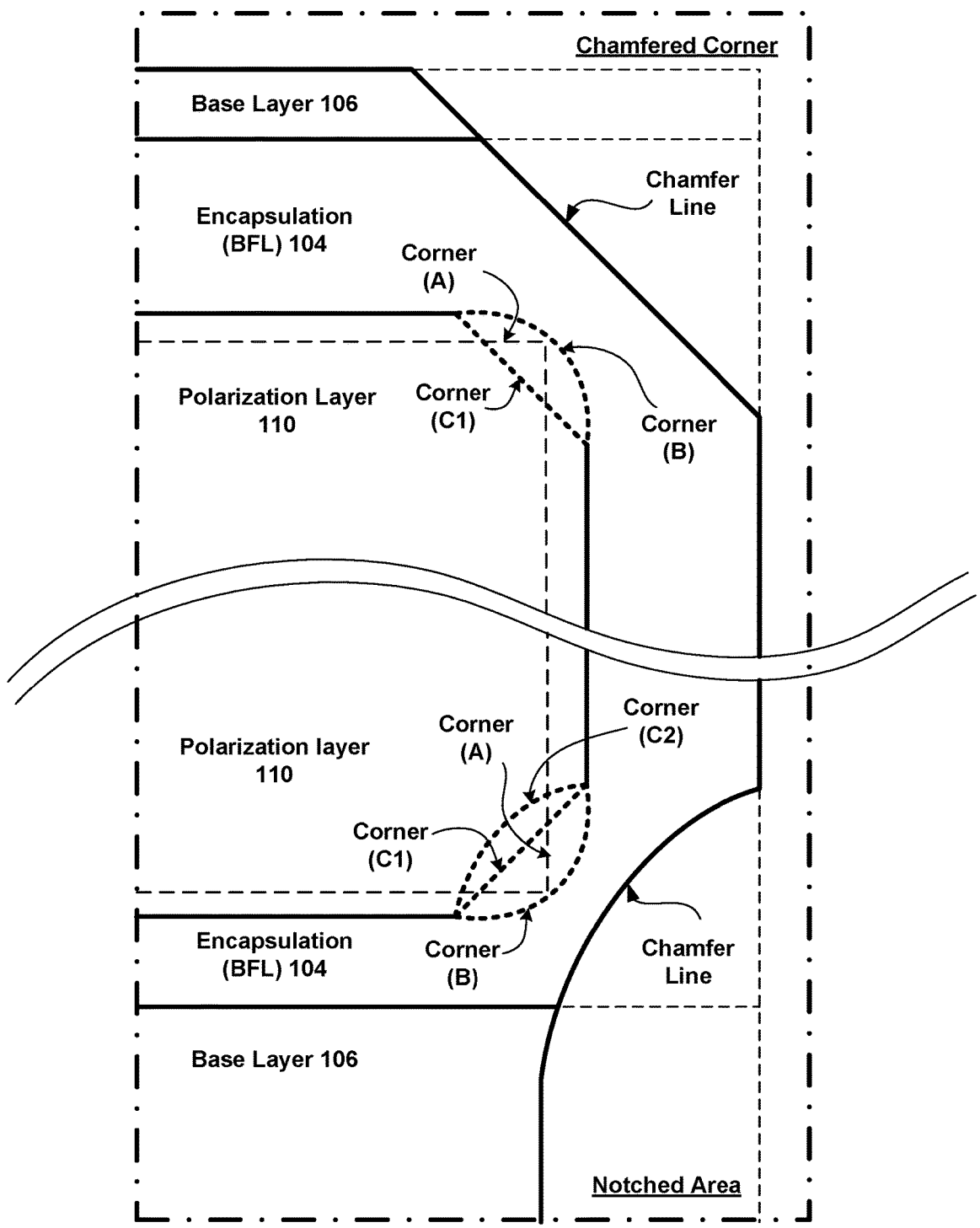
FIGS. 16B and 16C illustrate schematic views of exemplary configurations near the notched area of the flexible display apparatus.

Accordingly, in some embodiments of the flexible display 100, some components of the flexible display 100 can be provided in a size and/or in a shape so that they are positioned away from the chamfer line. FIG. 16B is an enlarged top view showing an exemplary configuration of a chamfered corner and a notch provided in an embodiment of flexible display shown in FIG. 16A.

As shown in FIG. 16B, a corner of the flexible display 100 can be chamfered along the chamfer line. As illustrated by the dotted line, the part of the encapsulation (barrier film layer: BFL) 104 covering the active area on the base layer 106 is extended over the chamfer line, and thus chamfered together with the base layer 106. On the contrary, the polarization layer 110 disposed on the encapsulation 104 is arranged not to extend over the chamfer line, and thus the polarization layer 110 is not cut by the laser cutting of the encapsulation 104 and the base layer 106 along the chamfer line.

In this regard, the polarization layer 110 may be scribed in a size such that the "Corner (A)" of the polarization layer 110 does not extend across the chamfer line. In another embodiment, the polarization layer 110 can be provided with a rounded corner, as the "Corner (B)" shown in FIG. 16B. In yet another embodiment, the polarization layer 110 can be provided with a corner that is similar to the chamfered corner of the flexible display 100. That is, the corner of the polarization layer 110 may be pre-cut in the same or a similar chamfer angle as the corner of the flexible display 100. For example, the corner of the polarization layer 110 at the chamfered corner of the flexible display 100 may be provided with a cutout portion similar to the chamfered corner of the flexible display 100, which is denoted as "Corner C1" in FIG. 16B. Same styled corner (i.e., "Corner C1") can be used for the corner of the planarization layer 110 at the notch of the flexible display 100. In some embodiments, the corner of the planarization layer 110 at the notch of the flexible display 100 can be chamfered similar to the chamfer line for creating the notched area in the flexible display 100, denoted as "Corner (C2)" in FIG. 16B.

Prior to placing the polarization layer 110 on the encapsulation 104, laser chamfering or grinding can be performed to make the corners of the polarization layer 110 as the "Corner (B)" or "Corner (C1, C2)." With "Corner (B)" and "Corner (C1, C2)", a larger sized polarization layer 110 can be used in the flexible display 100 as compared to the polarization layer 110 provided with "Corner (A)."

Since the laser for chamfering the encapsulation 104 and the base layer 106 does not have to cut through the polarization layer 110, intensity of the laser can be lowered without having to increase the scan iterations along the chamfer line. Therefore, the scribing and the chamfering of the base layer 106 can be performed more efficiently while reducing the chance of defects along the chamfered line.

Cracks generated at the far end of the flexible display 100 can propagate towards central portion. As such, if cracks are generated at the chamfer line of the flexible display 100, it can propagate into the bending area and the routing areas adjacent to the bending area. In some cases, cracks from the scribing lines at the inactive areas provided in a flat central portion of the flexible display 100 can propagate toward the active area and damage various circuits in the inactive areas, such as the GIP.

Accordingly, selective areas along one or more scribing lines of the flexible display 100 may be substantially free of inorganic material layers. Referring back to FIG. 16A, area at one or more edges of the base layer 106 in the flexible display 100, denoted as "the scribe line etch area," may be etched so that the area is substantially free of insulation layers of inorganic materials such the buffer layer 126. In the scribe line etch areas, the base layer 106 may be exposed or only a predetermined minimal thickness of the buffer layer 126 may remain. Although the scribe line etch areas are marked at the top edge and the bottom edge of the flexible display 100 in FIG. 16A, the location, the size and the shape of the scribe line etch area are not particularly limited as shown in FIG. 16A. The scribe line etch area can be provided at only at one of the top and bottom edges, provided at the side edges or provided at all edges around the active area of the flexible display 100. When the scribe line etch areas are provided at the side edges of the flexible display 100, one or more insulation layers, especially the inorganic insulation layers, may be etched from the edges of the flexible base layer next to the GIPs. In an embodiment in which the flexible display 100 is provided with a round shaped base layer 106, the scribe line etch area may be provided at the periphery of the active area.

Several side crack stopper structures may also be provided in the area between the edge (i.e., scribed line/chamfered line) and the active area in a central portion of the flexible display 100. For instance, a recessed channel can be formed in the inactive area by etching the insulation layers as shown in FIG. 16A (provided on the left side edge). Also, a dummy wire trace pattern may be disposed in the inactive area to change the direction of crack propagating from the outer edge of the flexible display 100 toward the circuits in the inactive area. Such crack stopper structures can be provided between a circuit (or other fragile elements) positioned in the inactive area and the outer edge of the flexible display 100. For example, a metal trace having a strain-reducing trace design and insulation layer covering the metal trace can be formed between the GIP and the edge of the flexible display 100 as depicted in FIG. 16A (provided on the right side edge). While the recessed channel and the dummy wire trace pattern are provided on the left and right sides, respectively, such crack stopper structures can be provided in the top and bottom sides as well.

It should be noted that the recessed channel on the left side of the active area can also be provided on the right side of the active area. Likewise, the dummy wire trace with the strain-reducing pattern provided on the right side of the inactive area can also be provided on the left side of the inactive area. In some embodiments, both the recessed channel and the metal trace having the strain-reducing pattern can be provided on one or more sides of the active area. In this configuration, the cracks propagating from the outer edge of the inactive area in the direction towards the GIP may change its course due to the angle of the diamond metal/insulation trace formed before the GIP.

Patterning of insulation layers, especially the inorganic insulation layers, can also be performed in the routing area between the active area and the bend allowance section as well as the routing area between the connection interface and the bend allowance section. Further, the inorganic material layers may be removed from at least some part of areas adjacent to the chamfered lines so that cracks do not propagate from the chamfered line toward the conductive lines 120.

Figure 16C:
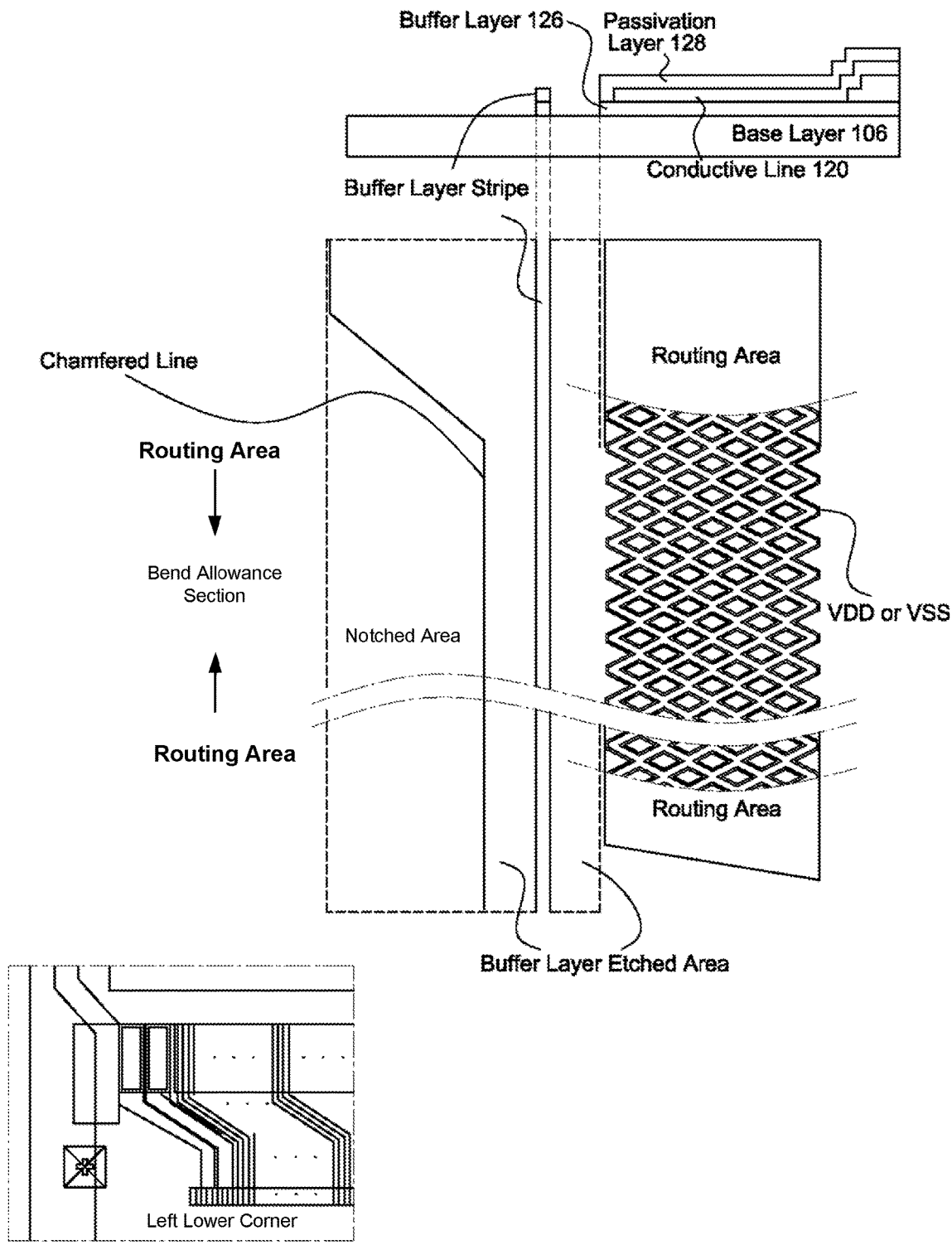

FIG. 16C is an enlarged view of lower left corner of the flexible display near the notched area. In order to reduce crack initiation and propagation from the inorganic layers near the chamfered line, the insulation layer is etched in the area between the wire trace (e.g., VSS/VDD line) to the chamfered line. In particular, the buffer layer 126 disposed on the base layer 106 in the area between the chamfered line and the conductive line 120 in the bend allowance section, which is closest to the chamfer line (e.g., VSS/VDD line) can be removed. In this area, the base layer 106 may be exposed or buffer layer 126 with a limited thickness (i.e., thinner than the buffer layer 126 under the conductive line 120) may remain. Accordingly, crack initiation and propagation from the chamfered line can be hindered by the buffer layer etched area.

When etching the buffer layer 126 near the chamfer line, a stripe of buffer layer 126 can be configured to remain between the chamfered line and the wire trace closest to the chamfered line as depicted in FIG. 16C. This stripe of buffer layer can serve as a dam for inhibiting moistures of other foreign material from reaching the wire trace from the chamfered side of the flexible display 100.

The aforementioned buffer layer etched area can also be applied in the routing area between the chamfer line and the closest wire trace. The stripe of buffer layer 126 may also be provided in the routing area. Further, the buffer layer 126 under the conductive lines 120 and the passivation layer 128 on the conductive lines 120 can be patterned to correspond to the trace of the conductive lines 120 throughout the routing area to further reduce the chance of crack propagation by the inorganic insulation layers in the routing areas next to the bend allowance section. For instance, the configuration of wire trace structures depicted in FIGS. 10, 11A-11B, 12, 13A-13B and 14A-14B may also be applied to the wire traces in the routing areas.

Figure 16D:
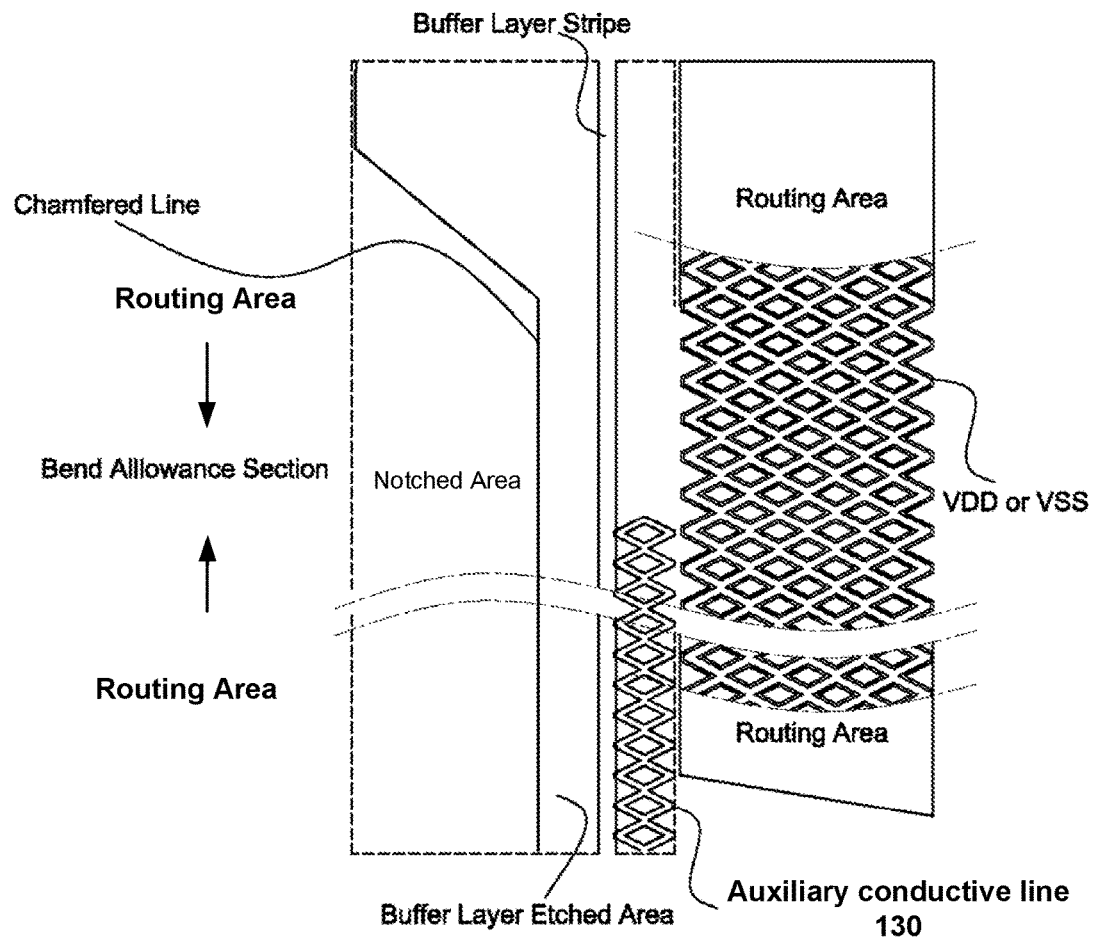
FIG. 16D is an enlarged view near the notched area of the flexible display provided with another type of crack stopper structure according to an embodiment of the present disclosure.

FIG. 16D is an enlarged view near the notched area of the flexible display 100, provided with another type of crack stopper structure. In this embodiment, an auxiliary conductive line 130 having the diamond trace pattern is provided between the chamfered line and the wire trace (e.g., VSS/VDD). The buffer layer 126 under the auxiliary conductive line 130 and the passivation 128 on the auxiliary conductive line 130 can be etched in the similar manner as depicted in FIGS. 13A and 13B. Accordingly, the auxiliary conductive line 130 may inhibit propagation of cracks from the chamfered line to the wire trace. The auxiliary conductive line 130 may be a floating line. If desired, the auxiliary conductive line 130 may extend outside the routing area towards the bottom edge of the flexible display 100. In some embodiments, the auxiliary conductive line 130 may be in contact with adjacent conductive line 120. In addition to the auxiliary conductive line 130, the stripe of buffer layer 126 may also be provided to stop moisture or other foreign materials traveling towards the auxiliary conductive line 130.

Although the polarization layer 110 has been described as the component, which is arranged not to cross over the processing line of the base layer 106, various other components of the flexible display 100 can be configured in the similar way as the polarization layer 110 discussed above in reference to FIG. 16B. Non-limiting examples of the components in the flexible display 100, which may be configured in the similar way as discussed above, include a barrier film layer, a touch sensor layer and an adhesive layer. Further other optical sheet layers, such as a light guide panel, a prism sheet, a light extraction sheet, a color conversion/enhancing layer (e.g., quantum-dot/rod layer, may be arranged in the flexible display 100 such that a clearance is provided along the processing line of base layer.

Micro-Coating Layer

With the absent of various layers in the bend portion of the flexible display 100, a protective layer may be needed for the wire traces, especially for the wire traces in the bend allowance section of the flexible display 100. Also, the wire traces in the bend portion can be vulnerable to moistures and other foreign materials as the inorganic insulation layers can be etched away from in the bend portion of the flexible display 100. In particular, various pads and conductive lines for testing the components during manufacturing of the flexible display 100 may be chamfered, and this can leave the conductive lines extended to the notched edge of the flexible display 100. Such conductive lines can be easily corroded by moistures, which can be expanded to nearby conductive lines. Accordingly, a protective coating layer, which may be referred to as a "micro-coating layer" can be provided over the wire traces in the bend portion of the flexible display 100.

The micro-coating layer 132 may be coated over the bend allowance section in a predetermined thickness to adjust the neutral plane of the flexible display 100 at the bend portion. More specifically, added thickness of the micro-coating layer 132 at the bend portion of the flexible display 100 can shift the plane of the wire traces closer to the neutral plane.

In some embodiments, the thickness of the micro-coating layer 132 in the area between the encapsulation 104 and the printed circuit 134, which is measured from the surface of the base layer 106, may be substantially the same as the thickness of the encapsulation 104 on the base layer 106 to the top surface of the encapsulation 104.

The micro-coating layer should have sufficient flexibility so that it can be used in the bend portion of the flexible display 100. Further, the material of the micro-coating layer should be a curable material with low energy within a limited time so that the components under the micro-coating layer are not damaged during the curing process. The micro-coating layer 132 may be formed of a photo-curable acrylic (e.g., UV light, Visible light, UV LED) resin and coated over the desired areas of the flexible display 100. In order to suppress permeation of unwanted moistures through the micro-coating layer, one or more getter material may be mixed in the micro-coating layer.

Various resin dispensing methods, such as slit coating, jetting and the like, may be used to dispense the micro-coating layer 132 at the targeted surface. In way of an example, the micro-coating layer 132 can be dispensed by using a jetting valve. The dispensing rate from the jetting valve(s) may be adjusted during the coating process for accurate control of the thickness and the spread size of the micro-coating layer 132 at the targeted surface. Further, the number of jetting valves in dispensing the micro-coating layer 132 over the desired area is not limited, and it can vary to adjust the dispense time and the amount of spread on the dispensed surface before the micro-coating layer 132 is cured.

Figure 17A:
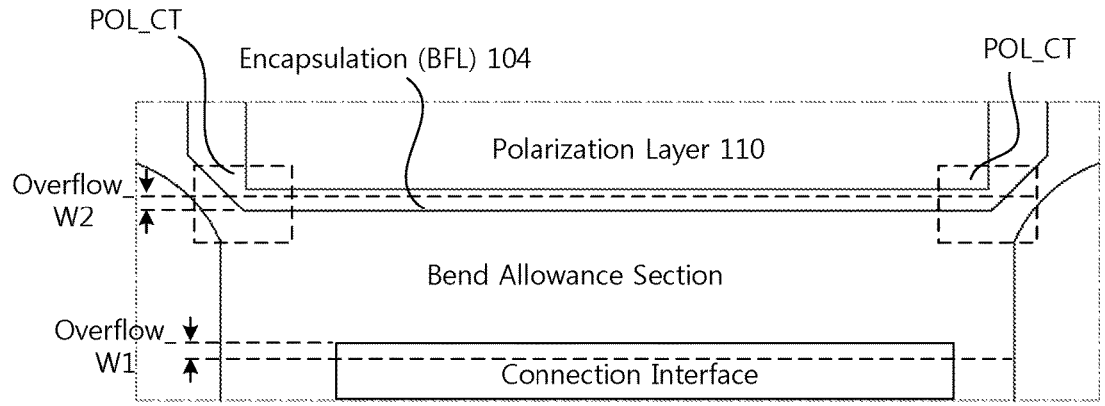
FIGS. 17A-17C illustrate schematic views of the flexible display provided with a micro-coating layer according to embodiments of the present disclosure.

FIG. 17A illustrates one suitable exemplary configuration of the micro-coating layer 132 in an embodiment of flexible display 100. As mentioned, the micro-coating layer 132 can be coated in the area between the encapsulation 104 and the printed circuit 134 attached in the inactive area. Depending on the adhesive property of the micro-coating layer 132 and the amount of bend stress, however, the micro-coating layer 132 can be detached away from the encapsulation 104 and/or the printed circuit 134. Any open space between the micro-coating layer 132 and the encapsulation 104 or the printed circuit 134 can become a defect site where moisture can permeate through.

Accordingly, in some embodiments, the micro-coating layer 132 can be overflowed onto a part of the encapsulation 104 as shown in FIG. 17A. That is, the top surface of the encapsulation 104 at its edge can be coated with the micro-coating layer 132. The additional contact area on the surface of the encapsulation 104 coated by the micro-coating layer 132 suppresses the micro-coating layer 132 from fall apart from the encapsulation 104 by the bend stress. The enhanced sealing provided by the micro-coating layer 132 at the edge of the encapsulation 104 can reduce corrosion of the wire traces at the bend portion of the flexible display 100. Similarly, the micro-coating layer 132 can be overflowed onto at least some part of the printed circuit 134 for improved sealing by at the edge of the printed circuit 134.

Figure 17B:
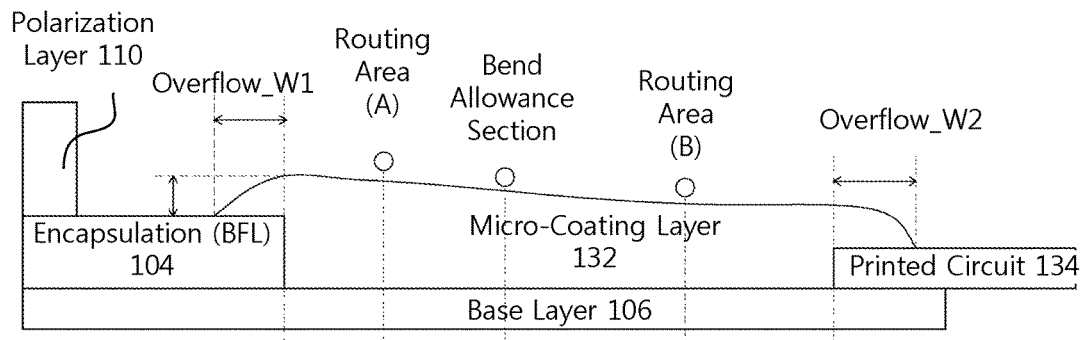
Figure 17C:
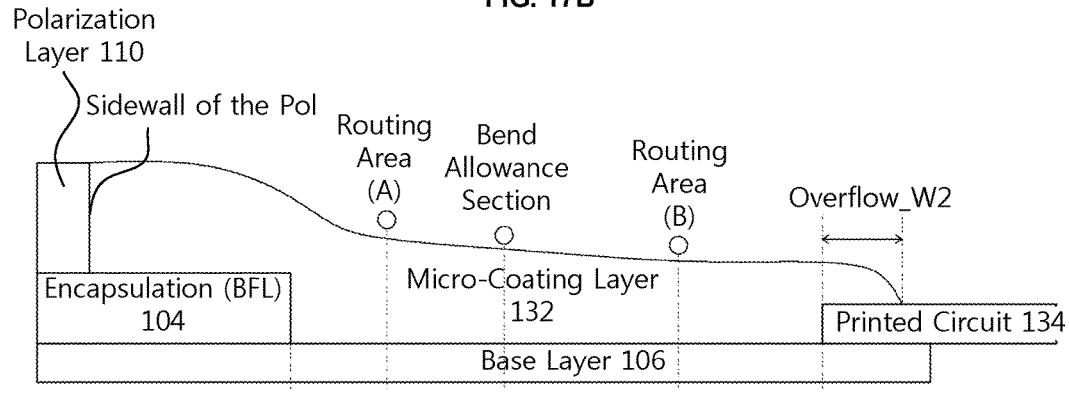

Referring to FIGS. 17B and 17C, the width of the area on the encapsulation 104 coated with the micro-coating layer 134 is denoted as "Overflow_W1", and the width of the area on the printed circuit 134 coated with the micro-coating layer 134 is denoted as "Overflow_W2." The sizes of the micro-coating layer 134 overflowed areas on the encapsulation 104 and the printed circuit 134 are not particularly limited and may vary depending on the adhesiveness of the micro-coating layer 132.

As shown in FIG. 17B, the flexible display 100 may include a portion where the micro-coating layer 132 on the encapsulation 104 is spaced apart from the edge of the polarization layer 110. In some embodiments, however, the flexible display 100 may include a portion where the micro-coating layer 132 on the encapsulation 104 is in contact with the polarization layer 110 disposed on the encapsulation 104 as depicted in FIG. 17C.

The spreading dynamic of the micro-coating layer 132 on the dispensed surface depends on the viscosity of the micro-coating layer 132 as well as the surface energy where the micro-coating layer 132 is dispensed. As such, the micro-coating layer 132 overflowed into the encapsulation 104 may reach the polarization layer 110. The micro-coating layer 132 in contact with the sidewall of the polarization layer 110 can help in holding the polarization layer 132 in place. However, the micro-coating layer 132 reaching the sidewall of the polarization layer 114 may climb over the sidewall of the polarization layer 110. Such sidewall wetting of the micro-coating layer 132 can create uneven edges over the surface of the polarization layer 132, which may cause various issues in placing another layer thereon. Accordingly, the amount of the micro-coating layer 134 dispensed on the targeted surface can be adjusted to control the width of the micro-coating layer 134 on the encapsulation layer 114. Further, the micro-coating layer 132 may be dispensed such that only some of the selective areas of the polarization layer 110 are in contact with the micro-coating layer 132.

Figure 18A:
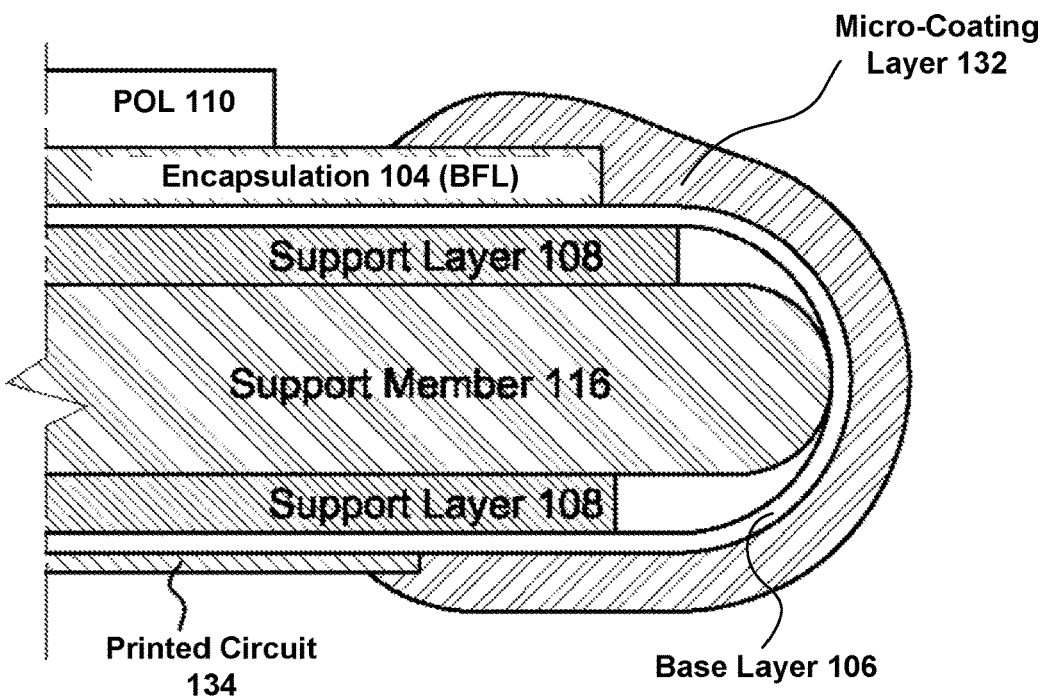
FIGS. 18A and 18B illustrate schematic views of embodiments of the flexible display in a bent state, which are provided with a micro-coating layer according to embodiments of the present disclosure.
Figure 18B:
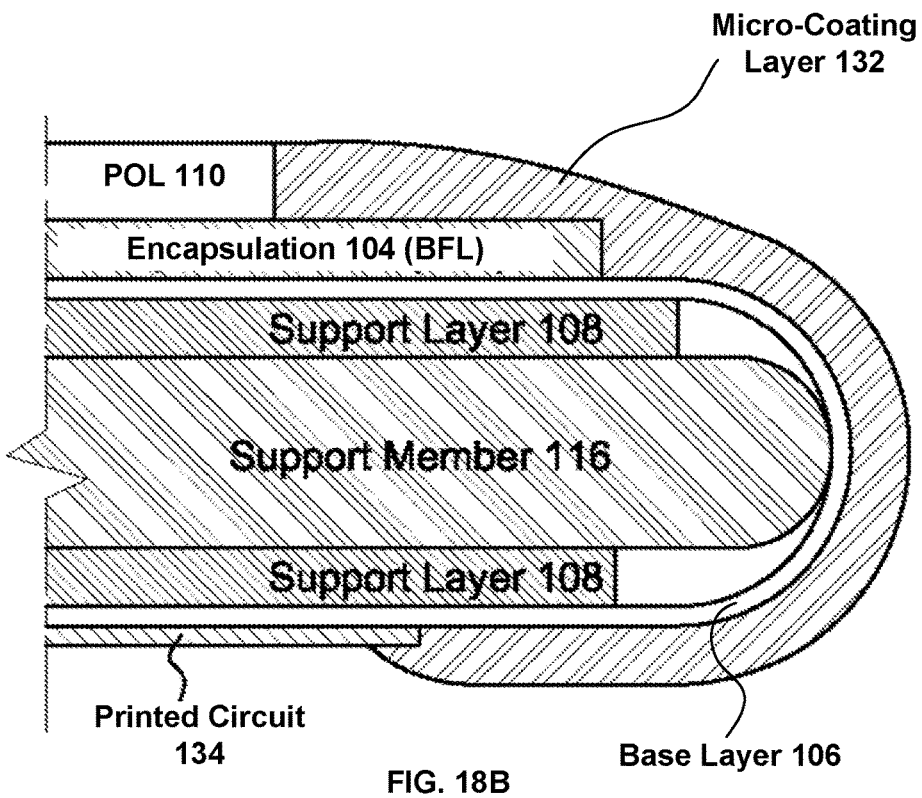

In one suitable configuration, the micro-coating layer 132 may be in contact with the polarization layer 110 at the two opposite corners (denoted "POL_CT" in FIG. 17A) while the micro-coating layer 132 between the two corners does not reach the edge of the polarization layer 110. The micro-coating layer 132 between the two opposite corners (POL_CT) only covers up to some part of the encapsulation 104. After the bending process, the part of the flexible display 100 where the micro-coating layer 132 is spaced apart from the polarization layer 110 may be configured as shown in FIG. 18A. In the region where micro-coating layer 132 is configured to be in contact with the polarization layer 110, the flexible display 100 may be configured as shown in FIG. 18B.

The micro-coating layer is not perfectly impermeable to oxygen and particularly not to moisture, so the micro-coating layer provided in the flexible display 100 will generally have some finite permeation rate. Gases and moistures that permeate through the micro-coating layer 132 can react with the conductive lines at the sites of reaction. The gasses and moisture that permeate through the seal, which is provided by the micro-coating layer, may react with, for example, valley patterns remaining on the printed circuit 134 or the conductive lines at the scribed/chamfered edge of the base layer 106. Because the micro-coating layer 132 is disposed over the bend allowance section, the micro-coating layer 132 can be pulled away from the surface it was originally attached, and leave the conductive lines vulnerable to the gasses and moisture. Eventually, the sites of reaction reach some specified quantity, and render the flexible display 100 inoperable.

Employing getter materials within the micro-coating layer 132 can extend the useable lifetime of the device. These getter materials absorb and/or react with the water vapor that would otherwise corrode the conductive lines. Accordingly, in some embodiments, multiple kinds of micro-coating layers can be used in the flexible display 100. More specifically, a plurality of micro-coating layers can be provided over a bend allowance section between a first portion and a second portion of the flexible display apparatus 100.

Figure 19A:
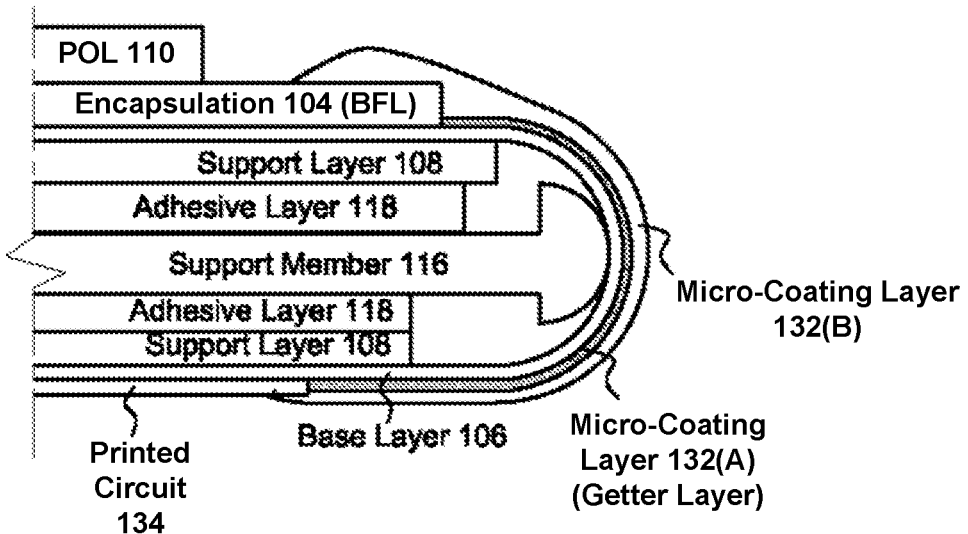
FIGS. 19A and 19B illustrate schematic views of embodiments of the flexible display in a bent state, which are provided with multiple types of micro-coating layers in the bend allowance section according to embodiments of the present disclosure.

In the embodiment shown in FIG. 19A, the first micro-coating layer 132(A) can be coated over the wire traces in the bend allowance section of the flexible display 100, and the second type of micro-coating layer 132B may be coated over the first type of micro-coating layer 132A. One of the first micro-coating layer and the second micro-coating layer includes one or more of getter materials to reduce permeation of moisture. Examples of getter materials that can be included in the micro-coating layer include silica particles, zeolite, zeolitic clays, CaO particles, BaO particles, Ba metals and so on. In some embodiments of the invention, one or more of the following thermally activated getters may be used: Zeolitic clay, Barium Oxide, Calcium Oxide and other reactive or water absorbing oxides, activated carbon or other absorptive organic or inorganic materials.

In one suitable configuration, the first micro-coating layer 132A may include one or more getter materials to reduce permeation of moisture in the bend allowance section. In another configuration, the second micro-coating layer 132B, which is the outer layer among the plurality of micro-coating layers, may include one or more getter materials.

Figure 19B:
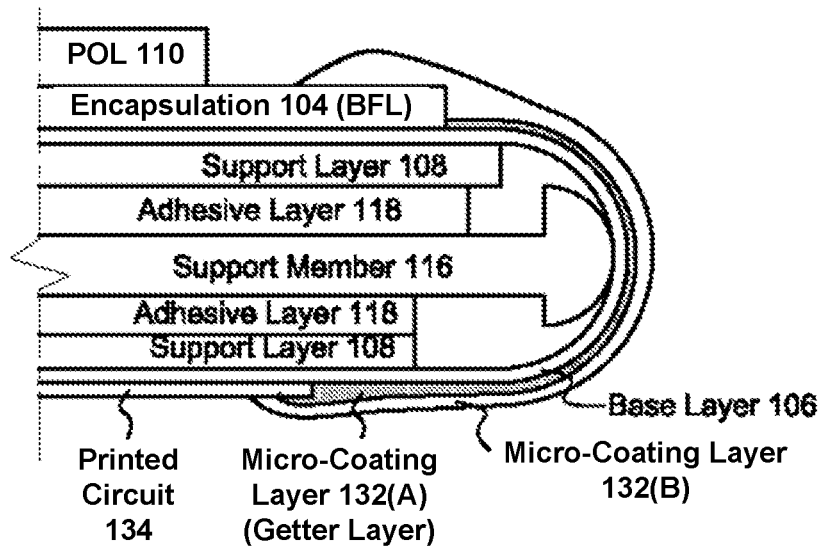

Also, in some embodiments, the first micro-coating layer 132A underneath the second micro-coating layer 132B is extended further and provided over at least some part of the encapsulation 104. Likewise, the first micro-coating layer 132A may be extended further and provided over at least some part of the printed circuit 134 at the opposite end of the bend allowance section as shown in FIG. 19B. In addition, the first micro-coating layer 132A coated over the bend allowance section can be coated over both the part of the encapsulation 104 as well as the part of the printed circuit 134. The first micro-coating layer 132A coated on the part of the encapsulation 104 and/or the printed circuit 134 can provide stronger adhesion to the encapsulation and/or the printed circuit 134 for improved sealing at the respective areas.

In some cases, the second micro-coating layer 132B on the first micro-coating layer 132A may provide stronger adhesion with the surface of the encapsulation 104 and/or the printed circuit 134 than the first micro-coating layer 132A. Accordingly, the second micro-coating layer 132B on the first micro-coating layer 132A may be coated over at least some part of the encapsulation 104 and/or at least some part of the printed circuit 134 for improved sealing at the edges of the encapsulation 141 and the printed circuit 134 as depicted in FIGS. 17A-17C. If desired, both the first and second micro-coating layers may be provided on at least some part of the encapsulation 104 and/or the printed circuit 134.

Rather than coating the multiple micro-coating layers over the bend allowance section, different types of micro-coating layer can be selectively used in different regions in between two portion of the flexible display apparatus 100. For instance, the micro-coating layer provided near the edge of the encapsulation 104 and/or the printed circuit 134 may be different from the micro-coating layer provided in the area between the encapsulation 104 and the printed circuit 134.

Figure 20A:
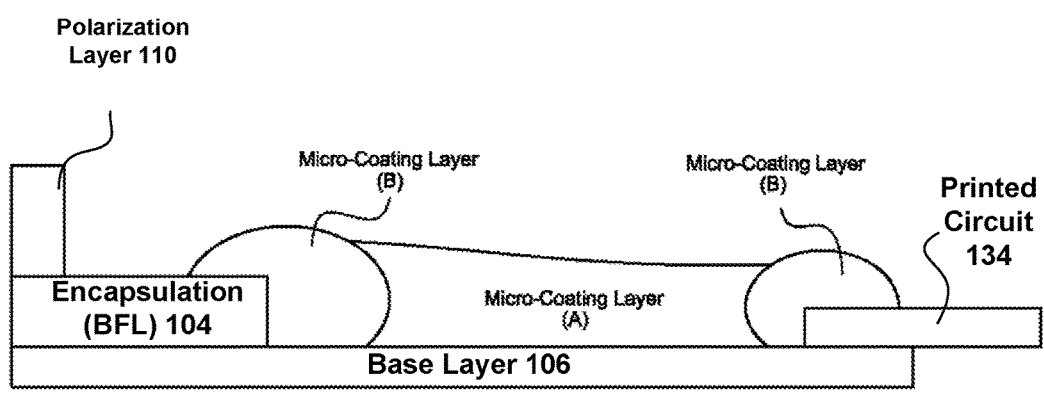
FIGS. 20A and 20B illustrate schematic views of embodiments of the flexible display, which are provided with several regions between the encapsulation and the printed circuit (e.g., COF) provided with different types of micro-coating layers according to embodiments of the present disclosure.

In the embodiment shown in FIG. 20A, the region over the bend allowance section is coated with a first type of micro-coating layer 132(A). Another type of micro-coating layer 132(B) is coated in the regions next to the region coated with the first type of micro-coating layer 132(A). More specifically, the second type of micro-coating layer 132(B) is provided in the region between the encapsulation 104 and the region coated with the first type micro-coating layer 132(A). Likewise, the second type of micro-coating layer 132(B) is provided in the region between the printed circuit 134 and the region coated with the first type of micro-coating layer 132(A).

When cured, the first type of micro-coating layer 132(A) may be more flexible than the second type of micro-coating layer 132(B). The second type of micro-coating layer 132(B) needs not be as flexible as the first type of micro-coating layer 132(A) since the regions coated by the second type of micro-coating layer 132(B) has less curvature than the region coated with the first type of coating layer 132(A). Although the second type of micro-coating layer 132(B) may not be as flexible as the first type of micro-coating layer 132(A), it may be the type of micro-coating layer that provides higher adhesive property than the first type of micro-coating layer 132(A). This way, the second type of micro-coating layer 132(B) provided at the edges or on the surfaces of the encapsulation 104 and the printed circuit 134 can improve the sealing at the respective regions to suppress possible corrosion of the conductive lines thereunder.

In the embodiments where the second region is provided in between the first region and the encapsulation, the second type of micro-coating layer may be overflowed on at least some part of the encapsulation 104. Similarly, in the embodiments where the second region is provided in between the first region and the printed circuit 134, the second type of micro-coating layer is overflowed on at least some part of the printed circuit 134. As described above with reference to FIGS. 17A-17C, coating at least some upper surface of the encapsulation 104 and/or the printed circuit 134 at their edges can further improve the sealing at the respective regions. In some embodiments, the first type of micro-coating layer 132(A) provided in the bend allowance section may be coated over the second type of micro-coating layer 132(B) and over at least some upper surface of the encapsulation 104 and/or the printed circuit 134 at their edges.

In some embodiments, the first type of micro-coating layer coated in the first region may be coated on the second type of micro-coating layer. Further, the first type of micro-coating layer in the first region may be coated on at least some part of the encapsulation and/or at least some part of the printed circuit.

Figure 20B:
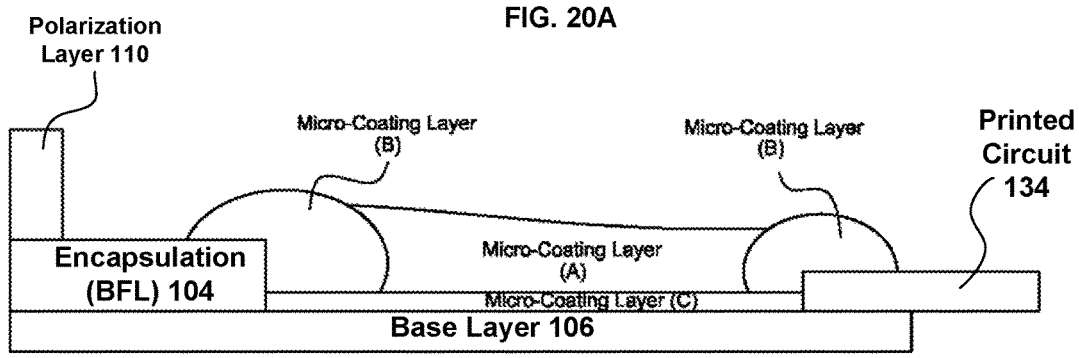

In addition to having higher adhesion property than the first type of micro-coating layer 132(A), the second type of micro-coating layer may include one or more of getter materials dispersed therein. The getter materials absorb and/or react with the water vapor, which can corrode the wire traces under the micro-coating layer 132. In some embodiments, a third type of micro-coating layer 132(C) including one or more getter materials may be provided underneath the first type of micro-coating layer 132(A) and the second type of micro-coating layer 132(B) as depicted in FIG. 20B.

For convenience, the bend allowance section provided with the multiple kinds of micro-coating layers is between a display area with the encapsulation and a non-display area with the printed circuit 134. However, it should be noted that the bend allowance section provided with the multiple kinds of micro-coating layers can be provided between two portions of the flexible display apparatus 100, each including a display area therein. Also, the bend allowance section provided with the multiple kinds of micro-coating layers can be provided between two non-display areas, which may be attached with a printed circuit.

Divided VSS-VDD Wire Trace

Spreading dynamic of the micro-coating layer 132 over the wire traces can be affected by the trace design of the wire traces. More specifically, patterning of the insulation layers along the wire trace in the bend portion of the flexible display 100 creates recessed areas and protruded areas, which essentially become a micro-grooved surface to be covered by the micro-coating layer 132.

When applying the strain-reducing trace design in the wire traces, patterning of the insulation layers around the split sub-traces creates the recessed open area, which is surrounded by the protruded stack of wire traces. During coating of the micro-coating layer 132, some portion of the micro-coating layer droplet can permeate into the recessed open area. It can hinder the spreading and reduce the maximum spreading diameter of the micro-coating layer 132 on such a micro-grooved surface, and result in some part of the bend portion being exposed without the micro-coating layer 132.

Decrease in the wettability of micro-coating layer 132 by the distribution of the recessed areas and the protruded areas may be magnified even more in the area over the wire trace applied with the grid-like trace design shown in FIG. 11B. To counteract the viscid drag, in some embodiments, a wire trace, which includes multiple diamond-chain traces adjoined side-by-side, can be provided with a rail between two parts of the wire trace.

Figure 21:
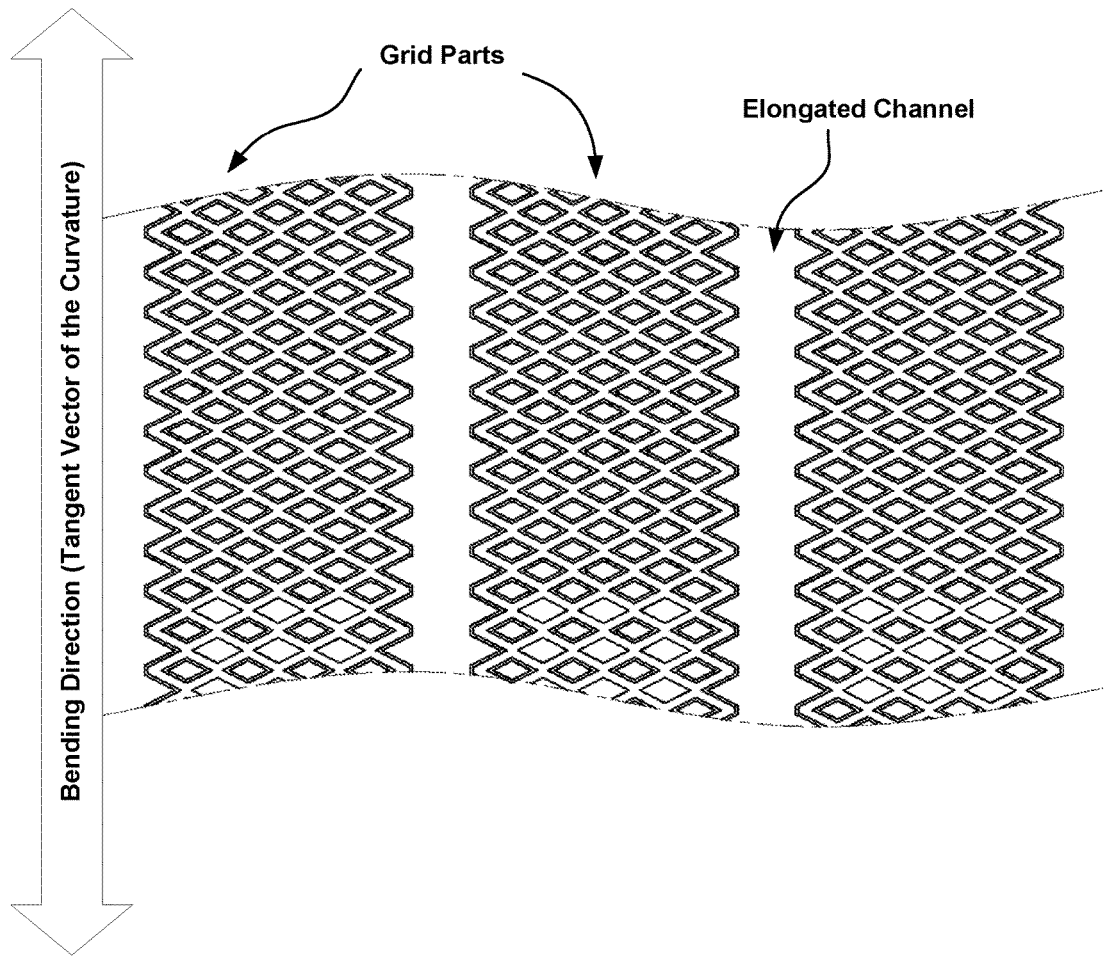
FIG. 21 illustrates a schematic view of an exemplary strain-reducing wire trace design provided with elongated channel(s) for improving spread dynamics of a micro-coating layer.

Referring to FIG. 21, a wire trace with a grid-like trace strain-reducing trace design is provided with an elongated channel between divided grid-parts of the wire trace. Within the elongated channel, the conductive line 120 is not formed. Also, at least some of the inorganic insulation layers on the base layer 106 are removed in the elongated channel. The elongated channel between the grid-parts of the wire trace extends from the signal supplying side to the signal receiving side of the wire trace. That is, the elongated channel may be extended in the direction parallel to the bending direction. It should be noted that the separated parts of the wire trace on one side of the elongated channel is connected to the part of the wire trace on the opposite side of the elongated channel, and thus both parts of the wire trace transmit the identical signal. The connection between the divided parts of the wire trace may be achieved at one or both ends of the wire trace by a conductive path, which may be a part of the wire trace. The connection of the divided parts of the wire trace may be achieved within the bend allowance section or outside the bend allowance section.

Even though the parts of the wire trace on each side of the elongated channel has the grid-like trace design, the reduced number of diamond-chain traces adjoined in each grid-part and the channel between the grid-parts can reduce the viscid drag of the micro-coating layer 132. More importantly, the elongated recessed channel between the parts of the wire trace serves as a path that improves the wettability of the micro-coating layer 132 over the wire trace. In sum, increase in the maximum spread diameter of the micro-coating layer 132 can be achieved by positioning one or more elongated channel within the wire having the grid-like strain-reducing trace design.

It should be noted that the resistance of the wire trace can increase with the elongated channel dividing the wire trace into multiple grid-parts. Increase in the resistance of the wire can raise the temperature of the wire trace when it is supplied with a signal. Accordingly, the number of elongated channels provided in a single wire trace can depend on the signal transmitted via the wire trace. In some cases, the size of each diamond shaped link in a grid-like wire trace may be larger than the size of diamond-shaped links in other wire traces of the flexible display 100.

In one suitable configuration, one or more of power signal wires of the flexible display 100, such as the VDD and/or the VSS, has the grid-like wire trace formed of multiple diamond-chain traces adjoined side-by-side as depicted in FIG. 21. The power signal wire trace includes one or more elongated channels in its grid-like wire trace. Each of the elongated channels is provided between two divided grid parts, which are on the opposite sides of the elongated channel. The divided grid parts are connected at one or both ends of the power signal wire. The size of the divided grid parts may be substantially the same. That is, the number of diamond-chain traces forming a gird part on one side of the elongated channel may be the same as the number of diamond-chain traces forming a gird part on the opposite side. If desired, however, the number of diamond-chain traces adjoined to each other to form one grid part may differ from the number of diamond-chain forming another grid part.

Corrosion Resistant Printed Circuit Film

Figure 22:
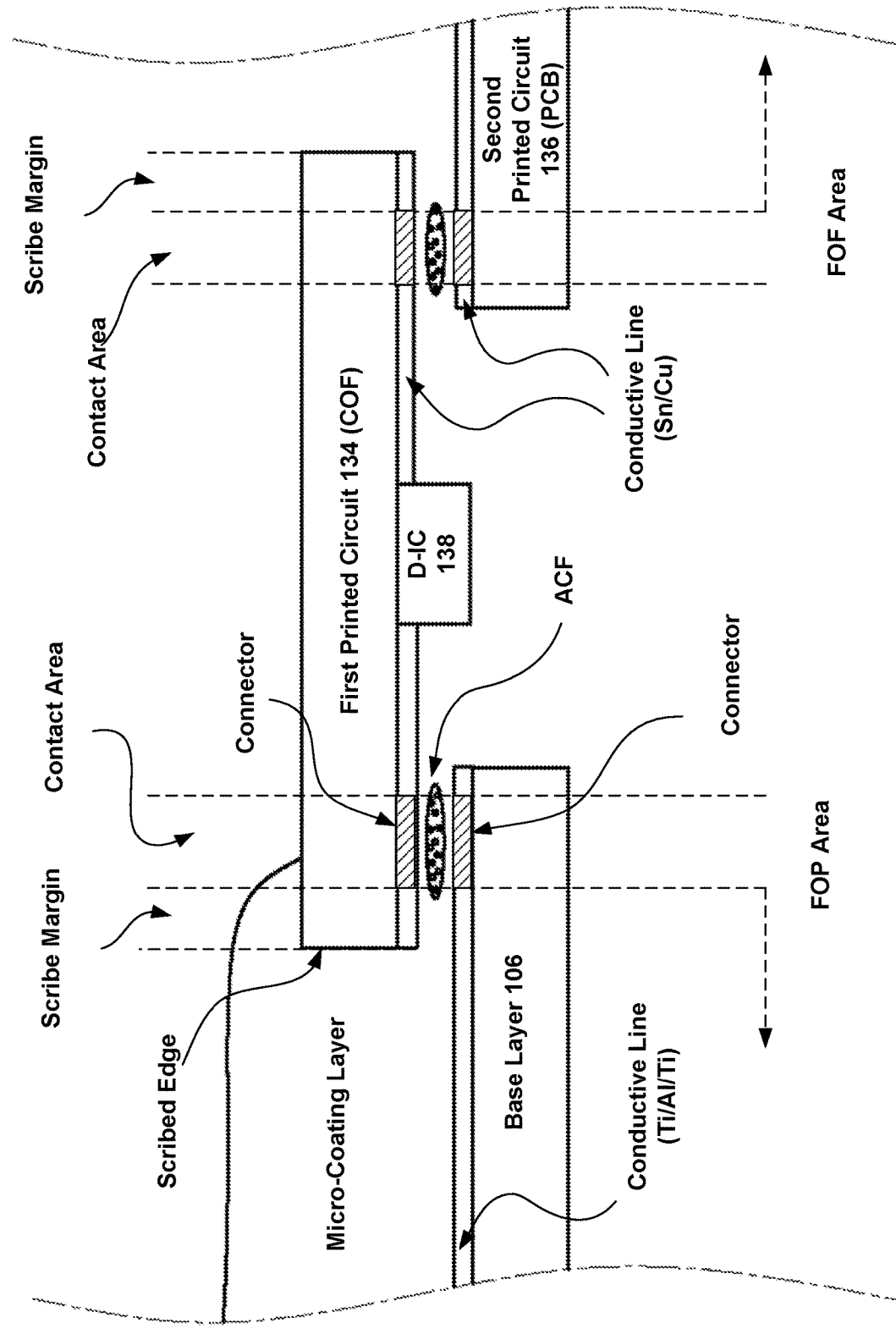
FIG. 22 illustrates a schematic view of an exemplary arrangement of a printed circuit and a base layer in an embodiment of the flexible display.

As mentioned, one or more driving circuits, such as a display drive-IC and/or a touch drive-IC, can be disposed on the printed circuit. Conductive lines on the printed circuit transmits signals from and to the components provided on the base layer 106 as well as the components disposed on another printed circuit. Referring to FIG. 22, on one end of the first printed circuit 134, the conductive lines are arranged to be in contact with the conductive lines on the base layer 106. On the other end of the first printed circuit 134, the conductive lines are routed to be in contact with another printed circuit 136 (e.g., PCB), which may include additional circuits and/or components provided thereon. In this example, the first printed circuit 134 attached to the base layer 106 is described as a chip-on-film (COF), and the second printed circuit 136 attached to the first printed circuit 134 is described as a printed circuit board (PCB). The area where the part of the first printed circuit 134 and the base layer 106 are attached together may be referred to as the "Flex-on-Panel (FOP) area." Also, the area where the printed circuits are attached together may be referred to as the "flex-on-flex (FOF) area." It should be noted that the second printed circuit 136 may not be needed in some embodiments of the flexible display 100. For instance, components on the first printed circuit 134 and the second printed circuit 136 may be provided on a single printed circuit, which is attached to the base layer 106.

In the FOP area or the FOF area of the first printed circuit 134, part of the conductive lines can serve as a connector (e.g., pads or pins), which is to be connected to the corresponding connector on the base layer 106 and the connector of the second printed circuit 136. In the contact areas, an anisotropic conductive adhesive (e.g., anisotropic conductive film: ACF) or other types of adhesives may be provided between the connectors. Before bonding the first printed circuit 134 to the base layer 106 and the second printed circuit 136, tests are usually performed to inspect whether the conductive lines on the first printed circuit 134 are properly connected to the components disposed thereon. However, the conductive lines are disposed in a very narrow pitch in FOP/FOF areas, and thus it is difficult to supply/receive test signals on the conductive lines at those areas. Therefore, the conductive lines on the first printed circuit are routed beyond the FOP/FOF areas to an area where they are arranged with a larger pitch and/or provided with test pads.

Similar to the test pads 120_P and the test lines 120_C described in reference to FIGS. 8A-8B, the part of the conductive lines on the first printed circuit 134 routed beyond the FOP/FOF areas can be removed from the first printed circuit 134 when scribing/chamfering the first printed circuit 134 into a desired shape and size. Thus, the conductive lines remaining on the first printed circuit 134 can be extended until the scribed/chamfered edges of the first printed circuit 134. For reliable connection between the connectors, scribing of the first printed circuit 134 is usually performed with a certain margin between the scribed edge and the contact area where the part of the conductive lines serve as the connectors.

Figure 23A:
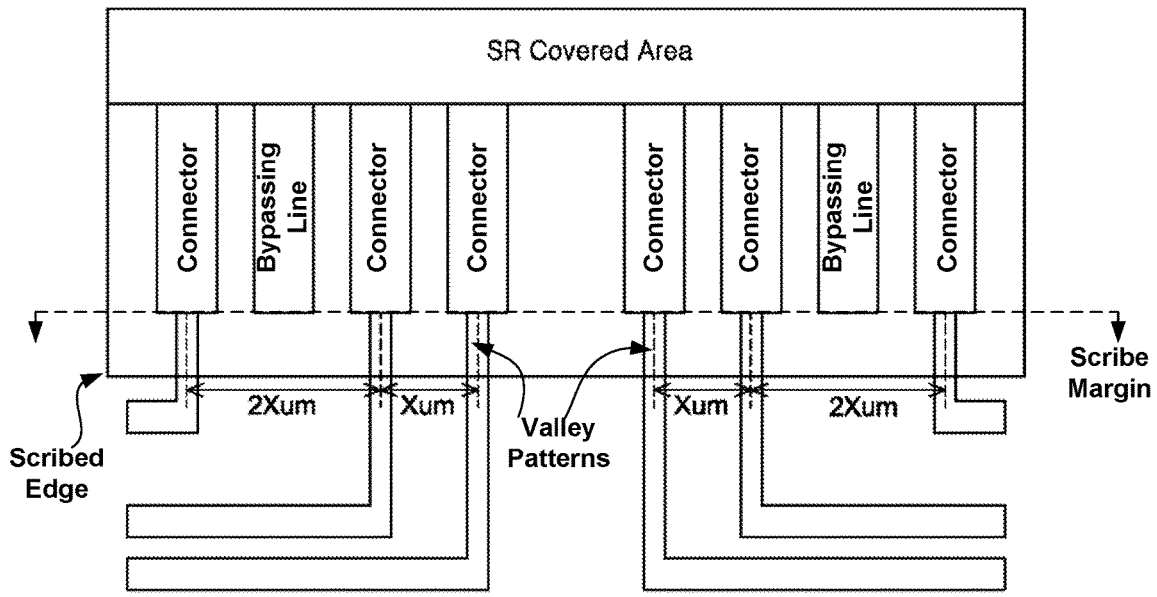
FIGS. 23A-23D are plan views illustrating exemplary configurations of the connectors on the first printed circuit in the FOP area.

As mentioned, the part of the conductive lines routed outside the contact area toward the scribed edge, which is sometimes referred to as the "valley pattern", is especially susceptible to corrosion from the moisture and gasses passing through the micro-coating layer 132. Accordingly, embodiments of the flexible display 100 may employ several features that can help minimize corrosion of the conductive lines on the first printed circuit 134. FIG. 23A is a plan view illustrating an exemplary configuration of the conductive lines in the FOP area on the first printed circuit 134. As shown, certain conductive lines disposed on the first printed circuit 134 are arranged not to extend beyond the contact areas. That is, on the first printed circuit 134, some connectors are provided with valley patterns while some of the selected connectors are provided without the valley patterns. The conductive lines that end at the contact area without the valley pattern may be the ones that are routed between the FOP area and the FOF area without being connected to the components on the first printed circuit 134, such as the Drive-IC 138. Such conductive lines are routed on the first printed circuit 134 simply to provide interconnections between the components on the base layer 106 and the components on the second printed circuit 134, and thus, chances of defects in such conductive lines are very slim. Without the valley pattern, the end of the conductive line is not cut by the scribing process, and the outer layer (e.g., Sn layer) of the conductive line can cover the inner layer (e.g., Cu layer) of the conductive line, which in turn suppresses corrosion. Also, eliminating the valley pattern of such bypassing conductive lines can increase the distance X between the valley patterns of other conductive lines. Electrical flow between anodic metal and cathode metal being one of the essential element for corrosion, increase in the distance between the valley patterns can help reduce corrosion on those valley patterns. In addition, increasing the distance X between the valley patterns can lower the chances of short between the conductive lines caused by the corrosion debris and other deposits.

Figure 23B:
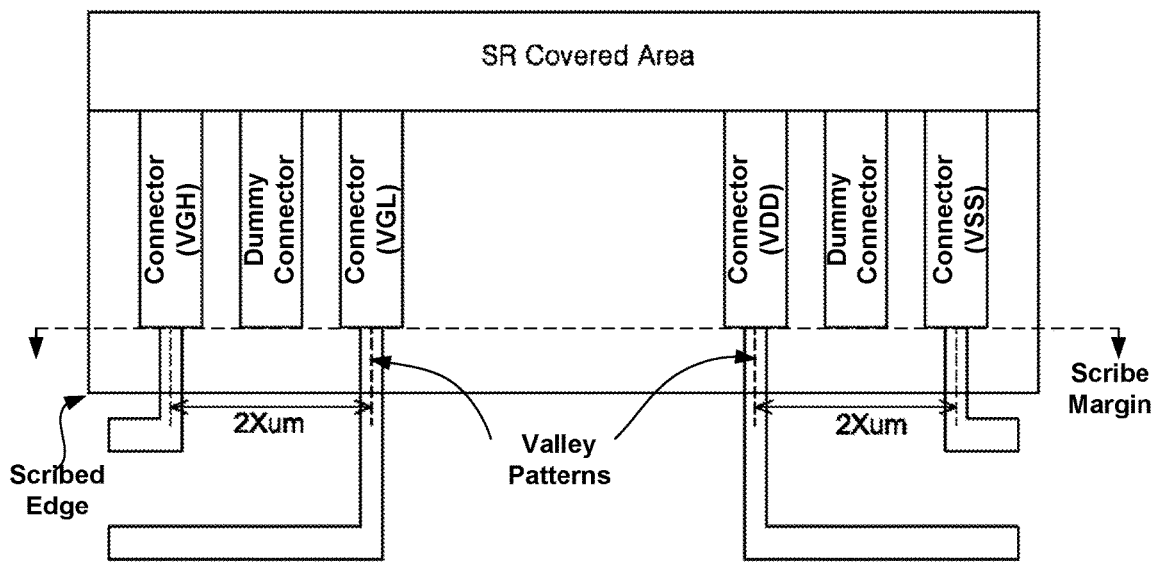

For the similar reason described above, in some embodiments, a dummy connector may be provided between the connectors that transmit signals of a voltage large difference from each other. Referring to FIG. 23B, a dummy connector can be positioned between a conductive line for transmitting VGH and a conductive line for transmitting VGL. Also, a dummy connector can be positioned between the VSS line connector and the VDD line connector. The VGH/VGL and VDD/VSS line connectors have the valley pattern extending to the scribed edge of the first printed circuit 134, whereas the dummy connectors do not have the valley patterns. The space between the connectors of the oppositely charged conductive lines is increased by the width of the dummy connector. The end of the dummy connector is spaced apart from the scribed edge of the first printed circuit 134. As such, corrosion control on the valley patterns of the conductive lines with large voltage difference can be realized.

In some cases, some of the signals, for instance the gate high/low signals and/or the power signals, may be transmitted by using a group of several conductive lines positioned next to each other on the first printed circuit 134. Also, conductive lines transmitting similar signals (e.g., clock signals) may be arranged next to each other on the first printed circuit 134. In such cases, inspection on all of the conductive lines of the same group may not be necessary. Accordingly, in some embodiments, at least one or more of connectors in a group of adjacently positioned connectors transmitting the same or similar type of signals may be provided on the first printed circuit 134 without the valley pattern.

Figure 23C:
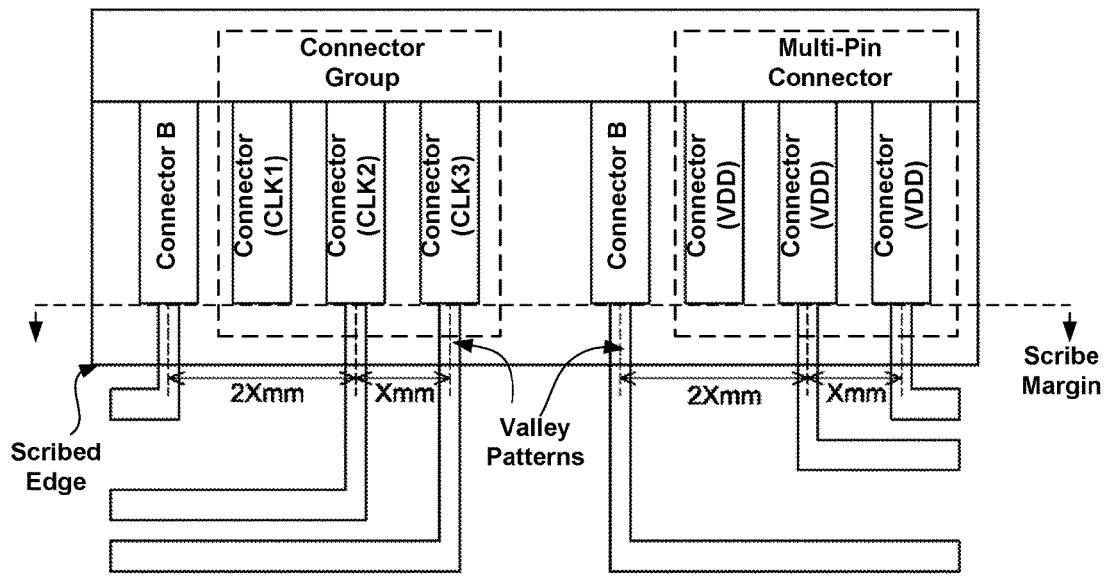

Referring to FIG. 23C, connectors for transmitting similar type of signals are provided adjacent to each other, which are denoted as "Connector Group." Also, adjacently positioned connectors for transmitting the same signal are denoted as "Multi-Pin Connector." As shown, at least one of the connectors among the multi-pin connector may be formed on the first printed circuit 134 without the valley pattern. Similarly, at least one of the connectors among the group of connectors that provides similar signals may not be provided with the valley pattern. For instance, any one of the conductive lines CLK1, CLK2 and CLK 3 may end with a connector without the valley pattern. This way, distance X between the remaining valley patterns can be increased, which can help reduce corrosion on those valley patterns. Further, chances of short between the valley patterns by the corrosion debris and other deposits can be reduced by increasing the distance X between the valley patterns.

In some embodiments, the connector without the valley pattern may be the first and/or the last connector among the group of connectors. In FIG. 23C, the connector B, which is positioned next to the connector group or the multi-pin connectors, may be configured to transmit a different type of signal from the signals transmitted on the connector group and the multi-pin connectors. By way of example, the connectors in the connector group may be configured to transmit clock signals and the connector B may be configured to transmit any one of the VGH, VGL, VDD and VSS signals. Among the connectors included in connector group and the multi-pin connectors, one that is positioned immediately adjacent to the connector B may be provided on the first printed circuit 134 without the valley pattern.

Figure 23D:
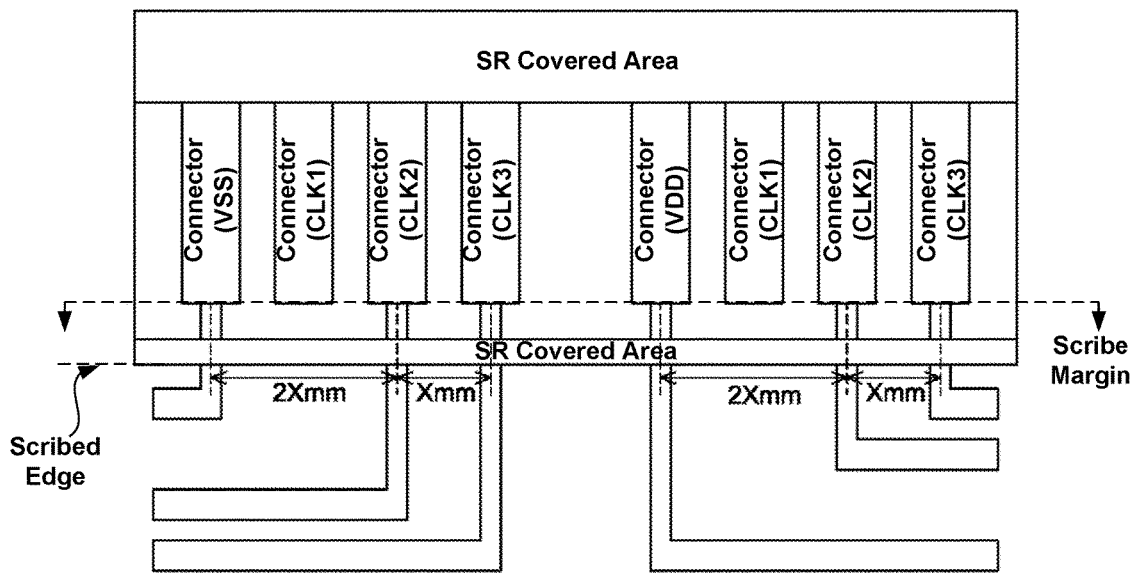

Furthermore, in some embodiments, solder resist (SR) covering the conductive lines outside the contact area may also be provided over the valley patterns along the scribed edge as depicted in FIG. 23D. In this regard, the solder resist (SR) may be coated over the valley patterns prior to scribing the first printed circuit 134. Alternatively, the solder resist (SR) may be coated over the valley patterns after the scribing of the first printed circuit 134 is performed. In the latter case, the solder resist (SR) may cover the exposed cross-sectional side surface of the valley pattern. While the configurations of connectors are described in reference to the connectors in FOP area, such configurations can also be used for the connectors in the FOF area.

Although the concepts and teachings in the present disclosure are described above with reference to OLED display technology, it should be understood that several features may be extensible to any form of flexible display technology, such as electrophoretic, liquid crystal, electrochromic, displays comprising discreet inorganic LED emitters on flexible substrates, electrofluidic, and electrokinetic displays, as well as any other suitable form of display technology.

As described above, a flexible display 100 may include a plurality of innovations configured to allow bending of a portion or portions to reduce apparent border size and/or utilize the side surface of an assembled flexible display 100. In some embodiments, bending may be performed only in the bend portion and/or the bend allowance section having only the conductive line 120 rather than active display components or peripheral circuits. In some embodiments, the base layer 106 and/or other layers and substrates to be bent may be heated to promote bending without breakage, then cooled after the bending. In some embodiments, metals such as stainless steel with a passive dielectric layer may be used as the base layer 106 rather than the polymer materials discussed above. Optical markers may be used in several identification and aligning process steps to ensure appropriate bends absent breakage of sensitive components. Components of the flexible display 100 may be actively monitored during device assembly and bending operations to monitor damage to components and interconnections.

Constituent materials of conductive line 120 and/or insulation layers may be optimized to promote stretching and/or compressing rather than breaking within a bending area.

Thickness of a conductive line 120 may be varied across a bending area and/or the bend allowance section to minimize stresses about the bend portion or the bend allowance section of the flexible display 100. Trace design of conductive line 120 and insulation layers may be angled away from the bending direction (i.e., tangent vector of the curvature), meandering, waving, or otherwise arranged to reduce possibility of severance during bending. The thickness of the conductive line 120, insulation layers and other components may be altered or optimized in the bend portion of the flexible display 100 to reduce breakage during bending. Bend stresses may be reduced by adding protective microcoating layer(s) over components in addition to disclosed encapsulation layers. Conductive films may be applied to the conductive line 120 before, during, or after bending in a repair process. Furthermore, the constituent material and/or the structure for conductive line 120 in a substantially flat area of a flexible display 100 may differ from the conductive line 120 in a bend portion and/or the bend allowance section.

These various aspects, embodiments, implementations or features of the described embodiments can be used separately or in any combination. The foregoing is merely illustrative of the principles of this invention and various modifications can be made by those skilled in the art without departing from the scope of the invention.

What is claimed is:

1. A flexible display, comprising:
   a base layer having a chamfered corner;
   an encapsulation covering organic-light emitting diode (OLED) elements on the base layer; and
   an upper layer on the encapsulation, the upper layer having a size or a shape that is unaffected during a procedure for forming the chamfered corner of the base layer,
   wherein the encapsulation has a chamfered corner substantially the same as the chamfered corner of the base layer.

2. The flexible display of claim 1, wherein the upper layer includes at least one among a polarization layer, a touch sensor layer, an adhesive layer and an optical sheet layer.

3. The flexible display of claim 1, wherein the upper layer includes an edge having a sufficient margin from a processing line used in forming the chamfered corner of the base layer.

4. The flexible display of claim 1, wherein the upper layer has a trimmed corner corresponding to the shape of the chamfered corner of the base layer.

5. The flexible display of claim 4, wherein the trimmed corner of the upper layer has substantially the same trimmed angle as the chamfered corner of the base layer.

6. The flexible display of claim 4, wherein the trimmed corner of the upper layer has substantially the same shape as the chamfered area of the base layer.

7. The flexible display of claim 4, wherein both the trimmed corner of the upper layer and the chamfered corner of the base layer have a convex shape.

8. The flexible display of claim 4, wherein both the trimmed corner of the upper layer and the chamfered corner of the base layer have a concave shape.

9. The flexible display of claim 1, wherein the base layer has a notch, and the corner of the upper layer corresponds to a shape of a processing line at the notch of the base layer.

10. The flexible display of claim 1, wherein the upper layer provides a clearance with respect to a chamfer line of the base layer to reduce damage in one or more insulation layers interposed between the upper layer and the base layer.

11. The flexible display of claim 1, wherein the base layer, the encapsulation and the upper layer are implemented in a wearable electronic device.

\* \* \* \* \*